US012641354B2

(12) United States Patent
Togashi et al.

(10) Patent No.: US 12,641,354 B2
(45) Date of Patent: May 26, 2026

(54) PHOTODETECTION DEVICE, ELECTRONIC APPARATUS, AND PHOTODETECTION SYSTEM

(71) Applicant: SONY SEMICONDUCTOR SOLUTIONS CORPORATION, Kanagawa (JP)

(72) Inventors: Hideaki Togashi, Kanagawa (JP); Tomohiro Ohkubo, Kanagawa (JP); Nobuhiro Kawai, Kanagawa (JP); Hitoshi Tsuno, Kanagawa (JP); Syuto Tamura, Kanagawa (JP); Tetsuro Takada, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/707,009

(22) PCT Filed: Nov. 22, 2022

(86) PCT No.: PCT/JP2022/043246
§ 371 (c)(1),
(2) Date: May 2, 2024

(87) PCT Pub. No.: WO2023/100725
PCT Pub. Date: Jun. 8, 2023

(65) Prior Publication Data
US 2024/0422454 A1      Dec. 19, 2024

(30) Foreign Application Priority Data

Nov. 30, 2021      (JP) ................................. 2021-194424

(51) Int. Cl.
*H04N 25/778*          (2023.01)
*H10D 86/40*          (2025.01)
(Continued)

(52) U.S. Cl.
CPC ......... *H04N 25/778* (2023.01); *H10D 86/451* (2025.01); *H10D 86/60* (2025.01); *H10K 39/32* (2023.02); *H10K 39/601* (2023.02)

(58) Field of Classification Search
CPC ...... H10K 39/32; H10K 39/601; H10D 86/60; H10D 86/451; H10F 39/182;
(Continued)

(56) References Cited

U.S. PATENT DOCUMENTS

| | | | |
|---|---|---|---|
| 2013/0001403 A1* | 1/2013 | Yamakawa | ........... H10F 39/813 |
| | | | 250/208.1 |
| 2018/0081217 A1* | 3/2018 | Kim | ...................... G02F 1/1368 |

(Continued)

FOREIGN PATENT DOCUMENTS

| | | |
|---|---|---|
| JP | 2013-033896 A | 2/2013 |
| JP | 2018-152393 A | 9/2018 |

(Continued)

OTHER PUBLICATIONS

Search Report issued in International Patent Application No. PCT/JP2022/043246, mailed Jan. 24, 2023 and English translation of same. 7 pages.

(Continued)

*Primary Examiner* — Marly S Camargo
(74) *Attorney, Agent, or Firm* — K&L Gates LLP

(57)          ABSTRACT

A photodetection device according to an embodiment includes a plurality of pixels arranged in a matrix, in which each of the pixels includes a semiconductor substrate having a first surface and a second surface opposed to each other, a first photoelectric conversion portion disposed on the second surface side of the semiconductor substrate, an insulating layer covering the first surface of the semiconductor substrate, and at least one pixel transistor located on the first (Continued)

surface side of the semiconductor substrate with the insulating layer interposed therebetween.

19 Claims, 33 Drawing Sheets

(51) Int. Cl.

| | | |
|---|---|---|
| *H10D 86/60* | (2025.01) | |
| *H10K 39/00* | (2023.01) | |
| *H10K 39/32* | (2023.01) | |

(58) Field of Classification Search
CPC .. H10F 39/191; H10F 39/199; H10F 39/8037; H10F 39/805; H10F 39/806; H10F 39/807; H10F 39/811; H10F 39/812; H04N 25/778
See application file for complete search history.

(56) References Cited

U.S. PATENT DOCUMENTS

| | | | |
|---|---|---|---|
| 2018/0240847 A1 | 8/2018 | Ota et al. | |
| 2020/0127030 A1* | 4/2020 | Ogawa | H10F 39/811 |
| 2021/0136309 A1 | 5/2021 | Koga | |
| 2021/0280639 A1 | 9/2021 | Hattori et al. | |
| 2021/0288111 A1* | 9/2021 | Joei | H10F 39/812 |
| 2022/0271073 A1 | 8/2022 | Togashi et al. | |
| 2022/0336703 A1 | 10/2022 | Kitamura et al. | |
| 2023/0403871 A1* | 12/2023 | Hiramatsu | H10K 39/32 |

FOREIGN PATENT DOCUMENTS

| | | | | | |
|---|---|---|---|---|---|
| JP | 2021-048152 A | | 3/2021 | | |
| JP | 2021-150333 A | * | 9/2021 | | H10K 30/00 |
| KR | 20130007444 A | | 1/2013 | | |
| KR | 20200057862 A | | 5/2020 | | |
| KR | 20200142612 A | | 12/2020 | | |
| KR | 20210124224 A | | 10/2021 | | |
| WO | WO2016143531 A1 | | 9/2016 | | |
| WO | WO2019131965 A1 | | 7/2019 | | |
| WO | WO2020022421 A1 | | 1/2020 | | |
| WO | WO2020255999 A1 | | 12/2020 | | |
| WO | WO-2020262131 A1 | | 12/2020 | | |
| WO | WO-2021019333 A1 | | 2/2021 | | |

OTHER PUBLICATIONS

Written Opinion issued in International Patent Application No. PCT/JP2022/043246 mailed Jan. 24, 2023. 5 pages.
Korean Office Action dated Mar. 16, 2026 for corresponding KR Application No. 10-2024-7020752, and English translation of same. (14 pages).

* cited by examiner

Figure 34:
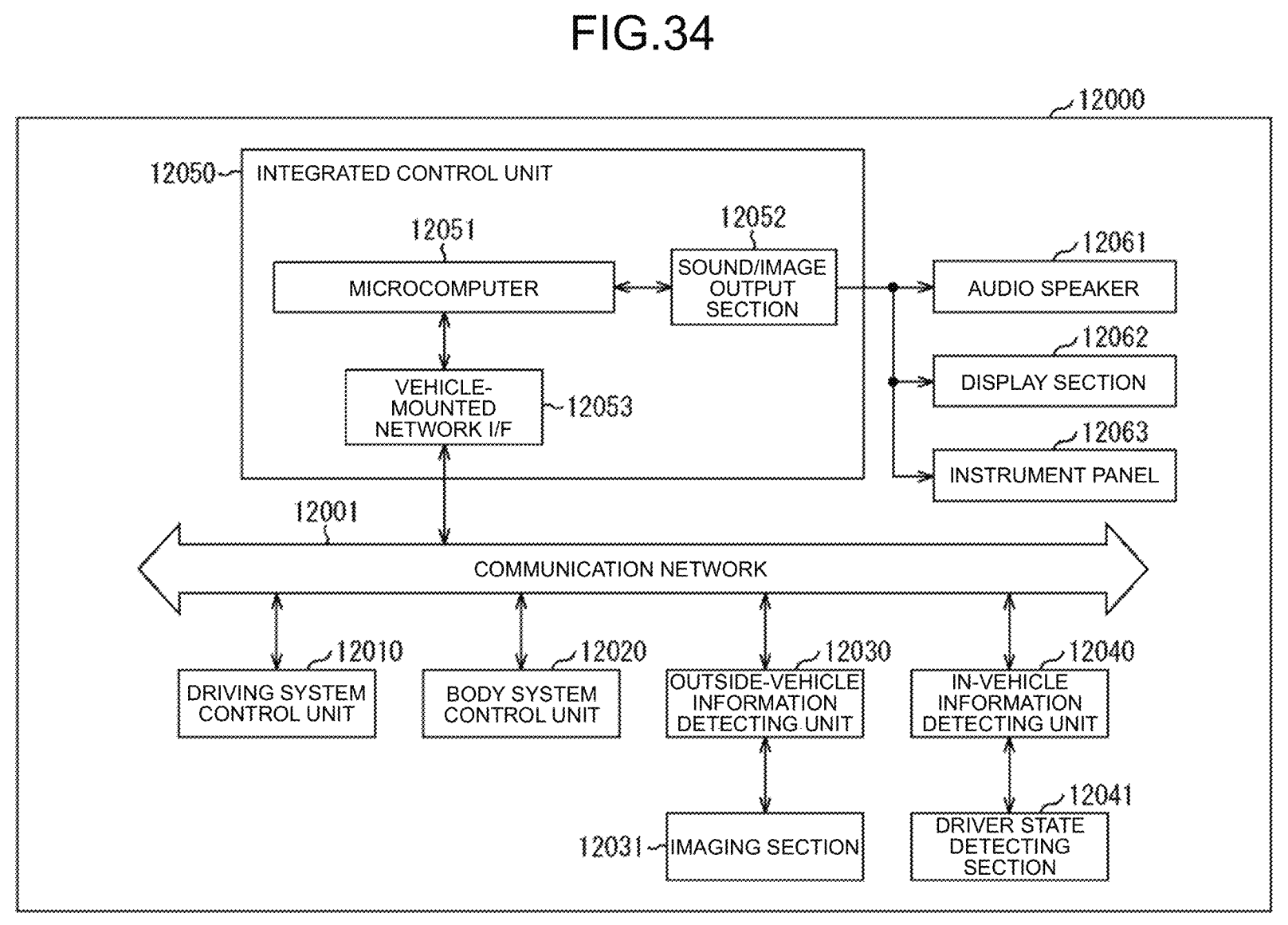

12061 AUDIO SPEAKER

12062 DISPLAY SECTION

12063 INSTRUMENT PANEL

12050 ~ INTEGRATED CONTROL UNIT

12052 SOUND/IMAGE OUTPUT SECTION

12051 MICROCOMPUTER

12053 VEHICLE-MOUNTED NETWORK I/F

12001 COMMUNICATION NETWORK

12040 IN-VEHICLE INFORMATION DETECTING UNIT

12041 DRIVER STATE DETECTING SECTION

12030 OUTSIDE-VEHICLE INFORMATION DETECTING UNIT

12031 ~ IMAGING SECTION

12020 BODY SYSTEM CONTROL UNIT

12010 DRIVING SYSTEM CONTROL UNIT

FIG.36

PHOTODETECTION DEVICE, ELECTRONIC APPARATUS, AND PHOTODETECTION SYSTEM

FIELD

The present disclosure relates to a photodetection device, an electronic apparatus, and a photodetection system.

BACKGROUND

Conventionally, there has been proposed a stacked-type solid-state imaging device having a structure in which photoelectric conversion regions for photoelectrically converting light of respective wavelengths of green (G), blue (B), and red (R), which are three primary colors of colors, are stacked in a vertical direction of the same pixel, and a green photoelectric conversion region of the photoelectric conversion regions is configured by an organic photoelectric conversion layer.

CITATION LIST

Patent Literature

Patent Literature 1: WO 2019/131965 A
Patent Literature 2: WO 2020/255999 A

SUMMARY

Technical Problem

However, in a stacked solid-state imaging apparatus in which a plurality of photoelectric conversion regions are stacked in one pixel region, an amount of color information that can be acquired in one pixel region increases. Thus, the required number of pixel transistors (for example, an amplification transistor, a reset transistor, and a selection transistor) for generating a voltage signal based on electric charge stored in each photoelectric conversion region and resetting electric charge stored in each photoelectric conversion region increases.

Here, the pixel transistors are generally provided on a semiconductor substrate, but if the number of the pixel transistors increases, an area of a charge storage region that stores electric charge from a photoelectric conversion region disposed in the semiconductor substrate decreases, and a saturated charge amount characteristic deteriorates. It is necessary to reduce a size of the amplification transistor, and noise characteristics deteriorate. Thus, there is a possibility that image quality may deteriorate.

Therefore, the present disclosure proposes a photodetection device, an electronic apparatus, and a photodetection system capable of suppressing deterioration in image quality.

Solution to Problem

To solve the above-described problem, a photodetection device according to one aspect of the present disclosure comprises a plurality of pixels arranged in a matrix. In the photodetection device, each of the pixels includes: a semiconductor substrate having a first surface and a second surface opposed to each other; a first photoelectric conversion portion disposed on the second surface side of the semiconductor substrate; an insulating layer covering the first surface of the semiconductor substrate; and at least one pixel transistor located on the first surface side of the semiconductor substrate with the insulating layer interposed therebetween.

BRIEF DESCRIPTION OF DRAWINGS

FIG. 8 is a layout diagram illustrating a schematic layout example of each layer of a pixel according to a first modification example of the first embodiment of the present disclosure.

FIG. 13 is a layout diagram illustrating a schematic layout example of each layer of a pixel according to the fourth modification example of the first embodiment of the present disclosure.

FIG. 14 is a layout diagram illustrating a schematic layout example of each layer of a pixel according to a fifth modification example of the first embodiment of the present disclosure.

FIG. 34 is a block diagram depicting an example of schematic configuration of a vehicle control system.

FIG. 36 is a view depicting an example of a schematic configuration of an endoscopic surgery system.

DESCRIPTION OF EMBODIMENTS

Figure 1:
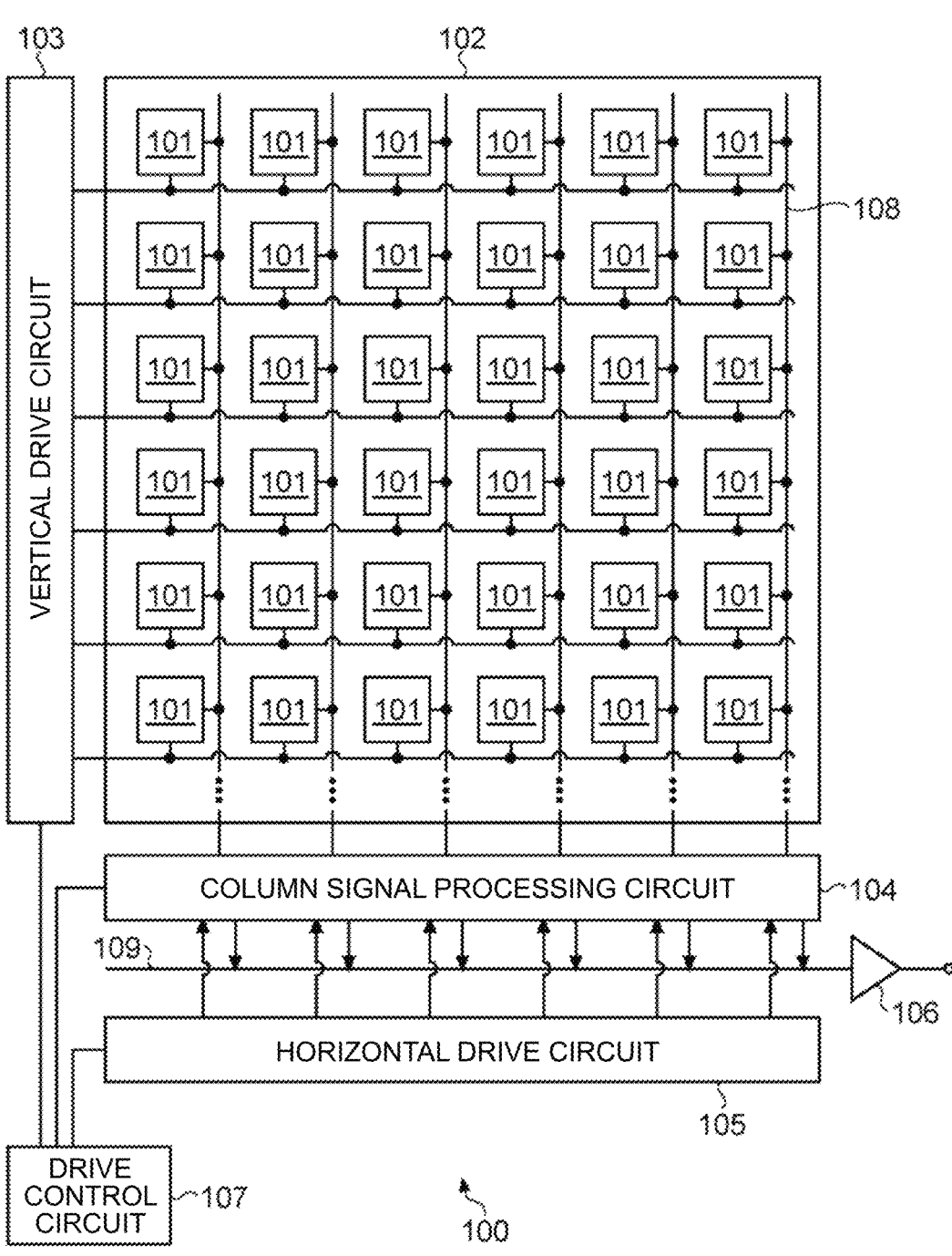
FIG. 1 is a diagram illustrating a schematic configuration example of a photodetection device (image sensor) according to a first embodiment of the present disclosure.

Hereinafter, embodiments of the present disclosure will be described in detail with reference to the drawings. Note that, in the following embodiments, the same parts are denoted by the same reference numerals, and redundant description will be omitted.

The present disclosure will be described according to the following item order.

1. First embodiment
1.1 Configuration example of photodetection device (image sensor)
1.2 Circuit configuration example of pixel
1.3 Stacked structure example of solid-state imaging device
1.4 Configuration example of pixel
1.5 Comparative examples
1.6 Sectional structure example and layout example of pixel
1.7 Material examples of each layer
1.8 Summary
1.9 Modification examples
1.9.1 First modification example
1.9.2 Second modification example
1.9.3 Third modification example
1.9.4 Fourth modification example
1.9.5 Fifth modification example
1.9.6 Sixth modification example
1.9.7 Seventh modification example
1.9.8 Eighth modification example
1.9.9 Ninth modification example
1.9.10 Tenth modification example
1.9.11 Eleventh modification example
1.9.12 Summary of modification examples
2. Second embodiment
3. Third embodiment
4. Fourth embodiment
5. Application example to mobile object
6. Application example to endoscopic surgery system

1. First Embodiment

First, a photodetection device (hereinafter, also referred to as an image sensor), an electronic apparatus, a photodetection system, an electronic apparatus, and a recognition system according to a first embodiment of the present disclosure will be described in detail with reference to the drawings. Note that, in the present embodiment, a case where the technology according to the present embodiment is applied to a complementary metal-oxide semiconductor (CMOS) image sensor will be described as an example, but the present invention is not limited thereto. For example, the technology according to the present embodiment can be applied to various sensors including a photoelectric conversion element, such as a charge-coupled device (CCD) image sensor, a time-of-flight (ToF) sensor, and a synchronous or asynchronous event vision sensor (EVS). Note that the CMOS image sensor may be an image sensor created by applying or partially using a CMOS process.

1.1 Configuration Example of Photodetection Device (Image Sensor)

FIG. 1 illustrates a schematic configuration example of a photodetection device (image sensor) according to a first embodiment. As illustrated in FIG. 1, an image sensor 100 according to the present embodiment has a structure of a solid-state imaging device including a pixel array portion 102 in which pixels 101 having a stacked structure in which photoelectric conversion regions are stacked are arranged in a two-dimensional array, a vertical drive circuit 103, a column signal processing circuit 104, a horizontal drive circuit 105, an output circuit 106, a drive control circuit 107, and the like as drive circuits (peripheral circuits). Note that it goes without saying that these circuits can be configured from well-known circuits, and can be configured by using other circuit configurations (for example, various circuits used in a conventional CCD imaging device or CMOS imaging device).

The drive control circuit 107 generates a clock signal or a control signal serving as a reference of operations of the vertical drive circuit 103, the column signal processing circuit 104, and the horizontal drive circuit 105 on the basis of a vertical synchronization signal, a horizontal synchronization signal, and a master clock. The generated clock signal and control signal are input to the vertical drive circuit 103, the column signal processing circuit 104, and the horizontal drive circuit 105.

The vertical drive circuit 103 includes, for example, a shift register, and selectively scans each pixel 101 of the pixel array portion 102 sequentially in the vertical direction in units of rows. A pixel signal (image signal) based on a current (signal) generated according to an amount of received light in each pixel 101 is sent to the column signal processing circuit 104 via a signal line (data output line) 108 including a vertical signal line (VSL).

The column signal processing circuit 104 is disposed, for example, for each column of the pixels 101, and performs signal processing of noise removal and signal amplification on image signals output from the pixels 101 for one row by using a signal from a black reference pixel (although not illustrated, it is formed around the effective pixel region) for each pixel 101. In an output stage of the column signal processing circuit 104, a horizontal selection switch (not illustrated) is connected and provided between the column signal processing circuit and a horizontal signal line 109.

The horizontal drive circuit 105 includes, for example, a shift register, sequentially selects each of the column signal processing circuits 104 by sequentially outputting horizontal scanning pulses, and outputs a signal from each of the column signal processing circuits 104 to the horizontal signal line 109.

The output circuit 106 performs signal processing on the signals sequentially supplied from each of the column signal processing circuits 104 via the horizontal signal line 109, and outputs the processed signals.

1.2 Circuit Configuration Example of Pixel

Figure 2:
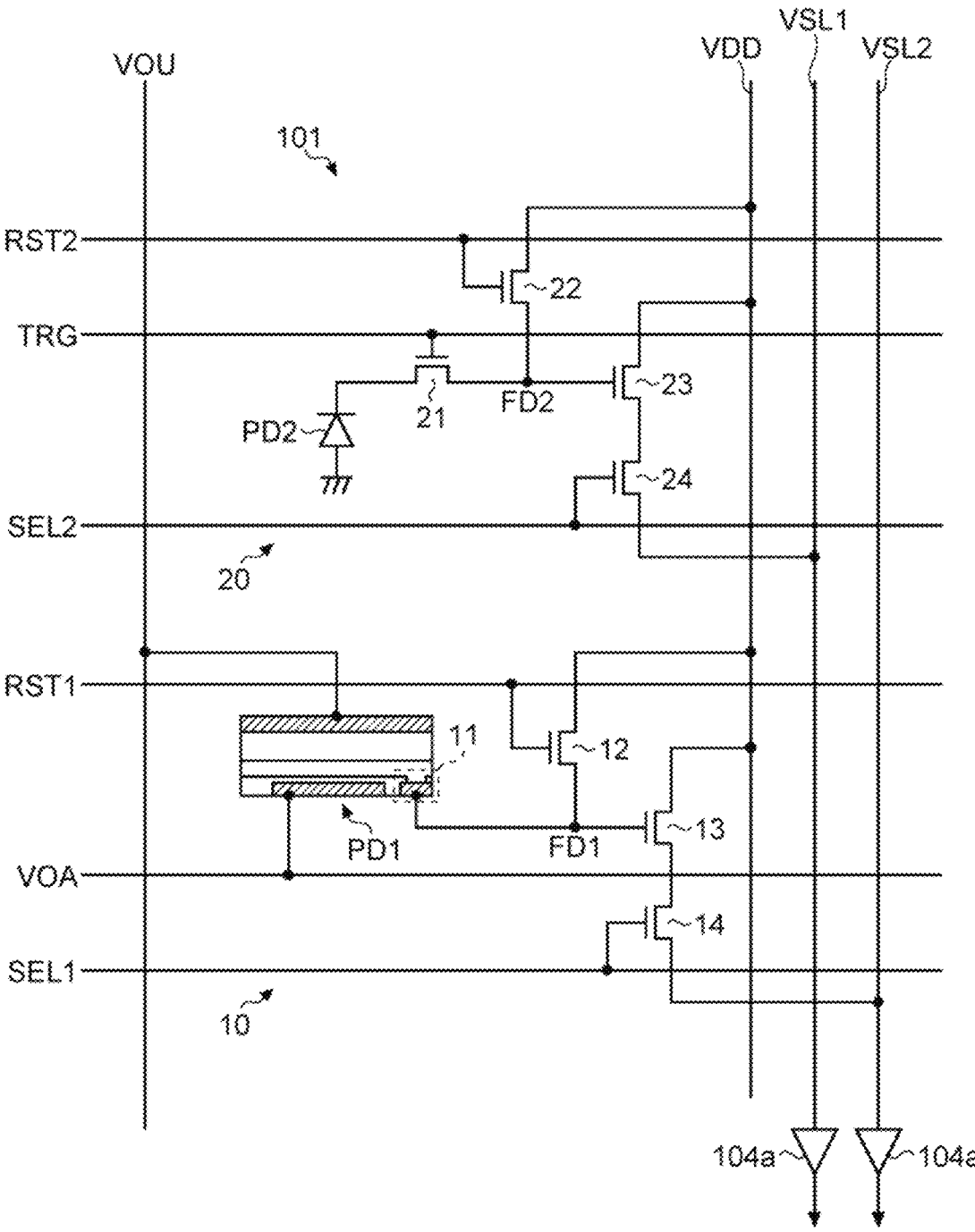
FIG. 2 is a circuit diagram illustrating a schematic configuration example of a pixel according to the first embodiment of the present disclosure.

Next, a circuit configuration example of the pixel 101 will be described. FIG. 2 is a circuit diagram illustrating a schematic configuration example of a pixel according to the present embodiment. As illustrated in FIG. 2, in the present example, the pixel 101 includes one pixel (hereinafter, also referred to as a first pixel) 10 in which an organic layer is used for a photoelectric conversion region (corresponding to a photoelectric conversion portion PD1 that will be described later) and one pixel (hereinafter, also referred to as a second pixel) 20 in which a semiconductor substrate is used for a photoelectric conversion region (corresponding to a photoelectric conversion portion PD2 that will be described later). Note that the photoelectric conversion portion PD1 and the photoelectric conversion portion PD2 are stacked to overlap each other in the substrate thickness direction of the semiconductor substrate.

(First Pixel 10)

The first pixel 10 includes, for example, a photoelectric conversion portion PD1, a read electrode 11, a floating diffusion region FD1, a reset transistor 12, an amplification transistor 13, and a selection transistor 14.

A selection control line included in a pixel drive line connected to the vertical drive circuit 103 is connected to a gate of the selection transistor 14, and a selection control signal SEL1 is applied thereto. A reset control line included in the pixel drive line is connected to a gate of the reset transistor 12, and a reset control signal RST1 is applied thereto. A storage control line included in the pixel drive line is connected to a storage electrode (refer to a storage electrode 112 in FIG. 6 that will be described later) that will be described later, and a storage control voltage VOA is applied thereto. A vertical signal line VSL1 having one end connected to the column signal processing circuit 104 is connected to a drain of the amplification transistor 13 via the selection transistor 14.

In the following description, the reset transistor 12, the amplification transistor 13, and the selection transistor 14 will also be collectively referred to as a pixel circuit. The pixel circuit may include the floating diffusion region FD1 and/or the read electrode 11.

The photoelectric conversion portion PD1 is made of, for example, an organic material, and photoelectrically converts incident light. The read electrode 11 transfers electric charge generated in the photoelectric conversion portion PD1. The floating diffusion region FD1 stores the electric charge transferred by the read electrode 11. The amplification transistor 13 causes a pixel signal having a voltage value corresponding to the electric charge stored in the floating diffusion region FD1 to appear in the vertical signal line VSL1. The reset transistor 12 releases the electric charge stored in the floating diffusion region FD1. The selection transistor 14 selects the first pixel 10 that is a read target.

An anode of the photoelectric conversion portion PD1 is grounded, and a cathode thereof is connected to the read electrode 11. Although the photoelectric conversion portion PD1 will be described in detail later with reference to FIG. 6, for example, the storage electrode 112 is disposed close to the photoelectric conversion portion PD1. At the time of exposure, a storage control voltage VOA for collecting the electric charge generated in the photoelectric conversion portion PD1 to a semiconductor layer (a partial layer of a photoelectric conversion layer 54 in FIG. 6) in the vicinity of the storage electrode 112 is applied to the storage electrode 112 via the storage control line. At the time of reading, the storage control voltage VOA for causing the electric charge collected in the semiconductor layer in the vicinity of the storage electrode 112 to flow out via the read electrode 11 is applied to the storage electrode 112 via the storage control line.

The electric charge flowing out via the read electrode 11 is stored in the floating diffusion region FD1 configured by a wiring structure connecting the read electrode 11, the source of the reset transistor 12, and the gate of the amplification transistor 13. Note that the drain of the reset transistor 12 may be connected to, for example, a power supply line to which a power supply voltage VDD or a reset voltage lower than the power supply voltage VDD is supplied.

The source of the amplification transistor 13 may be connected to the power supply line via, for example, a constant current circuit (not illustrated). The drain of the amplification transistor 13 is connected to the source of the selection transistor 14, and the drain of the selection transistor 14 is connected to the vertical signal line VSL1.

The floating diffusion region FD1 converts the stored electric charge into a voltage having a voltage value corresponding to an amount of electric charge. Note that the floating diffusion region FD1 may be, for example, a grounded capacitor. However, the present invention is not limited thereto, and the floating diffusion region FD1 may be a capacitor or the like added by intentionally connecting a capacitor or the like to a node where the drain of the read electrode 11, the source of the reset transistor 12, and the gate of the amplification transistor 13 are connected.

The vertical signal line VSL1 is connected to an analog-to-digital (AD) conversion circuit 104a provided for each column (that is, for each vertical signal line VSL1,) in the column signal processing circuit 104. The AD conversion circuit 104a includes, for example, a comparator and a counter, and converts an analog pixel signal into a digital pixel signal by comparing a reference voltage such as a single slope or a ramp shape input from an external reference voltage generation circuit (digital-to-analog converter (DAC)) with the pixel signal appearing in the vertical signal line VSL1. Note that the AD conversion circuit 104a may include, for example, a correlated double sampling (CDS) circuit, and may be configured to be able to reduce kTC noise and the like.

(Second Pixel 20)

The second pixel 20 includes, for example, a photoelectric conversion portion PD2, a transfer transistor 21, a floating diffusion region FD2, a reset transistor 22, an amplification transistor 23, and a selection transistor 24. That is, in the second pixel 20, the read electrode 11 in the first pixel 10 is replaced with the transfer transistor 21.

A connection relationship between the floating diffusion region FD2, the reset transistor 22, and the amplification transistor 23 with respect to the transfer transistor 21 may be similar to a connection relationship between the floating diffusion region FD1, the reset transistor 12, and the amplification transistor 13 with respect to the read electrode 11 in the first pixel 10. A connection relationship between the amplification transistor 23, the selection transistor 24, and the vertical signal line VSL2 may be similar to a connection relationship between the amplification transistor 13, the selection transistor 14, and the vertical signal line VSL1 in the first pixel 10.

A source of the transfer transistor 21 is connected to, for example, a cathode of the photoelectric conversion portion PD2, and a drain thereof is connected to the floating diffusion region FD2. A transfer control line included in a pixel drive line LD is connected to a gate of the transfer transistor 21.

In the following description, the reset transistor 22, amplification transistor 23, and the selection transistor 24 will also be collectively referred to as a pixel circuit. The pixel circuit may include one or more of the floating diffusion region FD2 and the transfer transistor 21.

The photoelectric conversion portion PD2 is made of, for example, a semiconductor material, and photoelectrically converts incident light. The transfer transistor 21 transfers electric charge generated in the photoelectric conversion portion PD2. The floating diffusion region FD2 stores the electric charge transferred by the transfer transistor 21. The amplification transistor 23 causes a pixel signal having a voltage value corresponding to the electric charge stored in the floating diffusion region FD2 to appear in the vertical signal line VSL2. The reset transistor 22 releases the electric charge stored in the floating diffusion region FD2. The selection transistor 24 selects the second pixel 20 that is a read target.

An anode of the photoelectric conversion portion PD2 is grounded, and a cathode thereof is connected to the transfer transistor 21. The drain of the transfer transistor 21 is connected to the source of the reset transistor 22 and the gate of the amplification transistor 23, and a wiring structure connecting these components configures the floating diffusion region FD2. The electric charge flowing out from the photoelectric conversion portion PD2 via the transfer transistor 21 is stored in the floating diffusion region FD2.

The floating diffusion region FD2 converts the stored electric charge into a voltage of a voltage value corresponding to the amount of electric charge. Note that the floating diffusion region FD2 may be, for example, a grounded capacitor. However, the present invention is not limited thereto, and the floating diffusion region FD2 may be a capacitor or the like added by intentionally connecting a capacitor or the like to a node where the drain of the transfer transistor 21, the source of the reset transistor 22, and the gate of the amplification transistor 23 are connected.

Similarly to the vertical signal line VSL1, the vertical signal line VSL2 is connected to an AD conversion circuit 104a provided for each column (that is, for each vertical signal line VSL2) in the column signal processing circuit 104.

1.3 Stacked Structure Example of Solid-State Imaging Device

Figure 3:
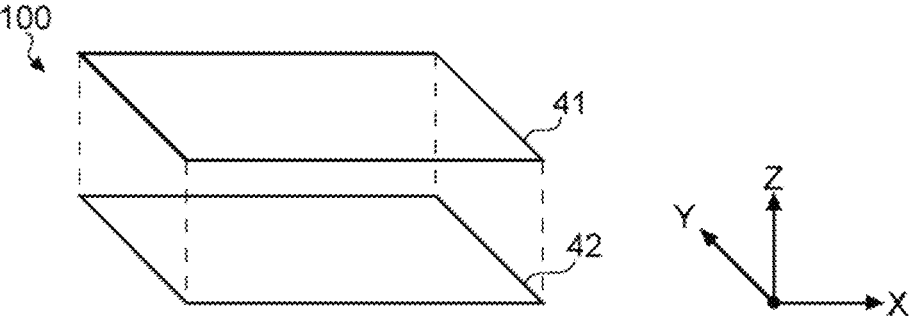
FIG. 3 is a diagram illustrating a stacked structure example of the image sensor according to the first embodiment of the present disclosure.

FIG. 3 is a diagram illustrating a stacked structure example of the image sensor according to the present embodiment. As illustrated in FIG. 3, the image sensor 100 has a stacked structure in which a light receiving chip 41 and a circuit chip 42 are vertically stacked. The light receiving chip 41 may be, for example, a semiconductor chip including the pixel array portion 102 in which a plurality of pixels 101 are arranged in a matrix, and the circuit chip 42 may be, for example, a semiconductor chip including the peripheral circuit or the like in FIG. 1.

For bonding the light receiving chip 41 and the circuit chip 42, for example, so-called direct bonding may be used in which bonding surfaces are planarized and the bonding surfaces are bonded to each other by an electronic force. However, the present invention is not limited thereto, and for example, so-called Cu—Cu bonding in which copper (Cu) electrode pads formed on bonding surfaces are bonded to each other, bump bonding, or the like may also be used.

The light receiving chip 41 and the circuit chip 42 are electrically connected via a connection portion such as a through-silicon via (TSV) penetrating through the semiconductor substrate. For connection using a TSV, for example, a so-called twin TSV method in which two TSVs, that is, a TSV provided in the light receiving chip 41 and a TSV provided from the light receiving chip 41 to the circuit chip 42, are connected on an outer surface of the chip, or a so-called shared TSV method in which both are connected by a TSV penetrating from the light receiving chip 41 to the circuit chip 42 may be employed.

However, when Cu—Cu bonding or bump bonding is used for bonding the light receiving chip 41 and the circuit chip 42, both are electrically connected via a Cu—Cu bonding portion or a bump bonding portion.

1.4 Configuration Example of Pixel

Next, a configuration example of the pixel 101 will be described. Note that, in FIG. 4 and the following description, a case where the pixel (hereinafter, also referred to as a G pixel) 101 that photoelectrically converts light of a green (G) wavelength component is configured by the first pixel 10, and the pixel (hereinafter, also referred to as an R pixel or a B pixel) 101 that photoelectrically converts light of a red (R) or blue (B) wavelength component is configured by the second pixel 20 is exemplified, but the present invention is not limited thereto. In a case where a color filters 59*r* and 59*b* that selectively transmit light of the red (R) or blue (B) wavelength component are not distinguished, the reference numeral is 59.

Figure 4:
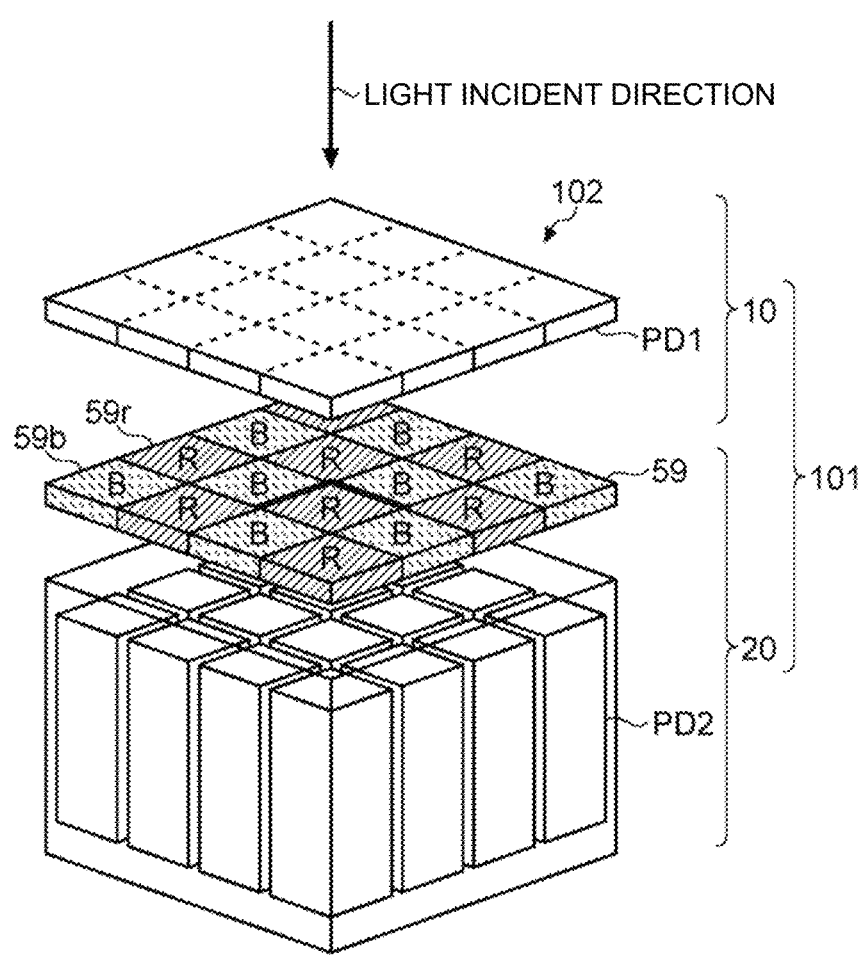
FIG. 4 is a schematic diagram illustrating a schematic configuration example of a pixel array portion according to the first embodiment of the present disclosure.

FIG. 4 is a schematic diagram illustrating a schematic configuration example of the pixel array portion according to the present embodiment. As illustrated in FIG. 4, the pixel array portion 102 has a configuration in which pixels 101 having a structure in which the first pixel 10 and the second pixel 20 are stacked (arranged) in a light incident direction are arranged in a two-dimensional lattice shape along a plane perpendicular to the light incident direction. That is, in the present embodiment, the first pixel 10 and the second pixel 20 are configured to be arranged in the direction perpendicular to the arrangement direction (plane direction) of the pixels 101 such that light transmitted through the first pixel 10 located on the upstream side in the optical path of the incident light is incident on the second pixel 20 located on the downstream side of the first pixel 10. According to such a configuration, the optical axes of the first pixel 10 and the second pixel 20 arranged in the light incident direction can be matched or substantially matched.

In the present embodiment, the photoelectric conversion portion PD1 configuring the first pixel 10 is made of an organic material, and the photoelectric conversion portion PD2 configuring the second pixel 20 is made of a semiconductor material such as silicon. However, the present invention is not limited thereto. For example, both the photoelectric conversion portion PD1 and the photoelectric conversion portion PD2 may be made of a semiconductor material, both the photoelectric conversion portion PD1 and the photoelectric conversion portion PD2 may be made of an organic material, or the photoelectric conversion portion PD1 may be made of a semiconductor material, and the photoelectric conversion portion PD2 may be made of an organic material. Alternatively, at least one of the photoelectric conversion portion PD1 and the photoelectric conversion portion PD2 may be made of a photoelectric conversion material different from the organic material and the semiconductor material.

1.5 Comparative Examples

Figure 5:
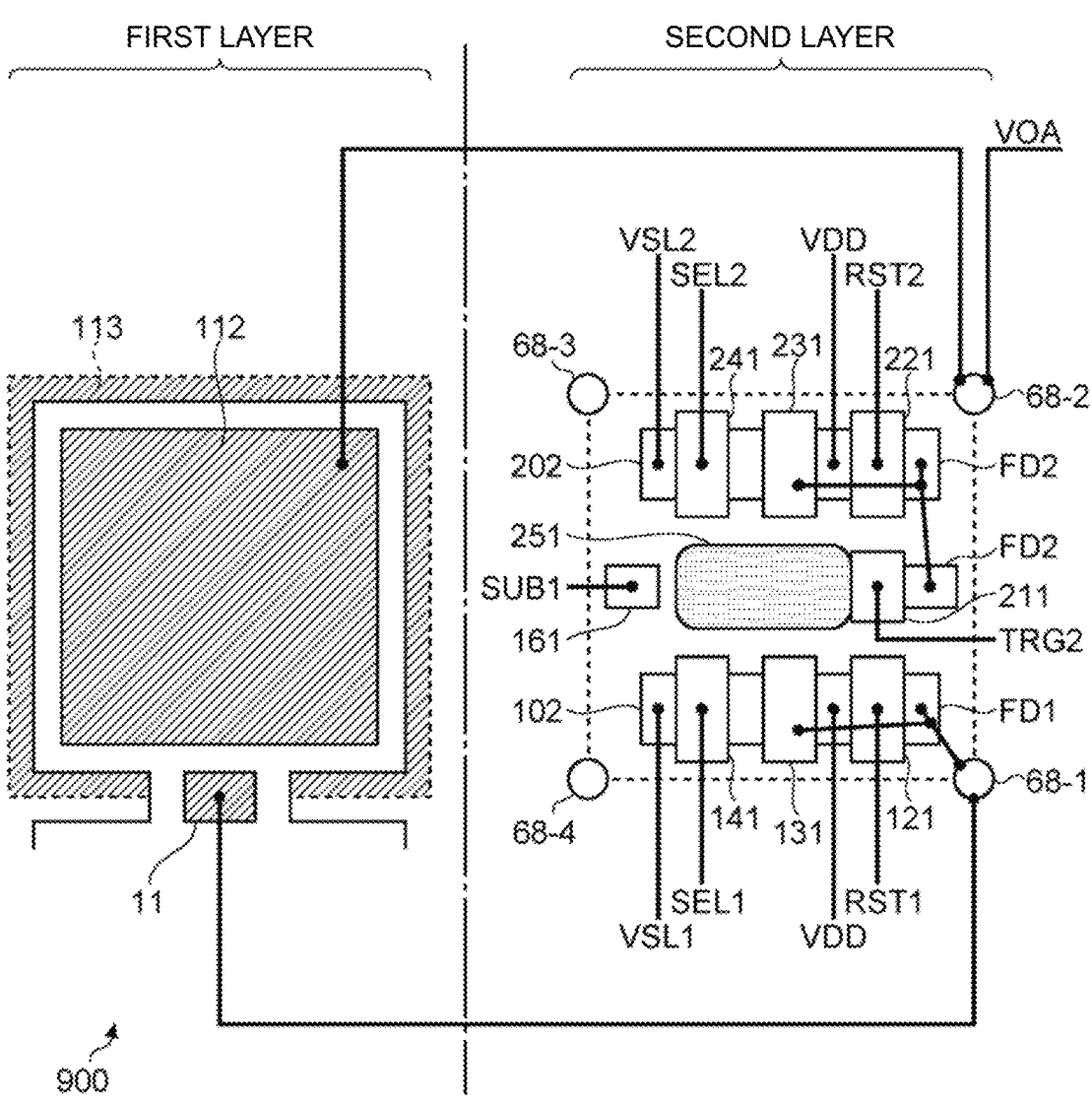
FIG. 5 is a plan layout diagram illustrating a schematic configuration example of each layer of a pixel according to a comparative example of the present disclosure.

FIG. 5 is a plan layout diagram illustrating a schematic configuration example of each layer of a pixel according to a comparative example of the present disclosure. As illustrated in FIG. 5, a pixel 900 according to the comparative example has a two-layer structure in which the photoelectric conversion portion PD1 (for example, a photoelectric conversion layer including an organic layer, and a read electrode 11, a storage electrode 112, and a shield electrode 113 are provided) of the first pixel 10 is provided in the first layer (for example, a layer including a semiconductor substrate on which the photoelectric conversion portion PD2 of the second pixel 20 is provided) in the substrate thickness direction of the semiconductor substrate, and a pixel circuit (for example, a reset transistor 12, an amplification transistor 13, and a selection transistor 14) of the first pixel 10 and a pixel circuit (for example, a reset transistor 22, an amplification transistor 23, and a selection transistor 24) of the second pixel 20 are provided in the second layer (for example, a semiconductor layer provided on the front surface (element formation surface) side of the semiconductor substrate on which the photoelectric conversion portion PD2 of the second pixel 20 is provided).

Note that, in the second layer in FIG. 5, respective gate electrodes 121, 131, and 141 of the reset transistor 12, the amplification transistor 13, and the selection transistor 14 of the first pixel 10, and a diffusion region 110 and a floating diffusion region FD1 that are sources and drains thereof, respective gate electrodes 211, 221, 231, and 241 of the transfer transistor 21, the reset transistor 22, the amplification transistor 23, and the selection transistor 24 of the second pixel 20, and a diffusion region 210 and a floating diffusion region FD2 that are sources and drains thereof, a charge storage region 251 that stores electric charge generated in the photoelectric conversion portion PD2 of the second pixel 20, a well tap 161 that controls a well potential of the semiconductor layer that is the second layer, and through-electrodes TSV1 to TSV4 that penetrate through the semiconductor substrate provided with the photoelectric conversion portion PD2 of the second pixel 20 are illustrated.

As described above, in the stacked-type image sensor, the pixel circuit of the first pixel 10 and the pixel circuit of the second pixel 20 are required, and the number of pixel transistors to be disposed in the second layer increases. As a method of reducing the number of pixel transistors, it is conceivable to share the pixel transistors with a plurality of pixels. In this case, there is a possibility of the occurrence of defects that a conversion efficiency is reduced, or a source follower operating point of the pixel circuit of the first pixel 10 and a source follower operating point of the pixel circuit of the second pixel 20 are shifted, and thus a difference in exposure time occurs.

The pixel transistors are generally provided on a semiconductor substrate, but if the number of the pixel transistors increases, there is a possibility of the occurrence of problems such as deterioration in saturation electric charge amount characteristics due to a reduction in the area of the charge storage region 251 that stores electric charge from the photoelectric conversion portion PD2 disposed in the semiconductor substrate, deterioration in noise characteristics due to a reduction in the size of the amplification transistor 13 and/or 23, and physical installation failure depending on the number of the pixel transistors.

Therefore, in the present embodiment, it is possible to suppress deterioration in image quality in a stacked-type photodetection device (image sensor) in which a plurality of photoelectric conversion regions are stacked in one pixel region.

1.6 Sectional Structure Example and Layout Example of Pixel

Figure 6:
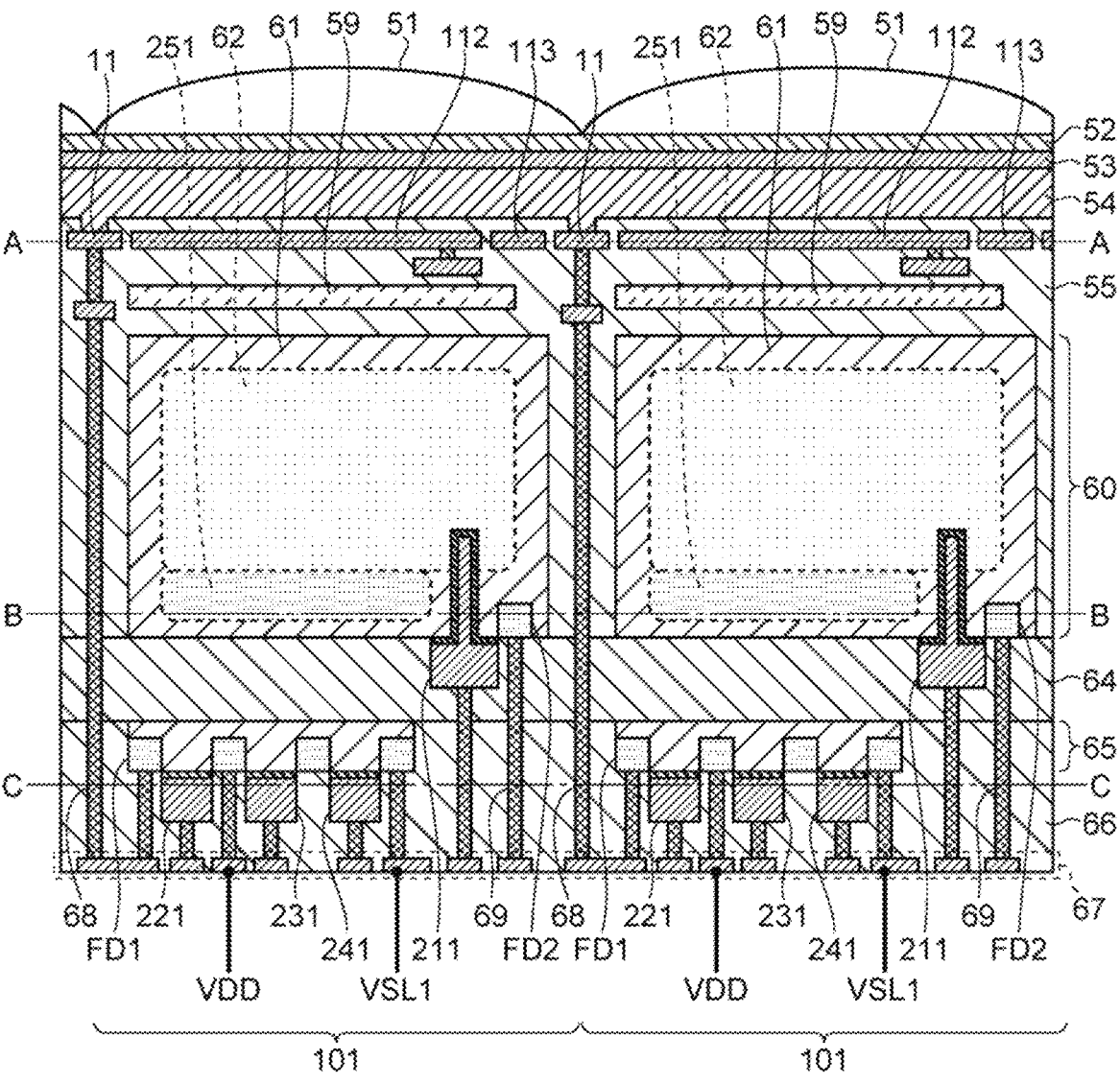
FIG. 6 is a sectional view illustrating a sectional structure example of a pixel according to the first embodiment of the present disclosure.
Figure 7:
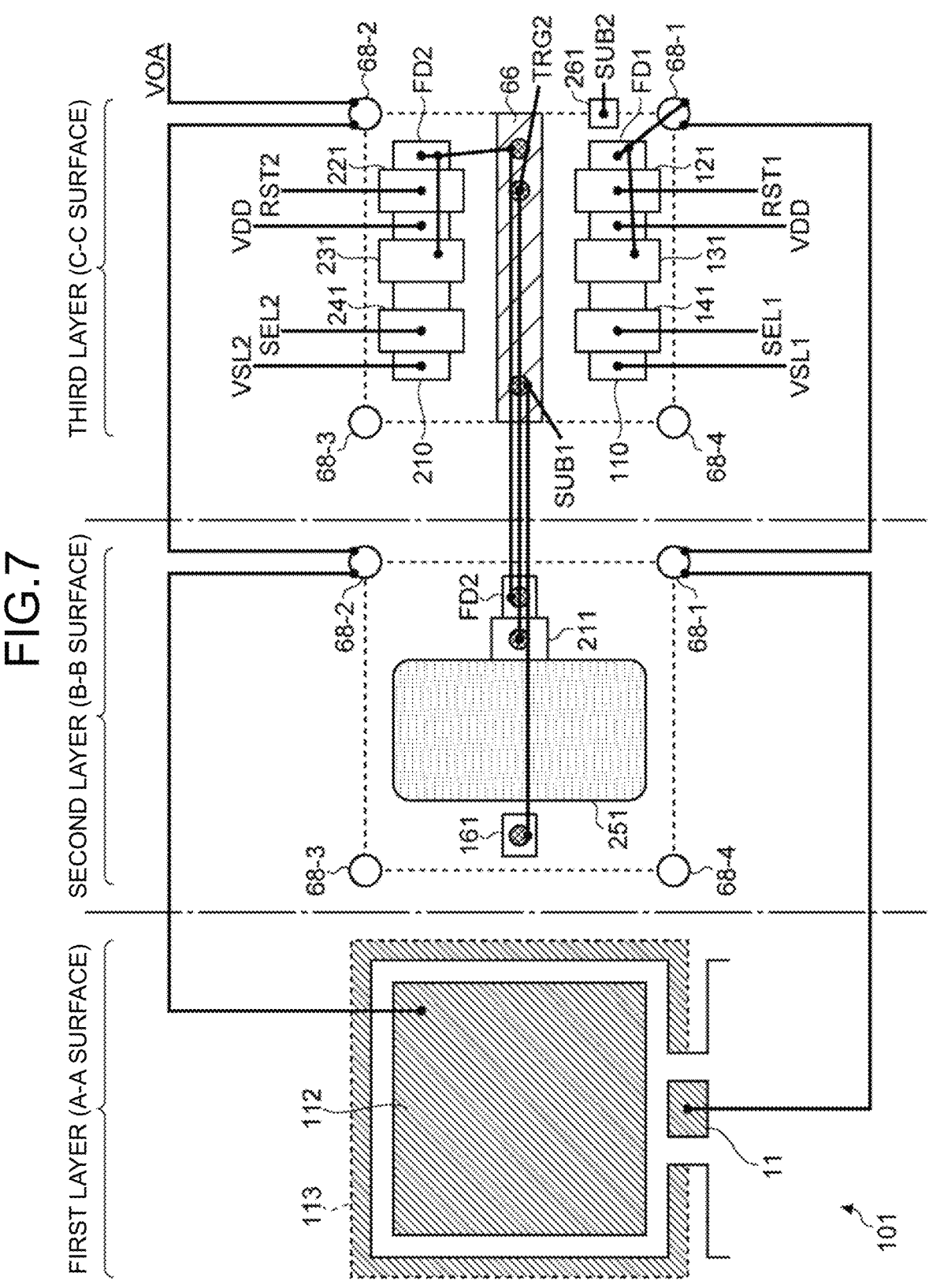
FIG. 7 is a layout diagram illustrating a schematic layout example of each layer of the pixel according to the first embodiment of the present disclosure.

Next, a sectional structure example of the pixel 101 and a layout example of each layer according to the present embodiment will be described with reference to FIGS. 6 and 7. FIG. 6 is a sectional view illustrating a sectional structure example of the pixel according to the present embodiment. Note that the term "perpendicular" may indicates being perpendicular to an element formation surface (for example, a front surface) of the semiconductor substrate. FIG. 6 illustrates a part of a sectional structure of the light receiving chip 41 illustrated in FIG. 3. FIG. 7 is a layout diagram illustrating a schematic layout example of each layer of the pixel according to the present embodiment. Note that, in FIG. 7, the first layer illustrates a layout example of the A-A surface in FIG. 6, the second layer illustrates a layout example near the B-B surface in FIG. 6 (that is, the vicinity of the element formation surface of a semiconductor substrate 60), and the third layer illustrates a layout example near the C-C surface in FIG. 6 (that is, the vicinity of the element formation surface of a semiconductor layer 65). In FIG. 7, the same constituents as those in FIG. 5 are denoted by the same reference numerals, and redundant description thereof will be omitted.

In the following description, a so-called back surface irradiation type sectional structure in which a light incident surface is on the back surface side (opposite side to the element formation surface) of the semiconductor substrate 60 will be exemplified, but the present invention is not limited thereto, and a so-called front surface irradiation type sectional structure in which a light incident surface is on the front surface side (element formation surface side) of the semiconductor substrate 60 may be used. In the present description, a case where an organic material is used for the photoelectric conversion portion PD1 of the G pixel 101 will be exemplified, but one or both of an organic material and a semiconductor material (also referred to as an inorganic material) may be used as a photoelectric conversion material of each of the photoelectric conversion portions PD1 and PD2.

However, in a case where a semiconductor material is used as both the photoelectric conversion material of the photoelectric conversion portion PD1 and the photoelectric conversion material of the photoelectric conversion portion PD2, the image sensor 100 may have a sectional structure in which the photoelectric conversion portion PD1 and the photoelectric conversion portion PD2 are built on the same semiconductor substrate 60, may have a sectional structure in which a semiconductor substrate on which the photoelectric conversion portion PD1 is built and a semiconductor substrate on which the photoelectric conversion portion PD2 is built are bonded, or may have a sectional structure in which one of the photoelectric conversion portions PD1 and PD2 is built on the semiconductor substrate 60 and the other is built in a semiconductor layer formed on the back surface or the front surface of the semiconductor substrate 60.

As illustrated in FIGS. 6 and 7, the pixel 101 according to the present embodiment has a stacked structure in which the photoelectric conversion portion PD2 of the second pixel 20 is formed on the semiconductor substrate 60, and the photoelectric conversion portion PD1 of the first pixel 10 is provided on the back surface side (opposite side to the element formation surface) of the semiconductor substrate 60, in other words, the photoelectric conversion portions PD1 and PD2 are stacked in the substrate thickness direction. In FIG. 6, for convenience of description, the back surface of the semiconductor substrate 60 is located on the upper side in the plane of drawing, and the front surface is located on the lower side.

(First Pixel 10)

The photoelectric conversion portion PD1 of the first pixel 10 is provided on the back surface side of the semiconductor substrate 60 with an insulating layer 55 interposed therebetween. The photoelectric conversion portion PD1 includes, for example, a photoelectric conversion layer 54 including an organic layer, a transparent electrode 53 disposed on an upper surface side (upper side in the drawing) of the photoelectric conversion layer 54, and a storage electrode 112 disposed on a lower surface side (lower side in the drawing) of the photoelectric conversion layer 54.

Note that the photoelectric conversion layer 54 may have a single-layer structure made of an organic semiconductor material, or may have a stacked structure of two or more layers in which an organic semiconductor layer and a semiconductor layer are stacked. In the case of the stacked structure, the semiconductor layer may be disposed on the storage electrode 112 side.

The transparent electrode 53 provided on the upper side (hereinafter, the upper side in the plane of drawing will be referred to as an upper surface side, and the lower side will be referred to as a lower surface side) in the plane of drawing with respect to the photoelectric conversion layer 54 functions as, for example, an anode of the photoelectric conversion portion PD1. In a case where the photoelectric conversion layer 54 has a stacked structure, the lower semiconductor layer functions as a cathode of the photoelectric conversion portion PD1.

The photoelectric conversion layer 54 is electrically connected to the read electrode 11 formed in the insulating layer 55. The read electrode 11 is electrically extended to the front surface (lower surface) side of the semiconductor substrate 60 by being connected to a through-electrode 68 penetrating through the insulating layer 55 and the semiconductor substrate 60, and is electrically connected to the floating diffusion region FD1.

The storage electrode 112 is provided on the lower surface side of the photoelectric conversion layer 54 with the insulating layer 55 interposed therebetween. The storage electrode 112 is connected to the storage control line in the pixel drive line, and as described above, at the time of exposure, the storage control voltage VOA for collecting electric charge generated in the photoelectric conversion portion PD1 in the lower layer side of the photoelectric conversion layer 54 (the semiconductor layer on the lower layer side in the case of the stacked structure) is applied, and at the time of reading, the storage control voltage VOA for causing electric charge collected in the vicinity of the storage electrode 112 to flow out via the read electrode 11 is applied thereto.

A shield electrode 113 for electrically separating adjacent pixels is provided around the storage electrode 112. A potential (for example, a GND potential or a VSS potential) lower than the storage control voltage VOA applied to the storage electrode 112 at the time of storing electric charge is applied to the shield electrode 113. As a result, the operation is performed such that the electric charge is stored in the photoelectric conversion layer 54 around the storage electrode 112 at the time of storing the electric charge, and the electric charge stored in the photoelectric conversion layer 54 around the storage electrode 112 is released via the read electrode 11 at the time of releasing the electric charge.

(Second Pixel 20)

The photoelectric conversion portion PD2 of the second pixel 20 includes, for example, a p-type semiconductor region 61 provided in a p-well region in the semiconductor substrate 60, an n-type semiconductor region 62 provided in the vicinity of the center of the p-type semiconductor region 61, and a charge storage region 251 provided on the element formation surface side of the semiconductor substrate 60 in the p-type semiconductor region 61. The charge storage region 251 functions as, for example, a charge storage region that stores electric charge (electrons) generated through photoelectric conversion in the n-type semiconductor region 62, and the p-type semiconductor region 61 functions as a region that forms a potential gradient for collecting the electric charge generated through photoelectric conversion in the n-type semiconductor region 62.

For example, a color filter 59 through which light having a specific wavelength component (in this example, red (R) or blue (B) light) is selectively transmitted is disposed on the light incident surface side of the photoelectric conversion portion PD2. The color filter 59 may be disposed, for example, in the insulating layer 55 provided on the back surface side of the semiconductor substrate 60. The array may be, for example, an array in which the color filters 59 of the same color are alternately disposed not to be adjacent to each other. As described above, by disposing the color filter 59 on the light incident surface of the photoelectric conversion portion PD2, it is possible to limit a wavelength band of light incident on the photoelectric conversion portion PD2, so that light having a specific wavelength component can be photoelectrically converted in the photoelectric conversion portion PD2.

The transfer transistor 21 configured by a vertical transistor is provided on the element formation surface (lower surface in the plane of drawing) side of the semiconductor substrate 60, that is, the element formation surface side. The gate electrode 211 of the transfer transistor 21 reaches the n-type semiconductor region 62 from the surface of the semiconductor substrate 60, and is connected to the vertical drive circuit 103 via a through-electrode penetrating through an insulating layer 64 and an interlayer insulating film 66 and a wiring layer 67 (a part of the transfer control line).

The insulating layer 64 is provided on the element formation surface of the semiconductor substrate 60, and an individual island-shaped semiconductor layer 65 is provided in each pixel region on the insulating layer 64. The pixel circuit (the reset transistor 12, the amplification transistor 13, the selection transistor 14, the reset transistor 22, the floating diffusion region FD2, the amplification transistor 23, and the selection transistor 24) of each pixel 101 is provided in the island-shaped semiconductor layer 65.

The electric charge flowing out from the charge storage region 251 via the transfer transistor 21 is stored in the floating diffusion region FD2 of the semiconductor layer 65. The floating diffusion region FD2 is connected to the source of the reset transistor 22 and the gate electrode 231 of the amplification transistor 23 via the wiring layer 67 formed in the interlayer insulating film 66.

(Pixel Isolation Structure)

The semiconductor substrate 60 may be provided with a pixel isolation portion that electrically and/or optically isolates the plurality of pixels 101 from each other. Each pixel 101 may be provided in one pixel region partitioned by the pixel isolation portion. For example, in a case where the image sensor 100 is viewed from the back surface (upper surface in the drawing) side of the semiconductor substrate 60, the pixel isolation portion may have, for example, a lattice shape interposed between the plurality of pixels 101, and each photoelectric conversion portion PD2 may be provided in one pixel region partitioned by the pixel isolation portion.

For example, a fixed charge film may be provided between the semiconductor substrate 60 and the pixel isolation portion. The fixed charge film may be formed by using, for example, a high dielectric having negative fixed electric charge so that a positive electric charge (hole) storage region is formed at an interface portion with the semiconductor substrate 60 and generation of a dark current is suppressed. Since the fixed charge film is formed to have negative fixed electric charge, an electric field is applied to the interface with the semiconductor substrate 60 by the negative fixed electric charge, and thus a positive electric charge (hole) storage region is formed.

The fixed charge film may be formed of, for example, a hafnium oxide film ($HfO_2$ film). In addition, the fixed charge film may be formed to contain at least one of oxides such as hafnium, zirconium, aluminum, tantalum, titanium, magnesium, yttrium, and lanthanoid elements.

The pixel isolation portion may have various element isolation structures such as a so-called full trench isolation (FTI) structure reaching from the front surface to the back surface of the semiconductor substrate 60, and a so-called deep trench isolation (DTI) structure formed from the back surface or the front surface of the semiconductor substrate 60 to the vicinity of the middle of the semiconductor substrate 60.

(Pupil Correction)

On the upper surface of the transparent electrode 53 functioning as an anode, a sealing film 52 formed of a silicon oxide film, a silicon nitride film, or the like is provided. The upper surface of the sealing film 52 is planarized through, for example, chemical mechanical polishing (CMP), and an on-chip lens 51 for each pixel 101 is provided on the planarized upper surface. The sealing film 52 is made of, for example, an insulating material such as silicon nitride (SiN), and may include atoms of aluminum (Al), titanium (Ti), and the like in order to prevent the atoms from diffusing from the transparent electrode 53. However, the present invention is not limited thereto, and the sealing film 52 may have a stacked structure including a lower sealing film and an upper planarized film.

The on-chip lens 51 of each pixel 101 has such a curvature that incident light is collected in the photoelectric conversion portions PD1 and PD2. Note that a positional relationship between the on-chip lens 51, the color filter 59, and the photoelectric conversion portion PD2 in each pixel 101 may be adjusted according to, for example, the distance (image height) from the center of the pixel array portion 102 (pupil correction).

As described above, the image sensor 100 according to the present embodiment has a stacked structure including the layer (for example, from the sealing film 52 to the insulating layer 55), as the first layer, including the photoelectric conversion layer 54 provided on the light incident surface (back surface) side of the semiconductor substrate 60, the layer, as the second layer, including the semiconductor substrate 60 and the insulating layer 64, and the layer, as the third layer, including the semiconductor layer 65 and the interlayer insulating film 66 on the insulating layer 64. The photoelectric conversion portion PD1 that photoelectrically converts green (G) light is disposed in the first layer, and the photoelectric conversion portion PD2 that photoelectrically converts blue (B) light or red (R) light is disposed in the semiconductor substrate 60 of the second layer. The color filter 59 through which blue (B) light or red (R) light is transmitted is disposed in the insulating layer 55 between the photoelectric conversion portions PD1 and PD2. In the semiconductor layer 65 of the third layer, pixel transistors (the reset transistors 12 and 22, the amplification transistors 13 and 23, and the selection transistors 14 and 24) of the first pixel 10 and the second pixel 20 are disposed.

In order to transfer the electric charge generated in the photoelectric conversion portion PD1 of the first layer to the pixel transistor of the third layer, the through-electrode 68 penetrating from the first layer to the third layer (that is, the insulating layer 55, the semiconductor substrate 60, the insulating layer 64, and the interlayer insulating film 66) is provided. The light receiving chip 41 having the sectional structure as described above is stacked on the circuit chip 42 as described with reference to FIG. 3.

In FIG. 7, the well tap 161 of the second layer is a diffusion layer region for fixing the well potential of the semiconductor substrate 60, for example, a high-concentration P diffusion region doped with boron (B), and is fixed to the GND potential (0 V), for example.

The gate electrode 211 of the transfer transistor 21 includes, for example, a vertical transistor having a vertical transfer structure, and transfers the electric charge generated in the photoelectric conversion portion PD2 and stored in the charge storage region 251 to the floating diffusion layer FD2.

A part of the floating diffusion region FD2 is provided on the element formation surface of the semiconductor substrate 60 included in the second layer. The floating diffusion region FD2 is connected to the floating diffusion region FD2 provided on the element formation surface of the semiconductor layer 65 included in the third layer via a through-electrode 69 and the wiring layer 67.

The reset transistor 22 of the second pixel 20 has a function of resetting the floating diffusion regions FD2 of the second layer and the third layer.

The drain of the reset transistor 22 and the drain of the amplification transistor 23 are connected to the power supply voltage VDD.

The gate electrode 231 of the amplification transistor 23 is connected to the floating diffusion region FD2. As a result, a pixel signal of a voltage having a voltage value based on an amount of electric charge generated in the photoelectric conversion portion PD2 appears at the source of the amplification transistor 23.

The selection transistor 24 outputs the pixel signal generated by the amplification transistor 23 to the vertical signal line VSL2 on the basis of the selection control signal SEL2 applied to the gate electrode 241.

A well tap 261 of the third layer is a diffusion layer region for fixing the well potential of the semiconductor layer 65, for example, a high-concentration P region doped with boron (B), and is fixed to, for example, the GND potential (0 V). Note that the well tap 261 of the third layer may be shared between adjacent pixels. As a result, the effective element formation region of the third layer can be enlarged.

The electric charge generated in the photoelectric conversion portion PD1 of the first layer is stored in the semiconductor layer on the storage electrode 112 in the photoelectric conversion layer 54, and is transferred to the read electrode 11 through the subsequent transfer operation. The read electrode 11 is connected to the floating diffusion layer FD1 of the semiconductor layer 65 included in the third layer via the through-electrode 68 (corresponding to a through-electrode 68-1 in FIG. 7).

The reset transistor 12 of the first pixel 10 has a function of resetting the floating diffusion region FD1 of the third layer.

The gate electrode 131 of the amplification transistor 13 is connected to the floating diffusion region FD1. As a result, a pixel signal having a voltage value based on an amount of electric charge generated in the photoelectric conversion portion PD1 appears at the source of the amplification transistor 23.

The selection transistor 14 outputs the pixel signal generated by the amplification transistor 13 to the vertical signal line VSL1 on the basis of the selection control signal SEL1 applied to the gate electrode 141.

As described above, in the present embodiment, the pixel transistors of the first pixel 10 and the second pixel 20 are disposed in a layer different from the semiconductor substrate 60. As a result, it is possible to expand the region of the charge storage region 251 that stores the electric charge generated in the photoelectric conversion portion PD2.

Here, the through-electrode 68 (at least one of the through-electrodes 68-1 to 68-4 in FIG. 7) that electrically connects the photoelectric conversion portion PD1 of the first layer and the floating diffusion region FD1 of the third layer may be provided in, for example, a region between the pixels 101, for example, the pixel isolation portion that partitions the pixel region. Consequently, the area of the charge storage region 251 can be maximized. In this case, the area of the pixel region can be maximized by disposing the through-electrode 68 at the intersection point where the corners of the four pixels 101 face each other.

Similarly, the through-electrode 69 electrically connecting the floating diffusion region FD2 of the second layer and the floating diffusion region FD2 of the third layer is not limited to the inside of the pixel region, and may be provided in, for example, a region between the pixels 101, for example, the pixel isolation portion that partitions the pixel region. Consequently, the area of the charge storage region 251 can be maximized. In this case, the area of the pixel region can be maximized by disposing the through-electrode 69 at the intersection point where the corners of the four pixels 101 face each other.

In FIGS. 6 and 7, the case where each pixel transistor is provided on the surface of the semiconductor layer 65 opposite to the semiconductor substrate 60 (that is, a case where the element formation surface of the semiconductor layer 65 is a surface opposite to the semiconductor substrate 60) has been exemplified, but the present invention is not limited thereto, and the element formation surface of the semiconductor layer 65 may be a surface facing the semiconductor substrate 60. A structure of the pixel transistor formed in the semiconductor layer 65 is not limited to a general planar type, and may be various structures such as a fin type.

In FIGS. 6 and 7, a case where the island-shaped semiconductor layers 65 (that is, the pixel transistor configuring the pixel circuit of each pixel 101) are disposed in the same period as the arrangement period of the photoelectric conversion portions PD2 in a plane parallel to the element formation surface is exemplified, but the present invention is not limited thereto. For example, various modifications may be made, such as disposing the island-shaped semiconductor layers 65 shifted by a half period with respect to the arrangement period of the photoelectric conversion portions PD2.

A film thickness of the insulating layer 64 may be, for example, 4 μm (micrometers) or less, and more preferably 1 μm or less.

1.7 Material Examples of Each Layer

Next, a material of each layer configuring the pixel 101 according to the present embodiment will be described with an example.

(Pixel Transistor Material)

Examples of materials of the semiconductor layer 65 provided with the pixel transistors of the first pixel 10 and the second pixel 20 may include crystalline silicon, amorphous silicon, microcrystalline silicon, crystalline selenium, and amorphous selenium, compound semiconductors such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$, which are chalcopyrite compounds, or GaAs, InP, AlGaAs, InGaP, AlGaInP, and InGaAsP, which are group III-V compounds, and CdSe, Cds, In$_2$Se$_3$, In$_2$S$_3$, Bi$_2$Se$_3$, Bi$_2$S$_3$, ZnSe, ZnS, PbSe, and PbS, quantum dots made of these materials, oxide semiconductor materials such as IGZO, transition metal dichalcogenides, silicon carbides, diamond, graphene, carbon nanotubes, and organic semiconductor materials such as fused polycyclic hydrocarbon compounds, and fused heterocyclic compounds.

(Insulating Film Material)

Each insulating film including the insulating layer 55, the insulating layer 64, and the interlayer insulating film 66 may include, for example, a silicon oxide film, tetraethyl orthosilicate (TEOS), a silicon nitride film, or a silicon oxynitride film. Hafnium oxide, aluminum oxide, zirconium oxide, tantalum oxide, titanium oxide, or the like may be used. Examples of materials other than the above materials may include lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, an aluminum nitride film, a hafnium oxynitride film, and an aluminum oxynitride film.

(Through-Electrode and Via Wiring Materials)

For each electrode or wiring including the through-electrode 68 (through-electrodes 68-1 to 68-4) and the through-electrode 69, for example, a doped silicon material such as phosphorus doped amorphous silicon (PDAS) or a metal material such as aluminum (Al), tungsten (W), titanium (Ti), cobalt (Co), hafnium (Hf), or tantalum (Ta) may be used.

(Semiconductor Substrate Material)

The semiconductor substrate 60 is, for example, an n-type silicon substrate, and has a P-well in a predetermined region inside. Crystalline silicon, amorphous silicon, microcrystalline silicon, crystalline selenium, and amorphous selenium, compound semiconductors such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$, which are chalcopyrite compounds, or GaAs, InP, AlGaAs, InGaP, AlGaInP, and InGaAsP, which are group III-V compounds, and CdSe, Cds, In$_2$Se$_3$, In$_2$S$_3$, Bi$_2$Se$_3$, Bi$_2$S$_3$, ZnSe, ZnS, PbSe, and PbS may be used. Quantum dots made of these materials may be used for the photoelectric conversion layer.

(Photoelectric Conversion Layer Material)

In a case where an organic semiconductor is used as a material of the photoelectric conversion layer 54, the photoelectric conversion layer 54 may have the following layer structure. However, in the case of the stacked structure, the stacking order may be appropriately changed.

(1) Single-layer structure of p-type organic semiconductor (2) Single-layer structure of n-type organic semiconductor (3-1) Stacked structure of p-type organic semiconductor layer/n-type organic semiconductor layer (3-2) Stacked structure of p-type organic semiconductor layer/mixed layer (bulk heterostructure) of p-type organic semiconductor and n-type organic semiconductor/n-type organic semiconductor layer (3-3) Stacked structure of p-type organic semiconductor layer/mixed layer (bulk heterostructure) of p-type organic semiconductor and n-type organic semiconductor (3-4) Stacked structure of n-type organic semiconductor layer/mixed layer (bulk heterostructure) of p-type organic semiconductor and n-type organic semiconductor (4) Mixed layer of p-type organic semiconductor and p-type organic semiconductor (bulk heterostructure)

Here, examples of the p-type organic semiconductor may include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a benzothienobenzothiophene derivative, a triallylamine derivative, a carbazole derivative, a perylene derivative, a picene derivative, a chrysene derivative, a fluoranthene derivative, a phthalocyanine derivative, a subphthalocyanine derivative, a subporphyrazine derivative, a metal complex having a heterocyclic compound as a ligand, a polythiophene derivative, a polybenzothiadiazole derivative, and a polyfluorene derivative.

Examples of the n-type organic semiconductor may include fullerene and a fullerene derivative <for example, fullerenes such as C60, C70, and C74 (higher-order fullerenes), endohedral fullerenes, or fullerene derivatives (for example, fullerene fluoride, a PCBM fullerene compound, and fullerene multimer)>, an organic semiconductor having a larger (deeper) HOMO and LUMO than a p-type organic semiconductor, and a transparent inorganic metal oxide.

Specific examples of the n-type organic semiconductor may include heterocyclic compounds containing a nitrogen atom, an oxygen atom, and a sulfur atom, for example, organic molecules, organometallic complexes, and subphthalocyanine derivatives having, as part of their molecular skeletons, pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylenevinylene derivatives, polybenzothiadiazole derivatives, and polyfluorene derivatives.

Specific examples thereof may include halogen atoms as groups or the like contained in fullerene derivatives; linear, branched or cyclic alkyl or phenyl groups; groups having linear or condensed aromatic compounds; groups having halide; partial fluoroalkyl group; perfluoroalkyl group; silylalkyl group; silyl alkoxy group; arylsilyl group; arylsulfanyl group; alkylsulfanyl group; arylsulfonyl group; alkylsulfonyl group; aryl sulfide group; alkyl sulfide group; amino group; alkylamino group; arylamino group; hydroxy group; alkoxy group; acylamino group; acyloxy group; carbonyl group; carboxy group; carboxamide group; carboalkoxy group; acyl group; sulfonyl group; cyano group; nitro group; groups having chalcogenide; phosphine group; phosphon group; and derivatives thereof.

A film thickness of the photoelectric conversion layer made of the organic material as described above is not limited to the following value, and may be, for example, $1\times10^{-8}$ m (meter) to $5\times10^{-7}$ m, preferably $2.5\times10^{-8}$ m to $3\times10^{-7}$ m, more preferably $2.5\times10^{-8}$ m to $2\times10^{-7}$ m, and still more preferably $1\times10^{-7}$ m to $1.8\times10^{-7}$ m. Note that the organic semiconductor is often classified into a p-type and an n-type, but the p-type indicates that holes are easily transported, and the n-type indicates that electrons are easily transported, and the organic semiconductor is not limited to the interpretation that it has holes or electrons as a majority carrier of thermal excitation like the inorganic semiconductor.

Examples of a material forming the photoelectric conversion layer that photoelectrically converts light having a green wavelength include rhodamine-based dyes, melacyanine-based dyes, quinacridone derivatives, and subphthalo-cyanine-based dyes (subphthalocyanine derivatives).

Examples of a material forming the photoelectric conversion layer that photoelectrically converts blue light include a coumaric acid dye, tris-8 hydroxyquinoline aluminum (Alq3), and a melacyanine dye.

Examples of a material forming the photoelectric conversion layer that photoelectrically converts red light include phthalocyanine dyes and subphthalocyanine dyes (subphthalocyanine derivatives).

As the photoelectric conversion layer, a panchromatic photosensitive organic photoelectric conversion layer that is sensitive to substantially all visible light from the ultraviolet region to the red region may be used. On the other hand, examples of the inorganic material forming the photoelectric conversion layer may include crystalline silicon, amorphous silicon, microcrystalline silicon, crystalline selenium, and amorphous selenium, compound semiconductors such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$, which are chalcopyrite compounds, or GaAs, InP, AlGaAs, InGaP, AlGaInP, and InGaAsP, which are group III-V compounds, and CdSe, Cds, In$_2$Se$_3$, In$_2$S$_3$, Bi$_2$Se$_3$, Bi$_2$S$_3$, ZnSe, ZnS, PbSe, and PbS. In addition, quantum dots made of these materials may be used for the photoelectric conversion layer.

(Semiconductor Layer Material Stacked on Photoelectric Conversion Layer)

The photoelectric conversion layer 54 may have a stacked structure of a lower semiconductor layer and an upper photoelectric conversion layer. As described above, by providing the semiconductor layer below the photoelectric conversion layer, recombination at the time of storing electric charge can be prevented, and thus it is possible to increase the efficiency of transferring electric charge stored in the photoelectric conversion layer to the read electrode. Generation of dark current can be curbed. Note that a material forming the photoelectric conversion layer in this case may be appropriately selected from the above various materials forming the photoelectric conversion layer.

Here, as a material forming the semiconductor layer, a material having a large bandgap value (for example, a value of a band gap of 3.0 eV (electron volt) or more) and having higher mobility than the material forming the photoelectric conversion layer is preferably used. Specific examples thereof may include oxide semiconductor materials such as IGZO, transition metal dichalcogenides, silicon carbides, diamond, graphene, carbon nanotubes, and organic semiconductor materials such as fused polycyclic hydrocarbon compounds and fused heterocyclic compounds.

Alternatively, in a case where stored electric charge is an electron, a material having an ionization potential larger than the ionization potential of the material forming the photoelectric conversion layer may be used as a material forming the semiconductor layer. On the other hand, in a case where stored electric charge is a hole, a material having an electron affinity smaller than the electron affinity of the material forming the photoelectric conversion layer may be used as a material forming the semiconductor layer.

The impurity concentration in the material forming the semiconductor layer is preferably $1 \times 10^{18}$ cm$^{-3}$ or less. The photoelectric conversion layer and the semiconductor layer can be made of the same material as long as the photoelectric conversion performance and the mobility performance can be satisfied.

Here, a transparent material is desirably used as a material of each of the transparent electrode 53, the read electrode 11, the semiconductor layer in the photoelectric conversion layer 54, the storage electrode 112, and the shield electrode 113. Specifically, a material made of Al—Nd (an alloy of aluminum and neodymium) or ASC (an alloy of aluminum, samarium and copper) may be used.

A band gap energy of the transparent conductive material is desirably 2.5 eV or more, and preferably 3.1 eV or more.

On the other hand, in a case where the transparent electrode 53, the read electrode 11, the storage electrode 112, and the shield electrode 113 are transparent electrodes, examples of a transparent conductive material forming them include a conductive metal oxide.

Specifically, indium oxide, indium tin oxide ((ITO) including Sn-doped In$_2$O$_3$, crystalline ITO, and amorphous ITO), indium zinc oxide (IZO) obtained by adding indium as a dopant to zinc oxide, indium gallium oxide (IGO) obtained by adding indium as a dopant to gallium oxide, indium gallium zinc oxide (IGZO (In—GaZnO$_4$)) obtained by adding indium and gallium as dopants to zinc oxide, indium tin zinc oxide (ITZO) obtained by adding indium and tin as dopants to zinc oxide, IFO (F-doped In$_2$O$_3$), tin oxide (SnO$_2$), ATO (Sb-doped SnO$_2$), FTO (F-doped SnO$_2$), zinc oxide (including ZnO doped with other elements), aluminum-zinc oxide (AZO) obtained by adding aluminum as a dopant to zinc oxide, gallium-zinc oxide (GZO) obtained by adding gallium as a dopant to zinc oxide, titanium oxide (TiO$_2$), niobium-titanium oxide (TNO) obtained by niobium is added as a dopant to titanium oxide, antimony oxide, spinel type oxide, and oxide having a YbFe$_2$O$_4$ structure may be exemplified.

Alternatively, a transparent electrode using gallium oxide, titanium oxide, niobium oxide, nickel oxide, or the like as a parent layer may also be exemplified.

A thickness of the transparent electrode may be $2 \times 10^{-8}$ m to $2 \times 10^{-7}$ m, preferably $3 \times 10^{-8}$ m to $1 \times 10^{-7}$ m.

1.8 Summary

As described above, according to the present embodiment, in the stacked image sensor 100 in which the first layer photoelectric conversion portion PD1 and the second layer photoelectric conversion portion PD2 are stacked in the substrate thickness direction of the semiconductor substrate 60, the pixel transistor configuring the pixel circuit of the first pixel 10 and the pixel transistor configuring the pixel circuit of the second pixel 20 are disposed in the semiconductor layer 65 provided on the opposite side of the light incident surface of the semiconductor substrate 60. As a result, in the second layer, the area of the charge storage region 251 that stores electric charge generated in the photoelectric conversion portion PD2 can be increased, so that it is possible to curb a decrease in the saturation electric charge amount characteristics due to a decrease in the area of the charge storage region 251. Since it is possible to increase the area in which the pixel transistors of the first pixel 10 and the second pixel 20 can be disposed, it is possible to curb deterioration in noise characteristics due to size reduction of the amplification transistor 13 and/or 23. As a result, it is possible to realize a photodetection device, an electronic apparatus, and a photodetection system capable of curbing deterioration in image quality.

1.9 Modification Examples

Next, modification examples of the pixel 101 according to the above-described first embodiment will be described with some examples.

Table 1 below is a table illustrating a combination example of layers (either the second layer or the third layer) in which the read electrode 11 and the pixel transistors (the amplification transistor 13, the reset transistor 12, and the selection transistor 14) of the first pixel 10 are disposed. Table 2 is a table illustrating an example of a combination of layers (either the second layer or the third layer) in which the pixel transistors (the transfer transistor 21, the amplification transistor 23, the reset transistor 22, and the selection transistor 24) of the second pixel 20 are disposed. In Tables 1 and 2, '#n' (where n is a natural number) is a number indicating a variation of the combination, '2' indicates that a corresponding pixel transistor is disposed in the second layer illustrated in FIG. 7, and '3' indicates that a corresponding pixel transistor is disposed in the second layer illustrated in FIG. 7. In the tables, the transistor is denoted by 'Tr'.

TABLE 1

| | Pixel Transistor for Photoelectric Conversion Portion PD1 | | | |
|---|---|---|---|---|
| Combination | Transfer G | Amplification Tr | Reset Tr | Selection Tr |
| #1 | — | 2 | 2 | 2 |
| #2 | — | 2 | 2 | 3 |
| #3 | — | 2 | 3 | 2 |
| #4 | — | 2 | 3 | 3 |
| #5 | — | 3 | 2 | 2 |
| #6 | — | 3 | 2 | 3 |
| #7 | — | 3 | 3 | 2 |
| #8 | — | 3 | 3 | 3 |
| #9 | 2 | 2 | 2 | 2 |
| #10 | 2 | 2 | 2 | 3 |
| #11 | 2 | 2 | 3 | 2 |
| #12 | 2 | 2 | 3 | 3 |
| #13 | 2 | 3 | 2 | 2 |
| #14 | 2 | 3 | 2 | 3 |
| #15 | 2 | 3 | 3 | 2 |
| #16 | 2 | 3 | 3 | 3 |
| #17 | 3 | 2 | 2 | 2 |
| #18 | 3 | 2 | 2 | 3 |
| #19 | 3 | 2 | 3 | 2 |
| #20 | 3 | 2 | 3 | 3 |
| #21 | 3 | 3 | 2 | 2 |
| #22 | 3 | 3 | 2 | 3 |
| #23 | 3 | 3 | 3 | 2 |
| #24 | 3 | 3 | 3 | 3 |

TABLE 2

| | Pixel Transistor for Photoelectric Conversion Portion PD2 | | | |
|---|---|---|---|---|
| Combination | Transfer Tr | Amplification Tr | Reset Tr | Selection Tr |
| #1 | 2 | 2 | 2 | 2 |
| #2 | 2 | 2 | 2 | 3 |
| #3 | 2 | 2 | 3 | 2 |
| #4 | 2 | 2 | 3 | 3 |
| #5 | 2 | 3 | 2 | 2 |
| #6 | 2 | 3 | 2 | 3 |
| #7 | 2 | 3 | 3 | 2 |
| #8 | 2 | 3 | 3 | 3 |

First, as illustrated in Table 1, the read electrode 11 of the first pixel 10 is omitted in variations #1 to #8, is disposed in the second layer in variations #9 to #16, and is disposed in the third layer in variations #17 to #24. The amplification transistor 13 is disposed in the second layer in variations #1 to #4, #9 to #12, and #17 to #20, and is disposed in the third layer in variations #5 to #8, #13 to #16, and #21 to #24. The reset transistor 12 is disposed in the second layer in the variations #1 and #2, #5 and #6, #9 and #10, #13 and #14,

17 and #18, and #21 and #22, and is disposed in the third layer in the variations #3 and #4, #7 and #8, #11 and #12, #15 and #16, #19 and #20, and #23 and #24. The selection transistor 14 is disposed in the second layer in odd-numbered variations, and is disposed in the third layer in the even-numbered variations.

As described above, the read electrode 11 and the pixel transistors (the amplification transistor 13, the reset transistor 12, and the selection transistor 14) of the first pixel 10 can be disposed in either the second layer or the third layer, and the read electrode 11 can be omitted. Therefore, there are 24 combinations in total.

As illustrated in Table 2, the transfer transistor 21 of the second pixel 20 is disposed in the second layer in all of the variations. On the other hand, the amplification transistor 23 is disposed in the second layer in the variations #1 to #4, and is disposed in the third layer in the variations #5 to #8. The reset transistor 22 is disposed in the second layer in the variations #1 and #2 and #5 and #6, and is disposed in the third layer in the variations #3 and #4 and #7 and #8. The selection transistor 14 is disposed in the second layer in odd-numbered variations, and is disposed in the third layer in the even-numbered variations.

As described above, the pixel transistors (the transfer transistor 21, the amplification transistor 23, the reset transistor 22, and the selection transistor 24) of the second pixel 20 can be disposed in either the second layer or the third layer. Therefore, there are eight combinations in total.

Since the actual configuration of the image sensor 100 is a combination of Tables 1 and 2 described above, there are 192 variations in total including 24×8 variations. For example, the configuration described in the first exemplary embodiment with reference to FIG. 7 is a combination of the variation #8 in Table 1 and the variation #8 in Table 2.

Next, modification examples based on a structure picked up from the above-described combination variations will be described with some examples. Note that configurations, operations, and effects not particularly mentioned in the following modification examples may be similar to those of the above-described embodiments or other modification examples.

1.9.1 First Modification Example

Figure 8:
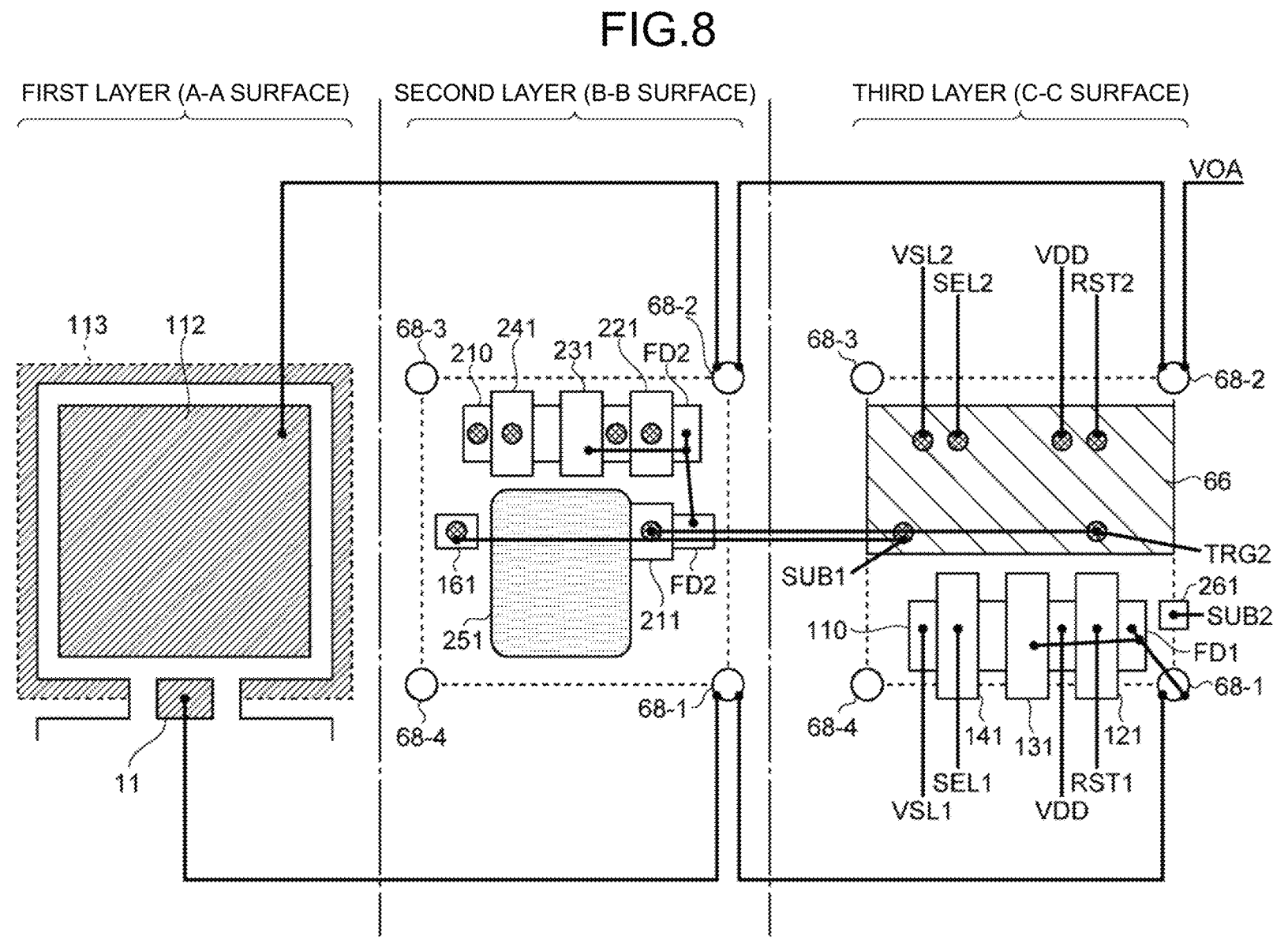

FIG. 8 is a layout diagram illustrating a schematic layout example of each layer of the pixel according to a first modification example. Note that the first layer, the second layer, and the third layer in FIG. 8 and the following layout diagrams respectively correspond to the A-A surface, the vicinity of the B-B surface (that is, the vicinity of the element formation surface of the semiconductor substrate 60), and the vicinity of the C-C surface (that is, the vicinity of the element formation surface of the semiconductor layer 65) in FIG. 6, similarly to FIG. 7. In FIG. 8 and the following layout diagrams, the same constituents as those in FIG. 7 and the like are denoted by the same reference numerals, and redundant description thereof will be omitted.

The first modification example is a combination of the variation #8 in Table 1 and the variation #1 in Table 2, in which the pixel circuit (the transfer transistor 21, the floating diffusion region FD2, the reset transistor 22, the amplification transistor 23, and the selection transistor 24) of the second pixel 20 and the charge storage region 251 are disposed in the second layer (the element formation surface of the semiconductor substrate 60), and the pixel circuit (the floating diffusion region FD1, the reset transistor 12, the amplification transistor 13, and the selection transistor 14) of the first pixel is disposed in the third layer (the element formation surface of the semiconductor layer 65).

According to such a structure, since the pixel transistor of the first pixel 10 and the pixel transistor of the second pixel 20 can be dispersedly disposed in the second layer and the third layer, the size of each of the pixel transistors (in particular, the amplification transistors 13 and 23) can be increased. Consequently, it is possible to curb deterioration in noise characteristics due to size reduction of the amplification transistor.

1.9.2 Second Modification Example

Figure 9:
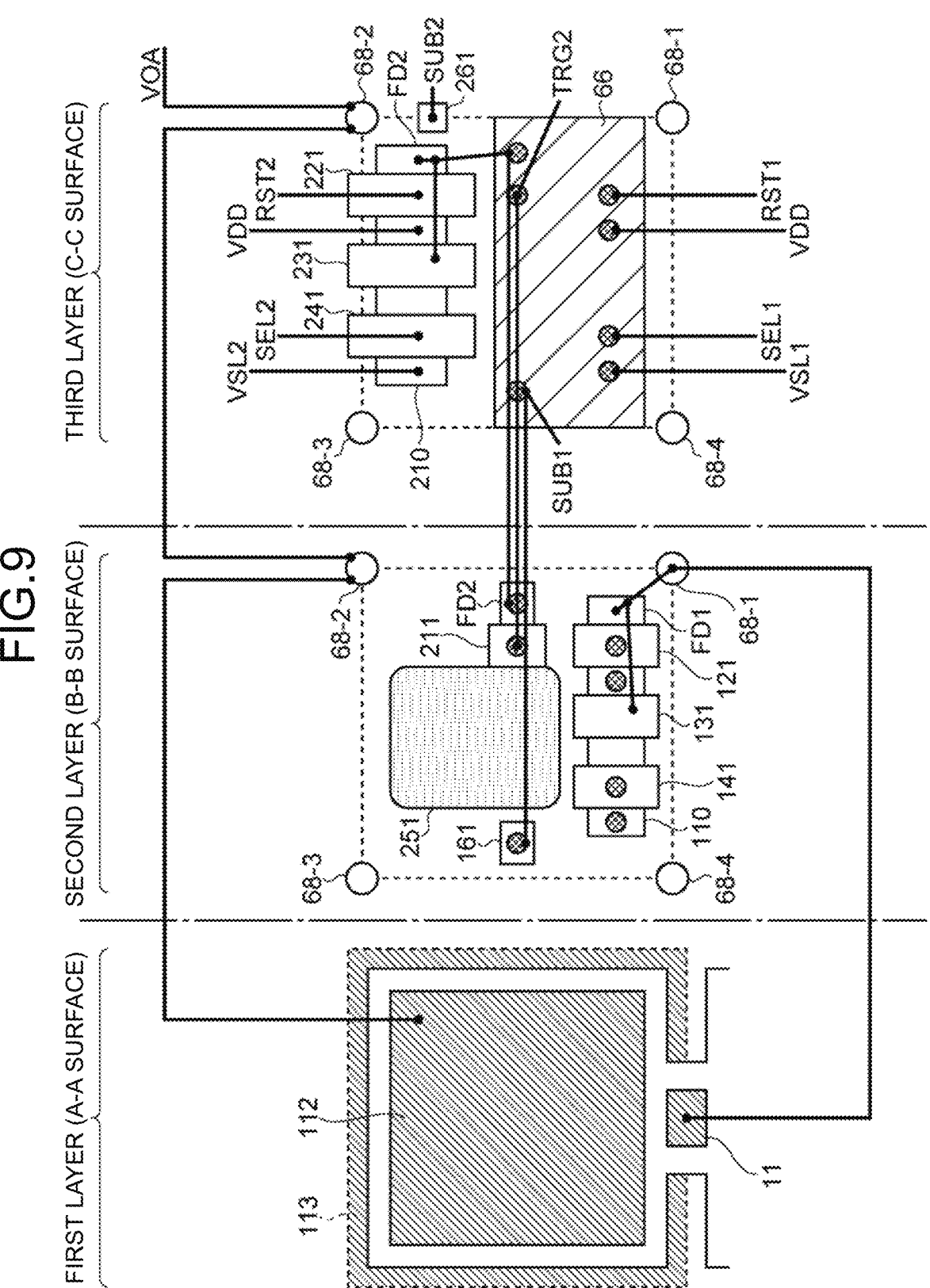
FIG. 9 is a layout diagram illustrating a schematic layout example of each layer of a pixel according to a second modification example of the first embodiment of the present disclosure.

FIG. 9 is a layout diagram illustrating a schematic layout example of each layer of the pixel according to a second modification example.

The second modification example is a combination of the variation #1 in Table 1 and the variation #8 in Table 2, in which the pixel circuit (the floating diffusion region FD1, the reset transistor 12, the amplification transistor 13, and the selection transistor 14) of the first pixel 10 and the charge storage region 251 are disposed in the second layer (the element formation surface of the semiconductor substrate 60), and the pixel circuit (the floating diffusion region FD1, the reset transistor 12, the amplification transistor 13, and the selection transistor 14) of the second pixel is disposed in the third layer (the element formation surface of the semiconductor layer 65).

According to such a structure, similarly to the first modification example, the pixel transistor of the first pixel 10 and the pixel transistor of the second pixel 20 can be dispersedly disposed in the second layer and the third layer, so that the size of each of the pixel transistors (in particular, the amplification transistors 13 and 23) can be increased. Consequently, it is possible to curb deterioration in noise characteristics due to size reduction of the amplification transistor.

1.9.3 Third Modification Example

Figure 10:
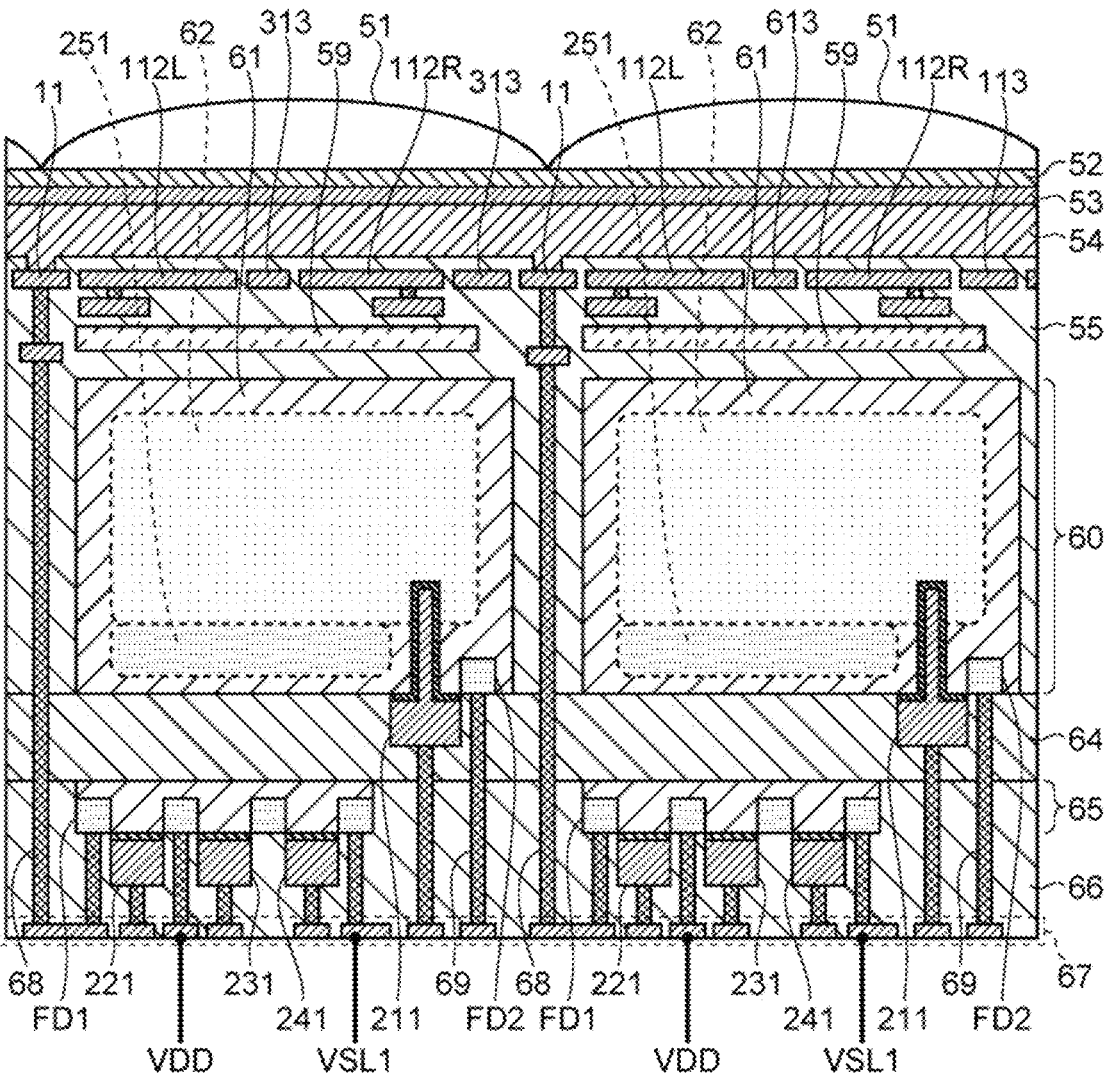
FIG. 10 is a sectional view illustrating a sectional structure example of a pixel according to a third modification example of the first embodiment of the present disclosure.
Figure 11:
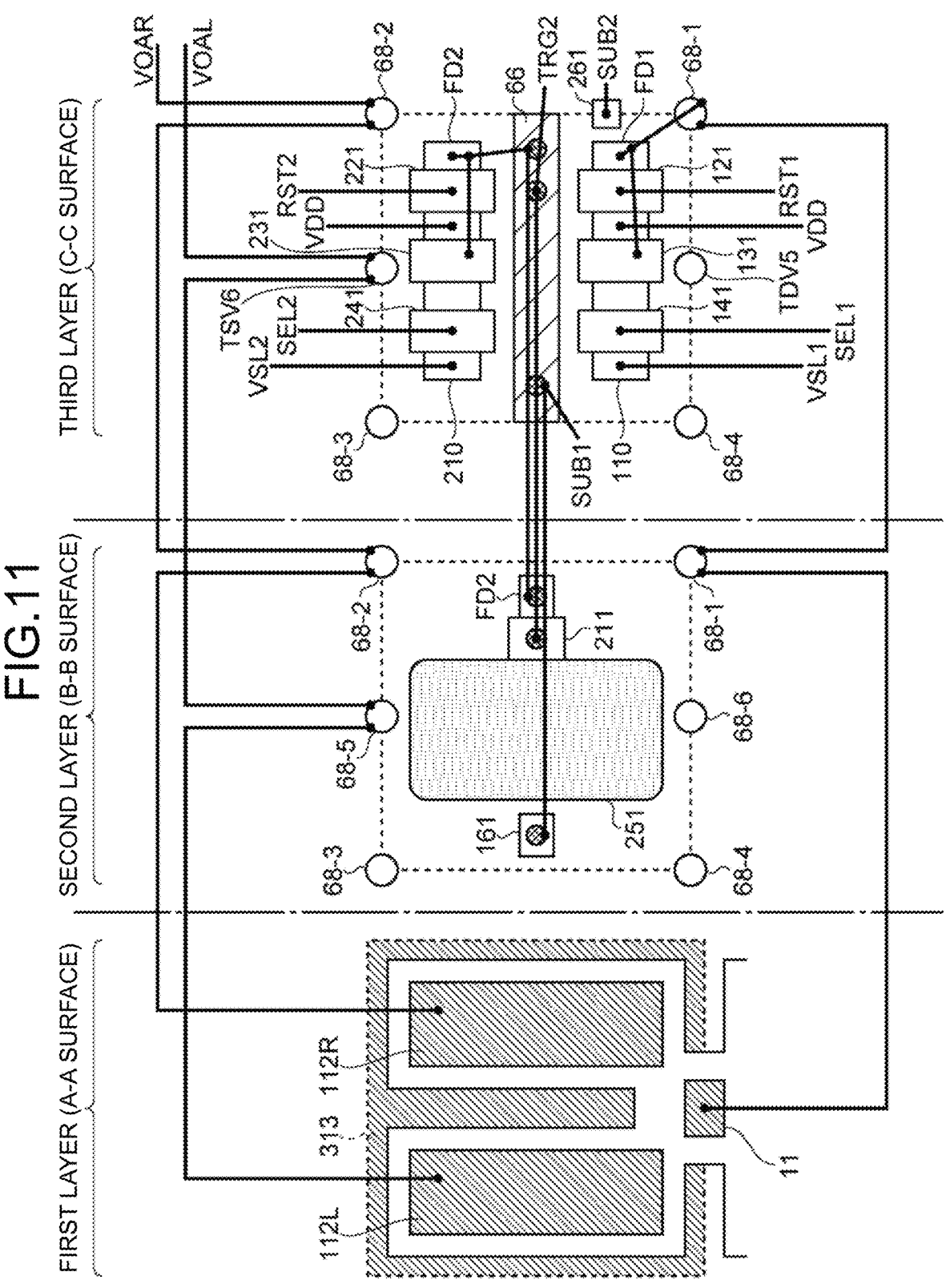
FIG. 11 is a layout diagram illustrating a schematic layout example of each layer of a pixel according to the third modification example of the first embodiment of the present disclosure.

FIG. 10 is a sectional view illustrating a sectional structure example of a pixel according to a third modification example, and FIG. 11 is a layout diagram illustrating a schematic layout example of each layer of the pixel according to the third modification example. Note that FIG. 10 and the following sectional views illustrate a sectional structure example in a section corresponding to the section of the pixel 101 illustrated in FIG. 6. In FIG. 10 and the following sectional views, the same constituents as those in FIG. 6 and the like are denoted by the same reference numerals, and redundant description thereof will be omitted.

Similarly to the first modification example, the third modification example is a combination of the variation #8 in Table 1 and the variation #1 in Table 2, but the storage electrode 112 is divided into a storage electrode 112L for a left pixel and a storage electrode 112R for a right pixel in order to operate the first pixel 10 as an image plane phase difference pixel including a pixel pair of the left pixel and the right pixel. A storage control voltage VOAL for controlling electric charge storage in the left pixel is applied to the storage electrode 112L via the through-electrode 68-5, and a storage control voltage VOAR for controlling electric charge storage in the right pixel is applied to the storage electrode 112R via the through-electrode 68-2. A part of the shield electrode 313 extends between the storage electrode 112L and the storage electrode 112R.

As described above, by dividing the storage electrode 112 into the left and right electrodes and applying independent storage control voltages VOAL and VOAR, it is possible to separate electric charge photoelectrically converted by light that has reached the photoelectric conversion portion PD1 following different light ray paths, and to obtain distance information.

Note that a read electrode for reading electric charge stored in the storage electrode 112L for the left pixel and a read electrode for reading the electric charge stored in the storage electrode 112R for the right pixel may be the same read electrode 11, or may be separate read electrodes provided for the left pixel and the right pixel, respectively. In the case of separate read electrodes, the read electrodes may be in contact with the photoelectric conversion portion PD1 at different positions.

According to such a structure, even in a case where the first pixel 10 configures an image plane phase difference pixel, it is possible to increase the area of the charge storage region 251 of the second layer similarly to the first embodiment, and thus, it is possible to curb deterioration in saturation electric charge amount characteristics. Since it is possible to increase the area in which the pixel transistors of the first pixel 10 and the second pixel 20 can be disposed, it is also possible to curb deterioration in noise characteristics.

1.9.4 Fourth Modification Example

Figure 12:
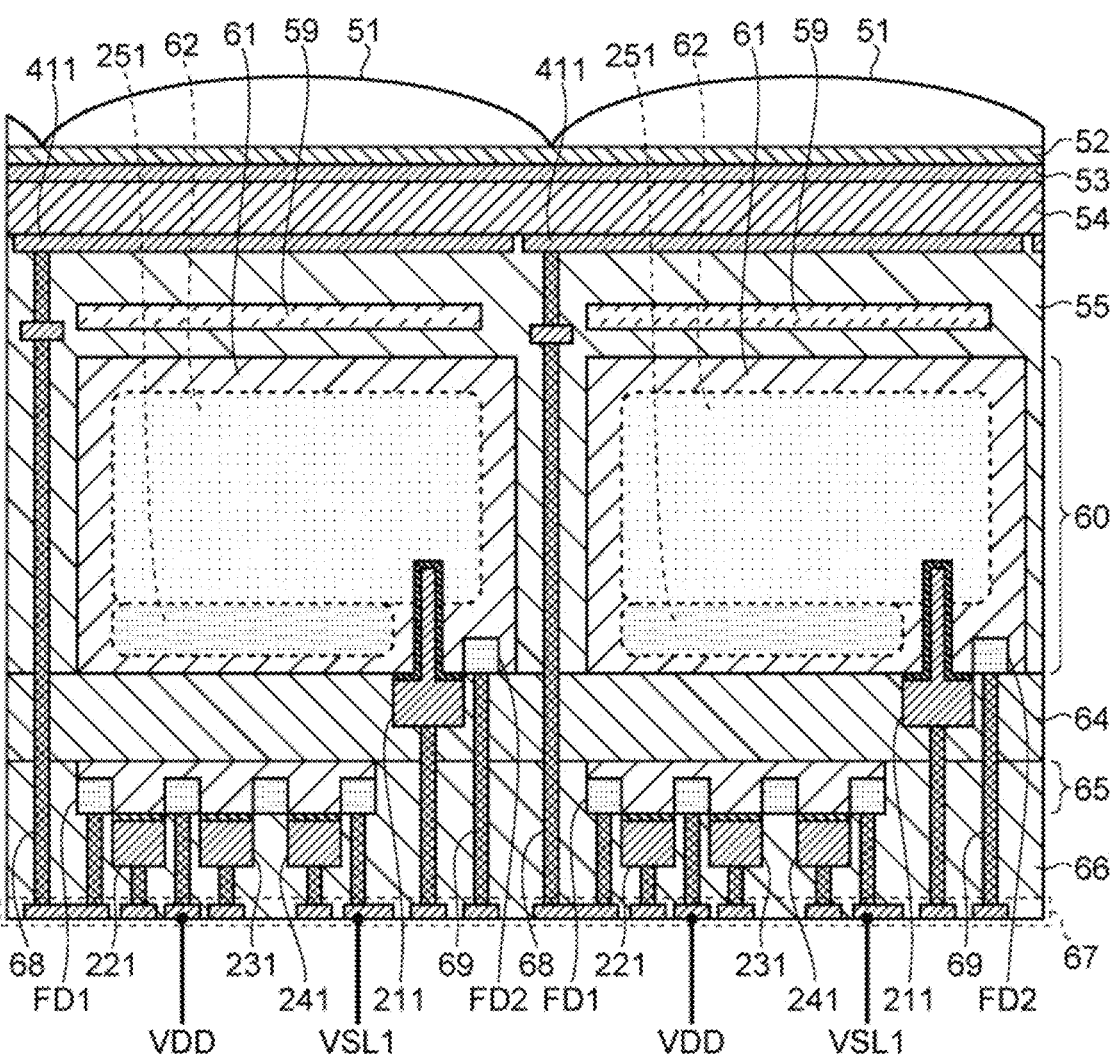
FIG. 12 is a sectional view illustrating a sectional structure example of a pixel according to a fourth modification example of the first embodiment of the present disclosure.
Figure 13:
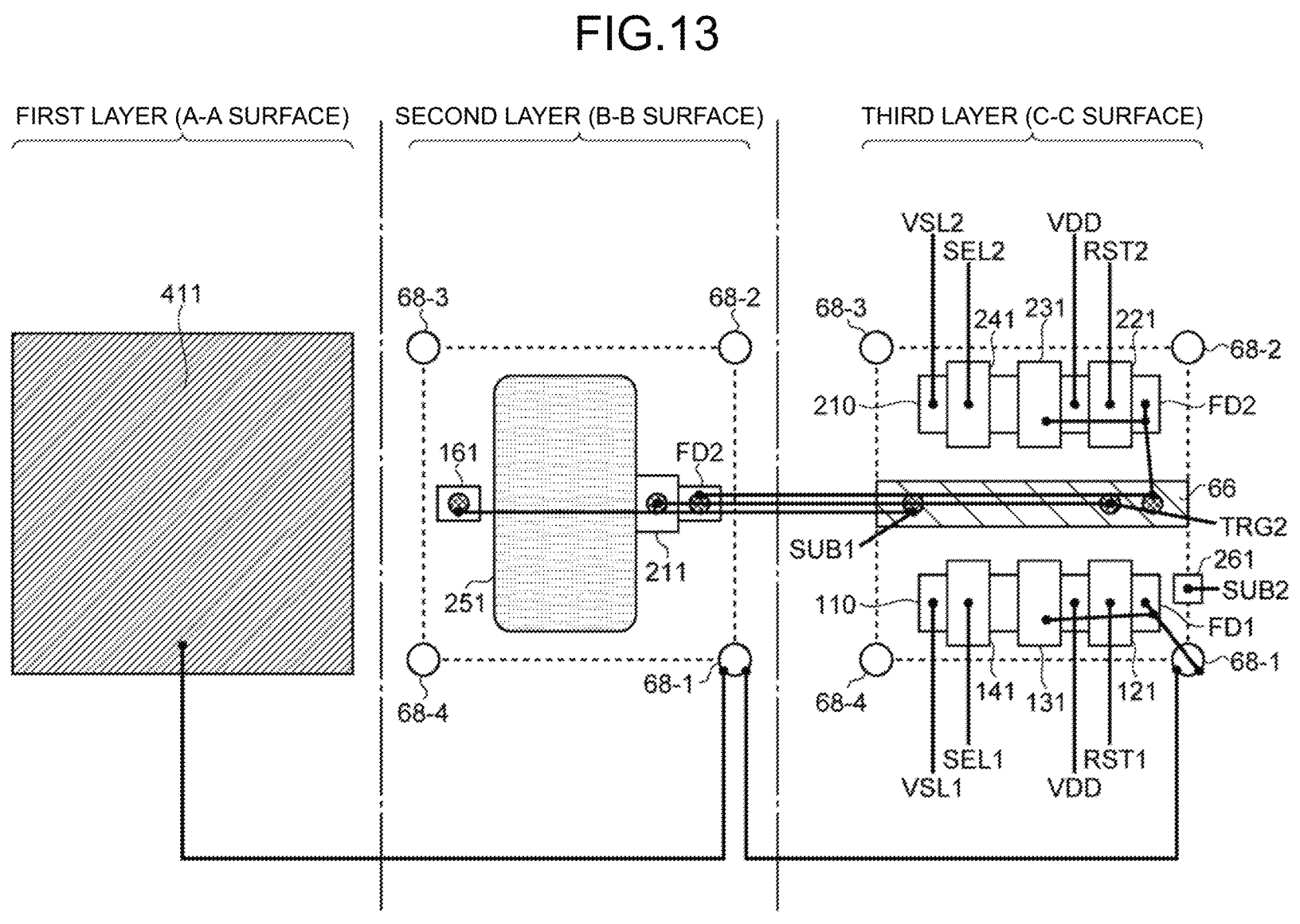

FIG. 12 is a sectional view illustrating a sectional structure example of a pixel according to a fourth modification example, and FIG. 13 is a layout diagram illustrating a schematic layout example of each layer of the pixel according to the fourth modification example.

Similarly to the first modification example, the fourth modification example is a combination of the variation #8 in Table 1 and the variation #1 in Table 2, but the storage electrode 112 and the shield electrode 113 in the first pixel 10 are omitted, and instead, a read electrode 411 spreading over substantially the entire pixel region is in contact with the lower surface of the photoelectric conversion layer 54.

In such a configuration, the electric charge generated in the photoelectric conversion portion PD1 of the first pixel 10 directly flows into the floating diffusion region FD2 of the third layer via the through-electrode 68-1. As a result, it is possible to reduce electric charge staying on the back surface side of the semiconductor substrate 60, so that it is possible to reduce the inflow of dark current to the charge storage region 251 of the semiconductor substrate 60.

1.9.5 Fifth Modification Example

Figure 14:
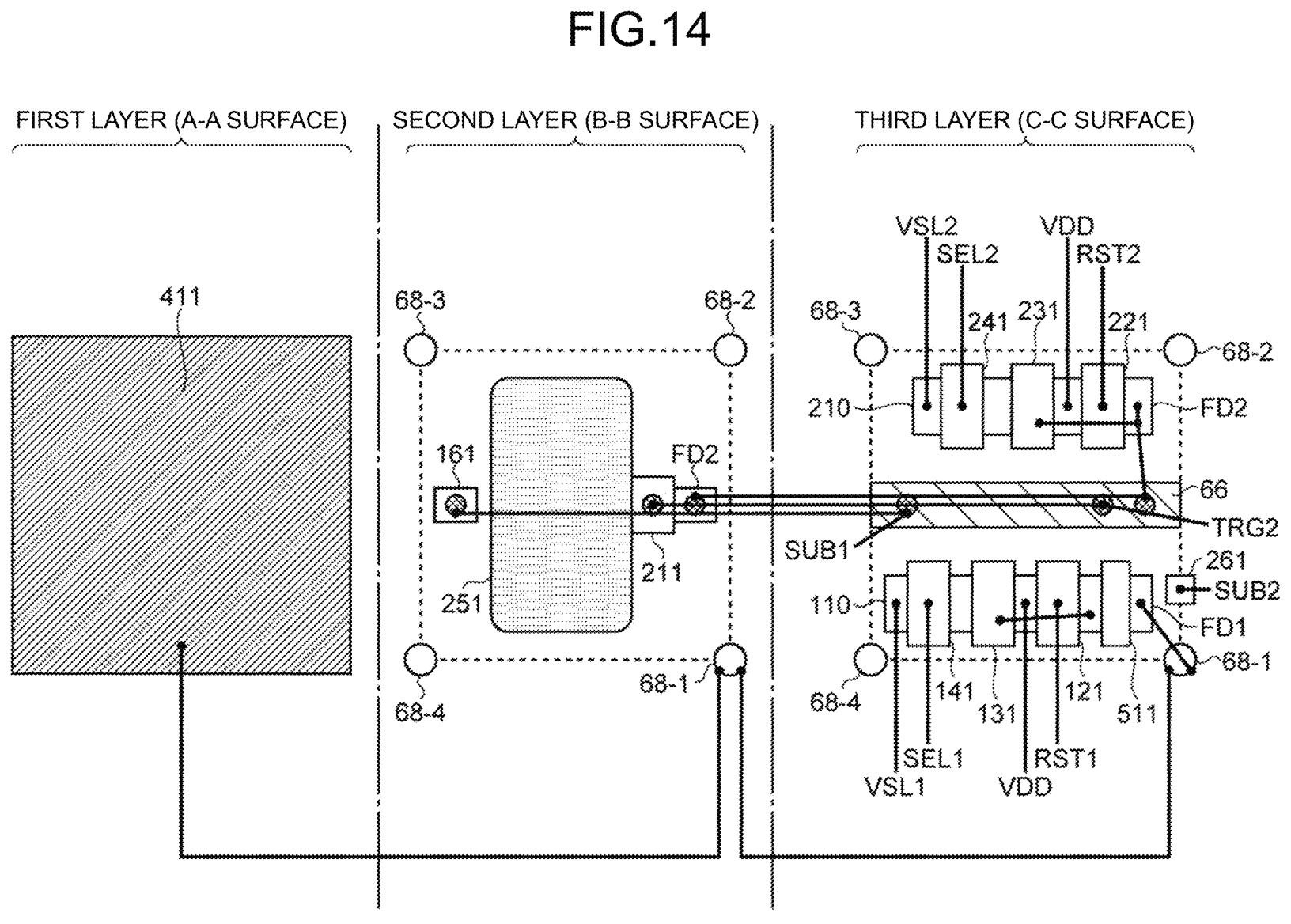

FIG. 14 is a layout diagram illustrating a schematic layout example of each layer of a pixel according to a fifth modification example.

The fifth modification example has a configuration in which a transfer transistor (a gate electrode 511 of the transfer transistor is illustrated in FIG. 14) for controlling the inflow of electric charge from the photoelectric conversion portion PD1 to the floating diffusion region FD1 is added to the third layer in the same configuration as the fourth modification example.

As described above, by employing a configuration capable of controlling the inflow of electric charge from the photoelectric conversion portion PD1 to the floating diffusion region FD1, it is possible to use an existing pixel circuit including a read electrode or a transfer transistor, and thus, it is possible to simplify the design process.

1.9.6 Sixth Modification Example

Figure 15:
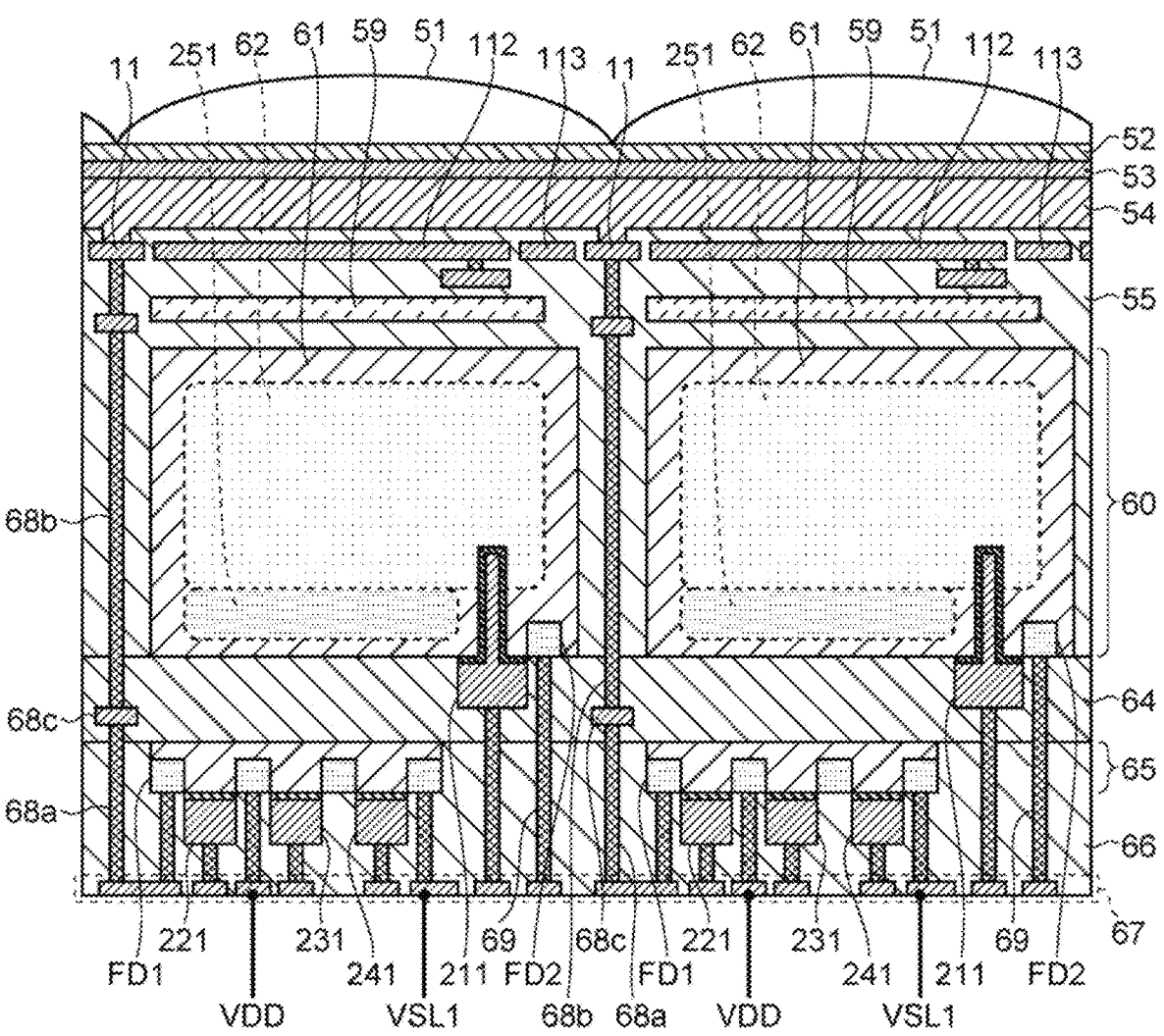
FIG. 15 is a sectional view illustrating a sectional structure example of a pixel according to a sixth modification example of the first embodiment of the present disclosure.

FIG. 15 is a sectional view illustrating a sectional structure example of a pixel according to a sixth modification example.

Similarly to the first modification example, the sixth modification example is a combination of the variation #8 in Table 1 and the variation #1 in Table 2, but has a configuration in which an electrode pad 68*c* that relays the through-electrode 68 is added to the insulating layer 64 between the second layer and the third layer. Thus, the through-electrode 68 penetrating from the first layer to the third layer is divided into a through-electrode 68*b* penetrating from the first layer to an electrode pad 68*c* in the insulating layer 64 and a through-electrode 68*a* penetrating from the electrode pad 68*c* to the third layer.

According to such a structure, since a length of each of the through-electrodes 68*a* and 68*b* in the substrate thickness direction can be shortened, a diameter of the through-electrode can be reduced. As a result, the parasitic capacitance of the entire through-electrode can be reduced, so that the conversion efficiency of the first pixel 10 can be improved. Since the degree of freedom in layout is increased by reducing the diameter of the through-electrode, it is also possible to achieve an effect that the overall degree of freedom in wiring can be improved. Since a depth of a trench when the through-electrode is formed can be reduced, the manufacturing process can be facilitated.

Note that the electrode pad 68*c* may be made of, for example, a semiconductor material (for example, silicon material) doped with impurities such as phosphorus doped amorphous silicon (PDAS), or a metal material such as aluminum (Al), tungsten (W), titanium (Ti), cobalt (Co), hafnium (Hf), or tantalum (Ta).

1.9.7 Seventh Modification Example

Figure 16:
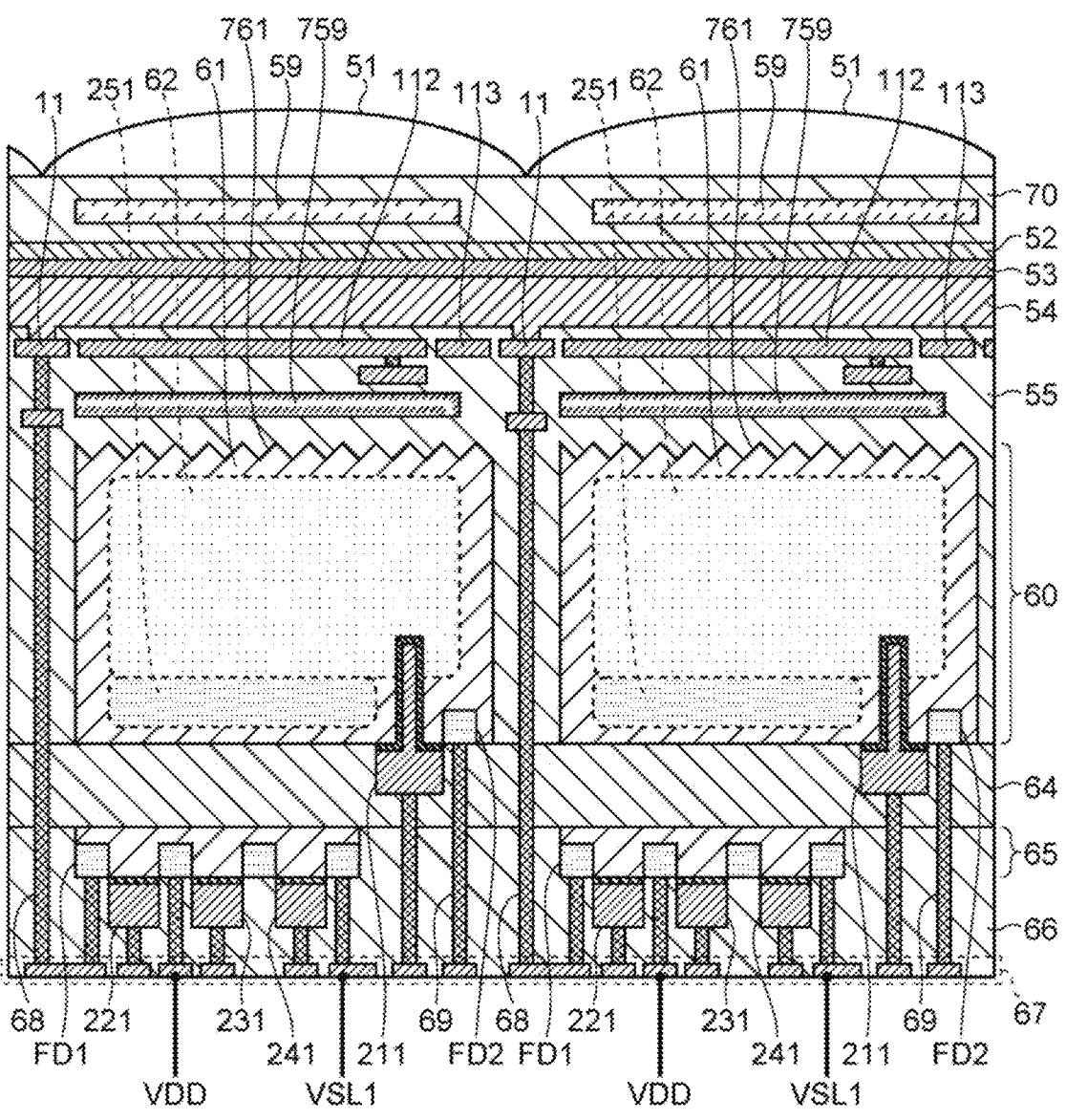
FIG. 16 is a sectional view illustrating a sectional structure example of a pixel according to a seventh modification example of the first embodiment of the present disclosure.

FIG. 16 is a sectional view illustrating a sectional structure example of a pixel according to a seventh modification example.

Similarly to the first modification example, the seventh modification example is a combination of the variation #8 in Table 1 and the variation #1 in Table 2, but the second pixel 20 is configured as an IR pixel that photoelectrically converts infrared light (or near-infrared light), and the first pixel 10 is configured as an RGB pixel that photoelectrically converts three primary colors of RGB.

In order to configure the first pixel 10 as an RGB pixel, in the seventh modification example, a planarized film 70 is added on the sealing film 52, and color filters 59 through which wavelength components of red (R), green (G), and blue (B) are respectively transmitted are disposed therein. The color filter 59 disposed in the insulating layer 55 between the photoelectric conversion portion PD1 and the photoelectric conversion portion PD2 is replaced with an IR filter 759 through which infrared light (or near infrared light) is transmitted. In order to curb reflection of infrared light (or near-infrared light) on the light incident surface of the semiconductor substrate 60, a minute uneven structure (also referred to as a moth-eye structure) 761 is provided on the light incident surface of the semiconductor substrate 60.

According to such a structure, in the image sensor 100 capable of acquiring an IR image in addition to a color image using the three primary colors of RGB, it is possible to curb deterioration in image quality due to deterioration in saturation electric charge amount characteristics, deterioration in noise characteristics, or the like.

Note that the planarized film 70 may include, for example, a silicon oxide film, tetraethyl orthosilicate (TEOS), a silicon nitride film, or a silicon oxynitride film, similarly to the insulating films including the insulating layer 55, the insulating layer 64, and the interlayer insulating film 66. Hafnium oxide, aluminum oxide, zirconium oxide, tantalum oxide, titanium oxide, or the like may be used. Examples of materials other than the above materials may include lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, an aluminum nitride film, a hafnium oxynitride film, and an aluminum oxynitride film.

1.9.8 Eighth Modification Example

Figure 17:
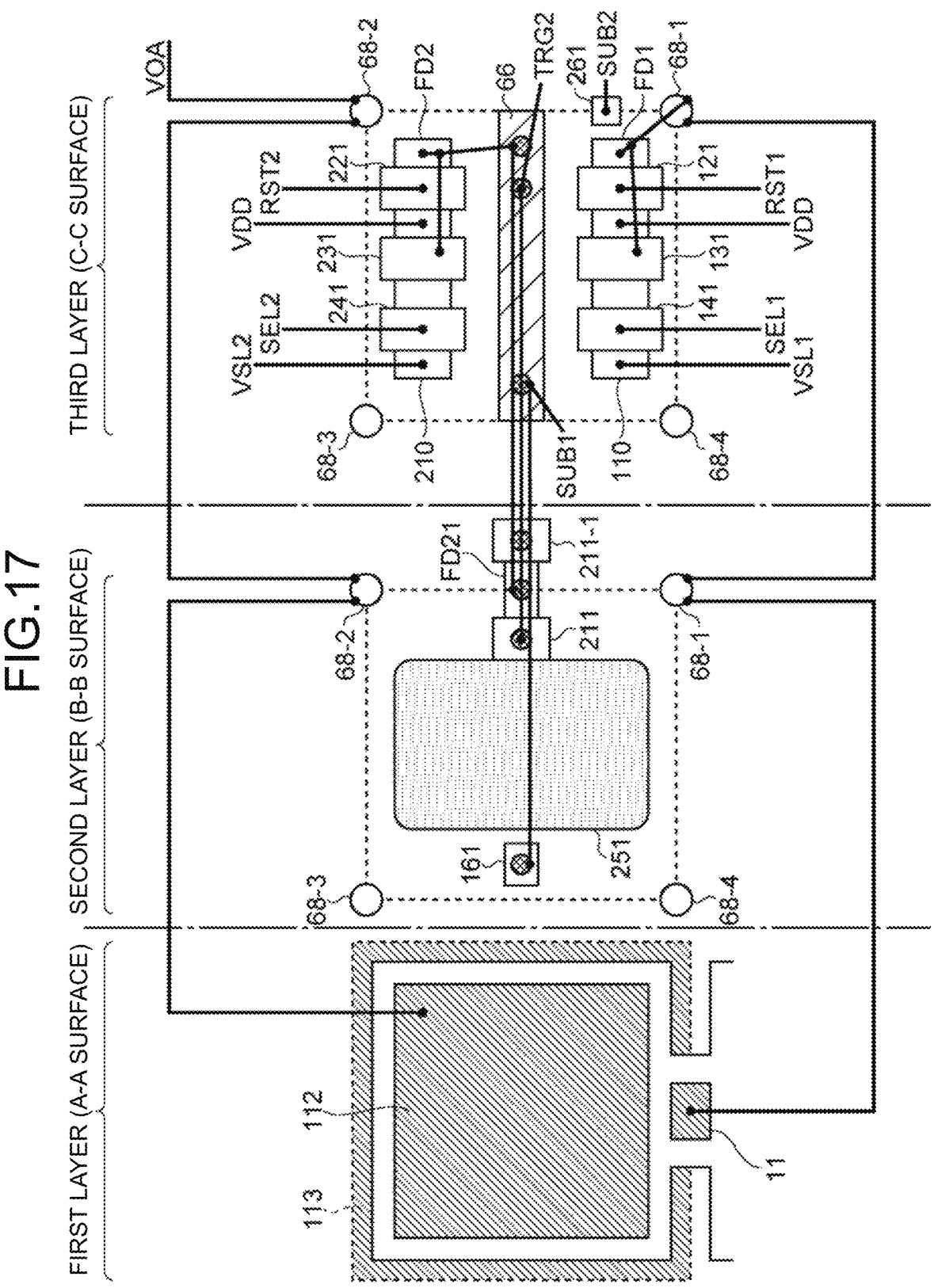
FIG. 17 is a layout diagram illustrating a schematic layout example of each layer of a pixel according to an eighth modification example of the first embodiment of the present disclosure.

FIG. 17 is a layout diagram illustrating a schematic layout example of each layer of a pixel according to an eighth modification example.

Similarly to the first modification example, the eighth modification example is a combination of the variation #8 in Table 1 and the variation #1 in Table 2, but the floating diffusion region FD2 of the second layer is shared between the second pixels 20 adjacent in the row direction (lateral direction in the drawing). In FIG. 17, a gate electrode 211-1 is the gate electrode of the transfer transistor 21 in the adjacent second pixel 20.

As described above, with the configuration in which the floating diffusion region FD2 is shared between the adjacent pixels, the pixel circuit (the reset transistor 22, the amplification transistor 23, and the selection transistor 24) connected to the floating diffusion region FD2 can also be shared between the adjacent pixels, so that the number of pixel transistors to be provided can be reduced. As a result, it is possible to secure the occupied area of the charge storage region 251 and the pixel transistor, and thus, it is possible to curb deterioration in image quality due to deterioration in saturation electric charge amount characteristics, deterioration in noise characteristics, or the like.

1.9.9 Ninth Modification Example

Figure 18:
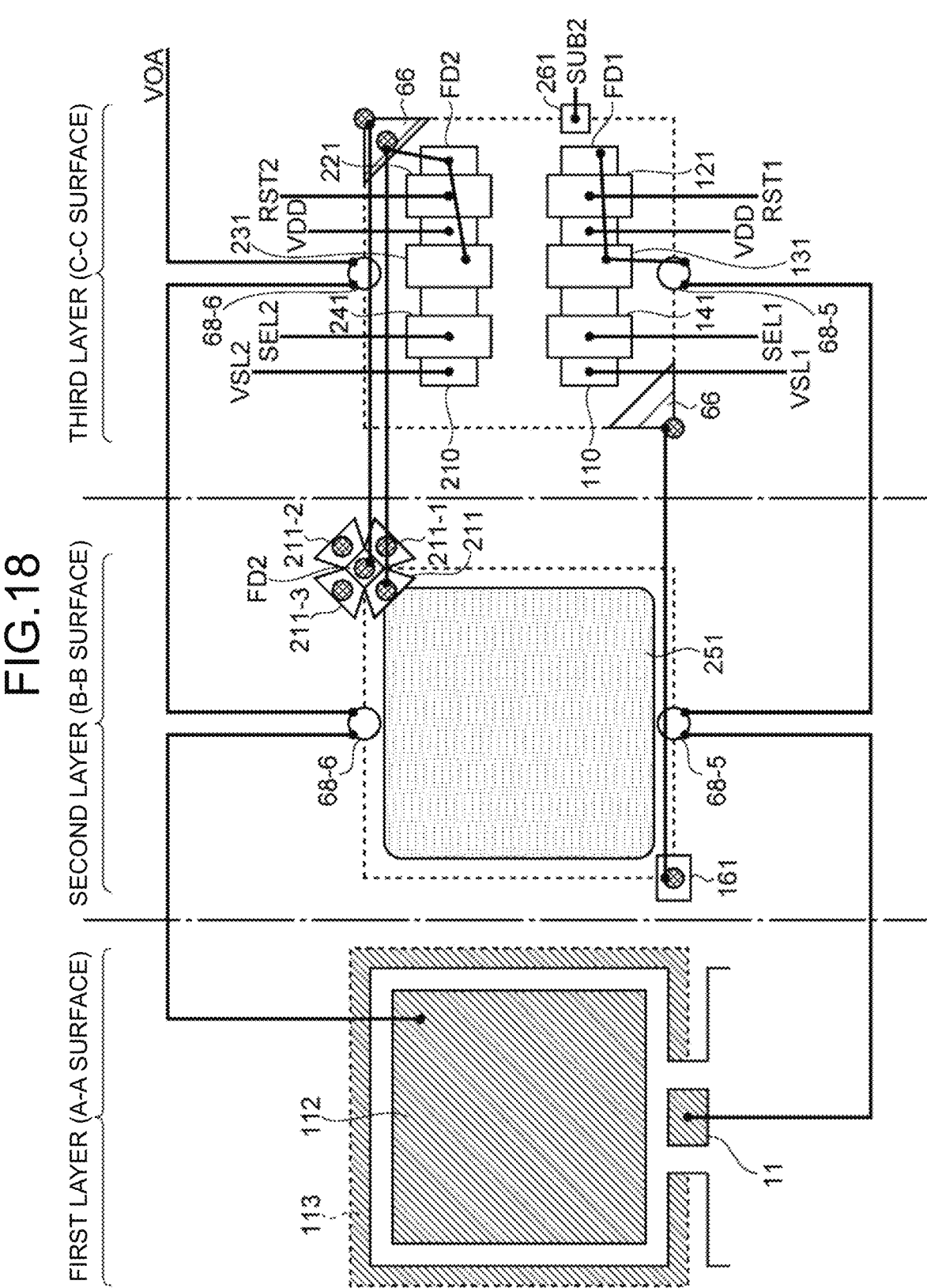
FIG. 18 is a layout diagram illustrating a schematic layout example of each layer of a pixel according to a ninth modification example of the first embodiment of the present disclosure.

FIG. 18 is a layout diagram illustrating a schematic layout example of each layer of a pixel according to a ninth modification example.

Similarly to the eighth modification example, the ninth modification example has a configuration in which the floating diffusion region FD2 of the second layer is shared between adjacent pixels in the combination of the variation #8 in Table 1 and the variation #1 in Table 2. However, in the ninth modification example, the floating diffusion region FD2 and the transfer transistor 21 are disposed at one corner of the pixel region, and one floating diffusion region FD2 is shared by four second pixels 20 facing this corner. In FIG. 18, gate electrodes 211 and 211-1 to 211-3 are gate electrodes of the transfer transistors 21 in the four second pixels 20 disposed in two rows and two columns.

As described above, by increasing the number of the second pixels 20 that share the floating diffusion region FD2 and the pixel circuits (the reset transistor 22, the amplification transistor 23, and the selection transistor 24) connected thereto, the number of pixel transistors to be provided can be further reduced, so that it is possible to further curb deterioration in image quality due to deterioration in saturation electric charge amount characteristics, deterioration in noise characteristics, or the like.

1.9.10 Tenth Modification Example

As described in the first embodiment, as a structure of the pixel isolation portion that partitions the semiconductor substrate 60 into individual pixel regions, there are an FTI structure that penetrates through the front and back surfaces of the semiconductor substrate 60, a DTI structure formed from the back surface or the front surface of the semiconductor substrate 60 to the vicinity of the middle of the semiconductor substrate 60, and the like. Here, in a structure in which the element formation surface of the semiconductor substrate 60 is divided for each pixel region by the pixel isolation portion (for example, an FTI structure, or a DTI structure formed from the surface of the semiconductor substrate 60), the floating diffusion region FD2 cannot be shared between adjacent pixels on the element formation surface of the semiconductor substrate 60. Therefore, in a tenth modification example, a case where the floating diffusion region FD2 is shared between adjacent pixels in a structure in which the element formation surface of the semiconductor substrate 60 is divided for each pixel region by the pixel isolation portion will be described.

Figure 19:
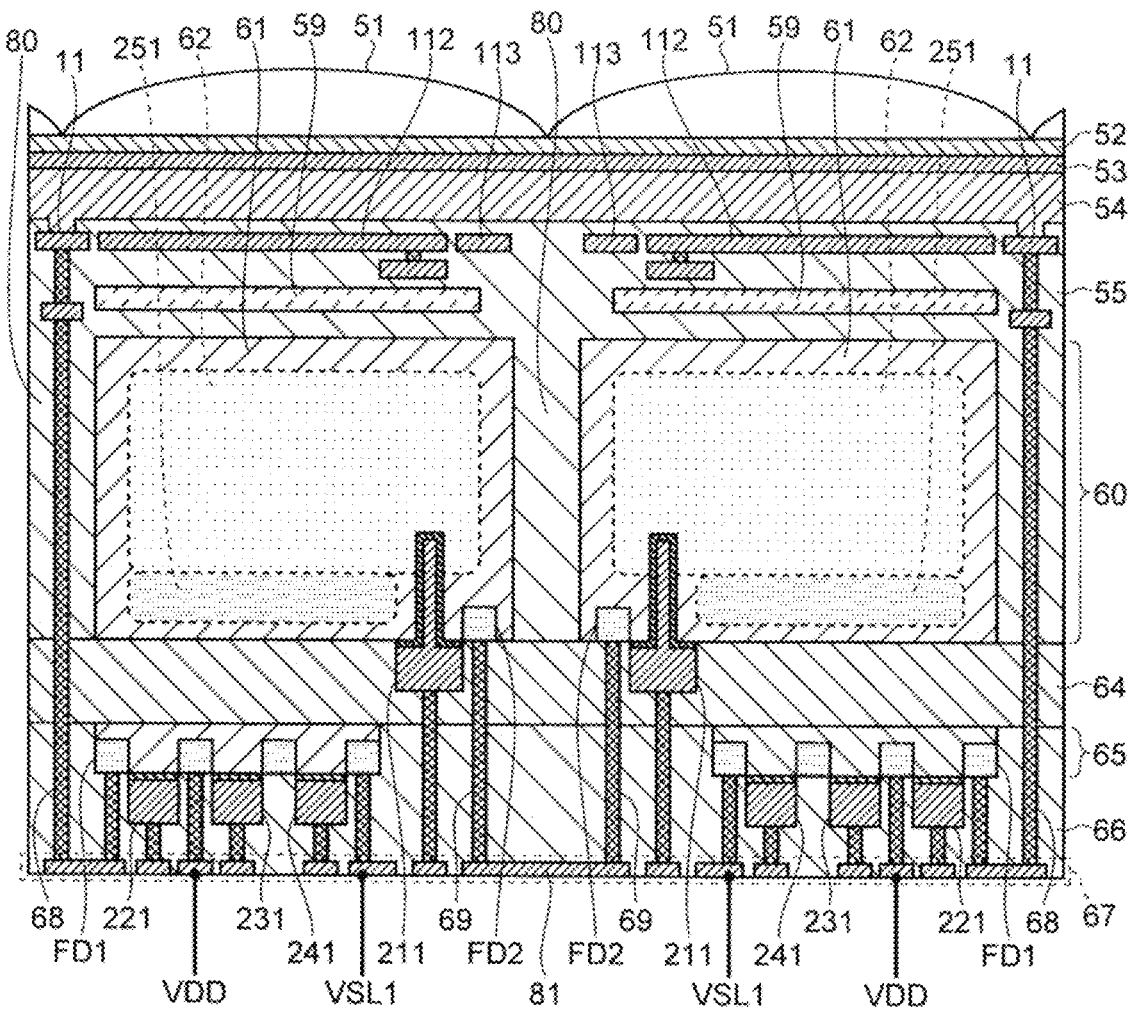
FIG. 19 is a sectional view illustrating a sectional structure example of a pixel according to a tenth modification example of the first embodiment of the present disclosure.

FIG. 19 is a sectional view illustrating a sectional structure example of a pixel according to a tenth example.

As illustrated in FIG. 19, when the element formation surface (lower surface side in the drawing) of the semiconductor substrate 60 is divided for each pixel region by a pixel isolation portion 80, the floating diffusion region FD2 of the second layer of each adjacent pixel may be electrically extended to the wiring layer 67 or more layers by the through-electrode 69, and electrically connected via a wiring 81 in the wiring layer 67 or a separately provided conductor layer.

Note that the pixel isolation portion 80 having the FTI structure is illustrated in FIG. 19, but the present invention is not limited thereto, and the pixel isolation portion 80 may have a DTI structure or the like formed from the surface of the semiconductor substrate 60. A fixed charge film may be provided on a contact surface between the pixel isolation portion 80 and the semiconductor substrate 60. As a material of the pixel isolation portion 80, a reflective material such as tungsten (W) or a light shielding material may be used in addition to an insulating material. In this case, in a case where a conductor is used as the material of the pixel isolation portion 80, an insulating layer or a fixed charge film may be provided on a contact surface between the pixel isolation portion 80 and the semiconductor substrate 60 in order to avoid a short circuit between the pixel isolation portion 80 and the semiconductor substrate 60.

1.9.11 Eleventh Modification Example

In the first embodiment or the first modification example to the tenth modification example described above, the stacked image sensor 100 in which the first pixel 10 in which the photoelectric conversion layer 54 including the organic layer is the photoelectric conversion portion PD1 and the second pixel 20 in which a part of the semiconductor substrate 60 is the photoelectric conversion portion PD2 are stacked has been exemplified. In contrast, in the eleventh modification example, the second pixel 20 is omitted, and the color filter 59 is disposed for the first pixel 10, so that a color image of three primary colors of RGB is acquired.

Figure 20:
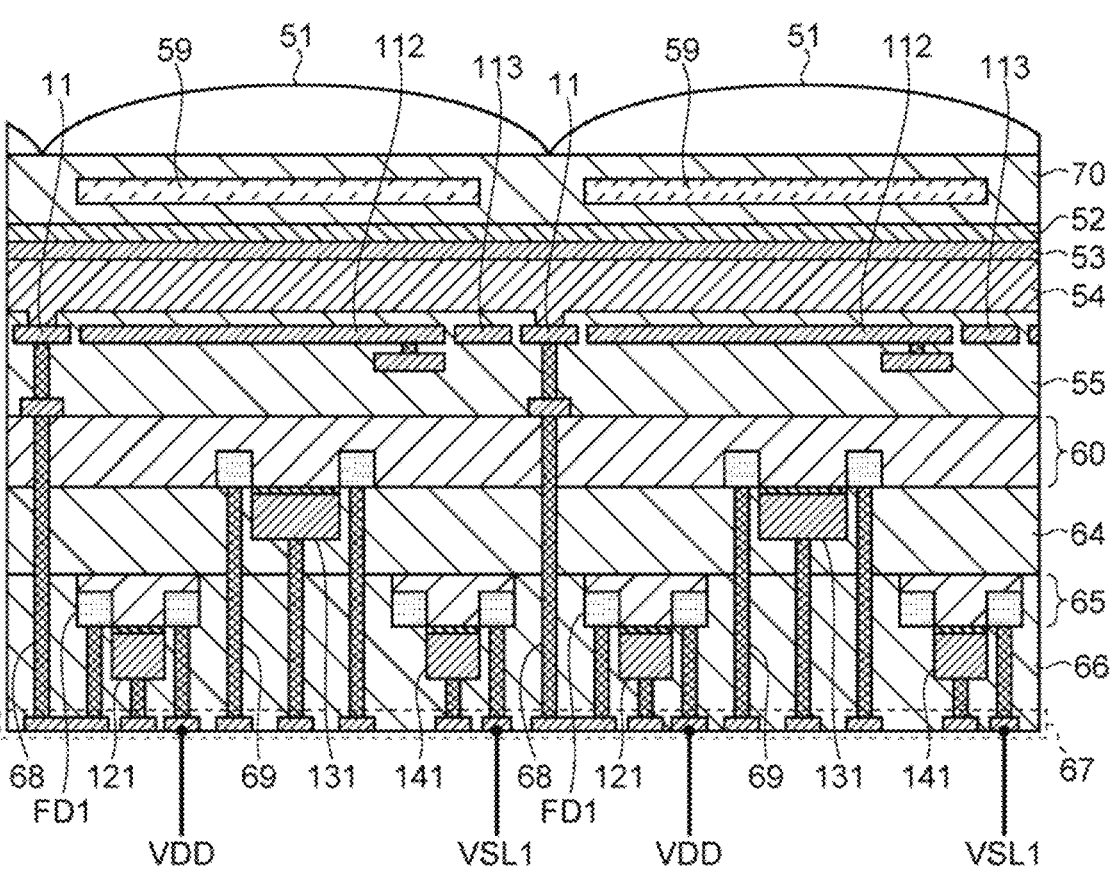
FIG. 20 is a sectional view illustrating a sectional structure example of a pixel according to an eleventh modification example of the first embodiment of the present disclosure.

FIG. 20 is a sectional view illustrating a sectional structure example of a pixel according to an eleventh modification example.

As illustrated in FIG. 20, in the eleventh modification example, the photoelectric conversion portion PD2 and the transfer transistor 21 are omitted, so that the semiconductor substrate 60 is thinned, and the color filters 59 through which wavelength components of red (R), green (G), and blue (B) are respectively transmitted are disposed in the planarized film 70 added on the sealing film 52. Among the pixel transistors of the first pixel 10, the reset transistor 12 and the selection transistor 14 are disposed in the third layer, and the amplification transistor 13 is disposed in the second layer.

As described above, by disposing the amplification transistor 13 in a layer different from other pixel transistors, the size of the amplification transistor 13 can be further increased, so that deterioration in noise characteristics can be further curbed. Since the sizes of other pixel transistors can also be increased, it is also possible to achieve improvement in circuit characteristics. Since a wiring length from the photoelectric conversion portion PD1 to the amplification transistor 13 can be reduced, the conversion efficiency can be improved.

Note that, in FIG. 20, a case where the amplification transistor 13 is disposed in the second layer and other pixel transistors are disposed in the third layer has been exemplified, but the present invention is not limited thereto, and various modifications may be made such that the amplification transistor 13 is disposed in the third layer and other pixel transistors are disposed in the second layer.

1.9.12 Summary of Modification Examples

Although the modification examples based on the structures picked up from the variations illustrated in Tables 1 and 2 have been described above, modification examples of the present embodiment are not limited thereto. For example, the first embodiment and two or more selected from among the modification examples described above may be combined and implemented.

2. Second Embodiment

In the second embodiment, a method of manufacturing the photodetection device (image sensor) 100 described in the first embodiment or the modification examples thereof will be described. Note that, in the following description, a method of manufacturing the pixel 101 (see FIGS. 10 and 11) described as the third modification example of the first embodiment will be described as an example.

FIGS. 21 to 30 are process sectional views illustrating an example of the manufacturing method according to the present embodiment.

Figure 21:
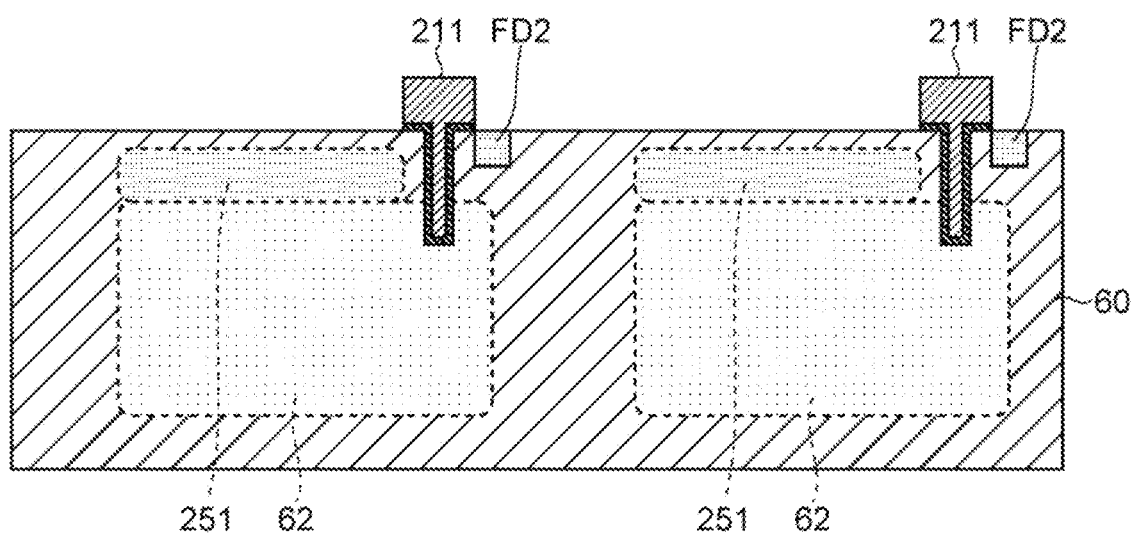
FIG. 21 is a process sectional view illustrating an example of a manufacturing method according to a second embodiment of the present disclosure (part 1).

In the present manufacturing method, first, as illustrated in FIG. 21, for example, a predetermined dopant is ion-implanted with predetermined energy from the element formation surface of the semiconductor substrate 60 having p-type conductivity, thereby forming the n-type semiconductor region 62 configuring the photoelectric conversion portion PD2, the charge storage region 251, and various well regions in the semiconductor substrate 60.

Subsequently, for example, the transfer transistor 21 (the gate electrode 211 and the gate insulating film thereof) which is a vertical transistor reaching the n-type semiconductor region 62 is formed on the element formation surface of the semiconductor substrate 60 through a normal element formation process. By ion-implanting a predetermined dopant with predetermined energy into a region to be a drain of the transfer transistor 21, a part of the floating diffusion region FD2 also functioning as a drain of the transfer transistor 21 is formed.

Figure 22:
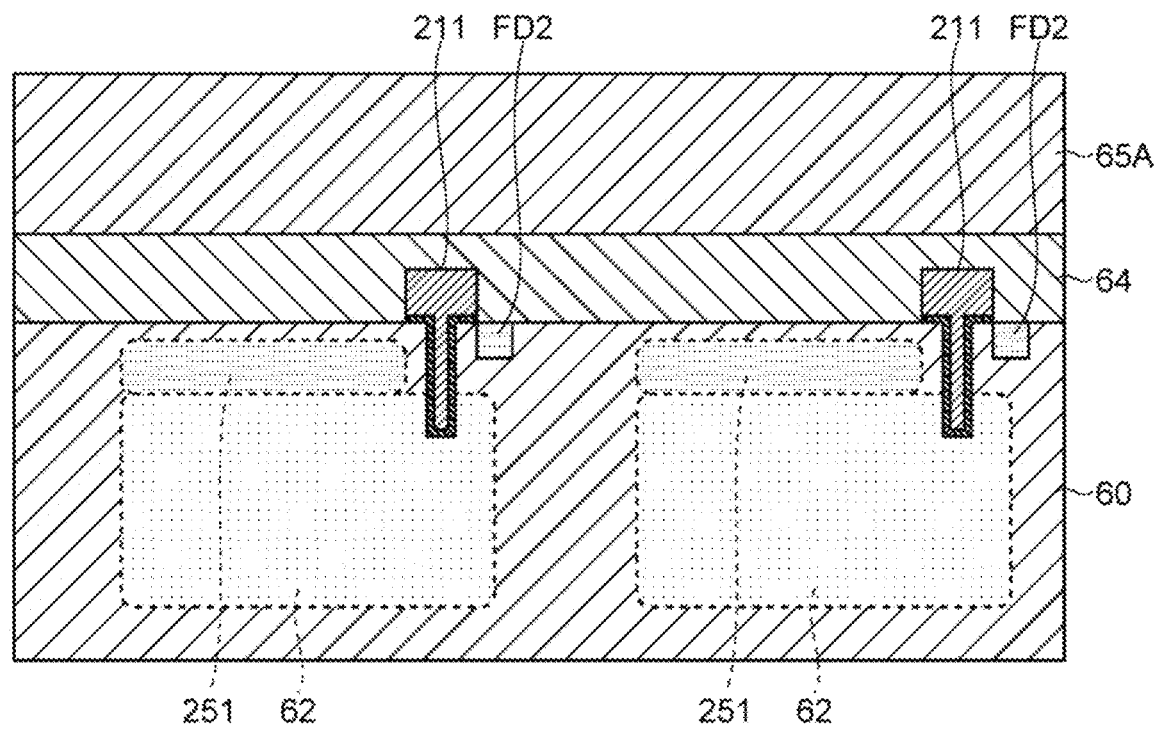
FIG. 22 is a process sectional view illustrating an example of a manufacturing method according to the second embodiment of the present disclosure (part 2).

Next, as illustrated in FIG. 22, the insulating layer 64 covering the element forming surface of the semiconductor substrate 60 and a semiconductor layer 65A on the insulating layer 64 are sequentially formed by using a film forming technique such as a chemical vapor deposition (CVD) method or sputtering.

Figure 23:
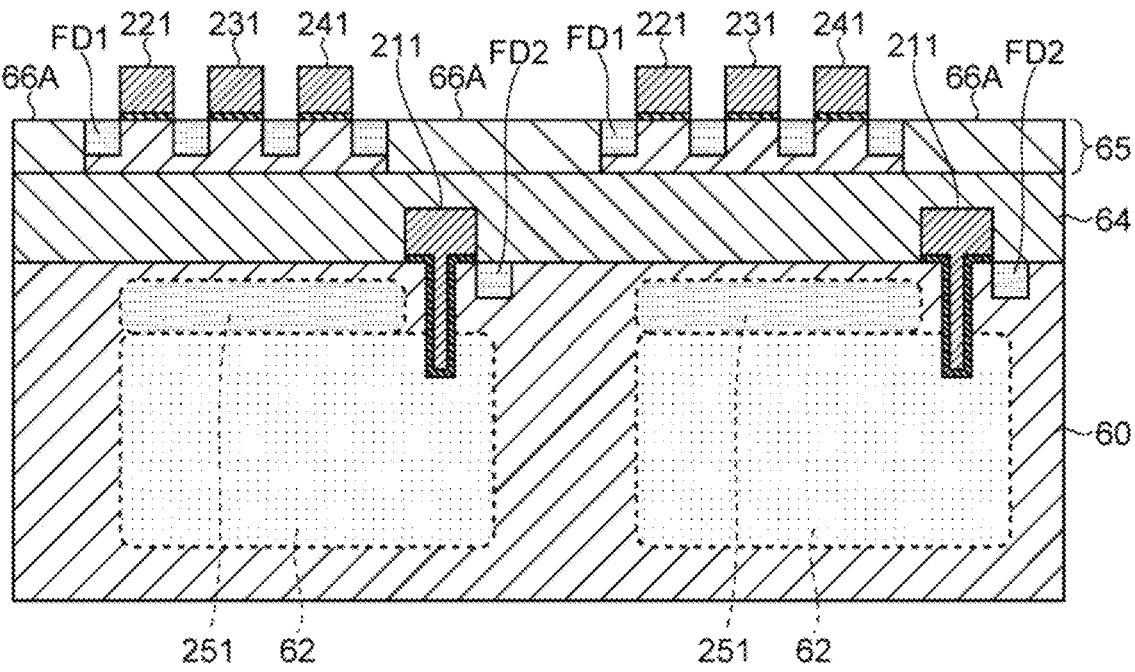
FIG. 23 is a process sectional view illustrating an example of a manufacturing method according to the second embodiment of the present disclosure (part 3).

Next, as illustrated in FIG. 23, the semiconductor layer 65A is thinned by using, for example, chemical mechanical polishing (CMP) or the like. Subsequently, the thinned semiconductor layer 65A is processed into the island-shaped semiconductor layer 65 for each pixel 101 by using, for example, a lithography technique. Subsequently, for example, the pixel transistors (the reset transistors 12 and 22, the amplification transistors 13 and 23, the selection transistors 14 and 24, and the like) of the first pixel 10 and the second pixel 20, the floating diffusion region FD1, and the remaining floating diffusion region FD2 are formed on the upper surface (element formation surface) of the processed semiconductor layer 65 through a normal element formation process.

Figure 24:
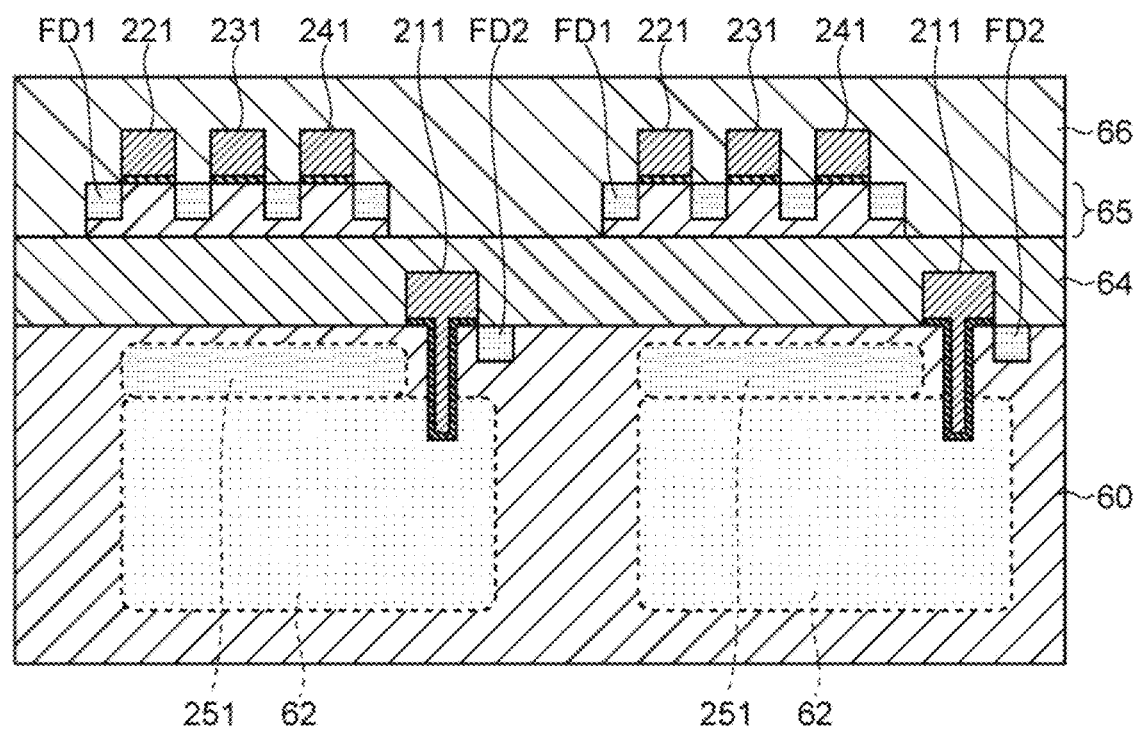
FIG. 24 is a process sectional view illustrating an example of a manufacturing method according to the second embodiment of the present disclosure (part 4).

Next, as illustrated in FIG. 24, the interlayer insulating film 66 covering the insulating layer 64 and the semiconductor layer 65 is formed by using a film forming technique such as a CVD method or sputtering. Note that the upper surface of the interlayer insulating film 66 may be planarized by, for example, CMP.

Figure 25:
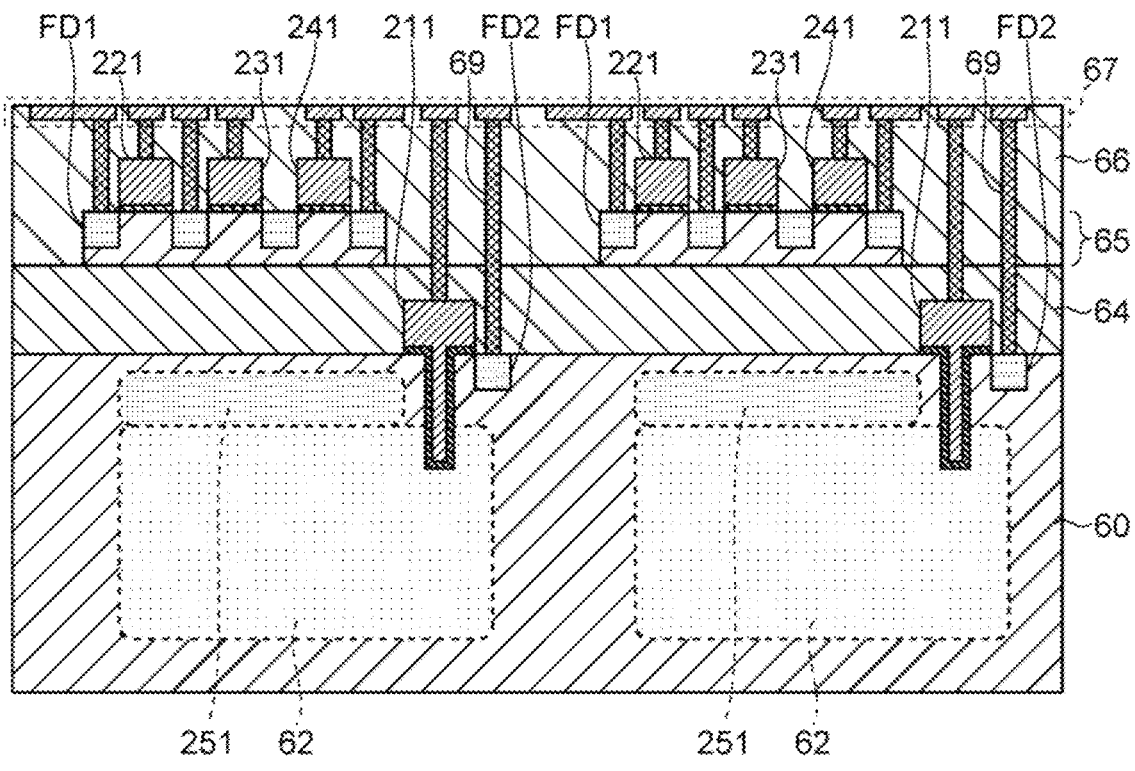
FIG. 25 is a process sectional view illustrating an example of a manufacturing method according to the second embodiment of the present disclosure (part 5).

Next, as illustrated in FIG. 25, a via wiring (including the through-electrode 69) connected to the gate electrode and the source/drain of the pixel transistor is formed in the interlayer insulating film 66 and the insulating layer 64 by using, for example, a lithography technique and a film forming technique such as a CVD method or sputtering. Subsequently, the wiring layer 67 connected to each via wiring (including the through-electrode 69) is formed on the interlayer insulating film 66.

Figure 26:
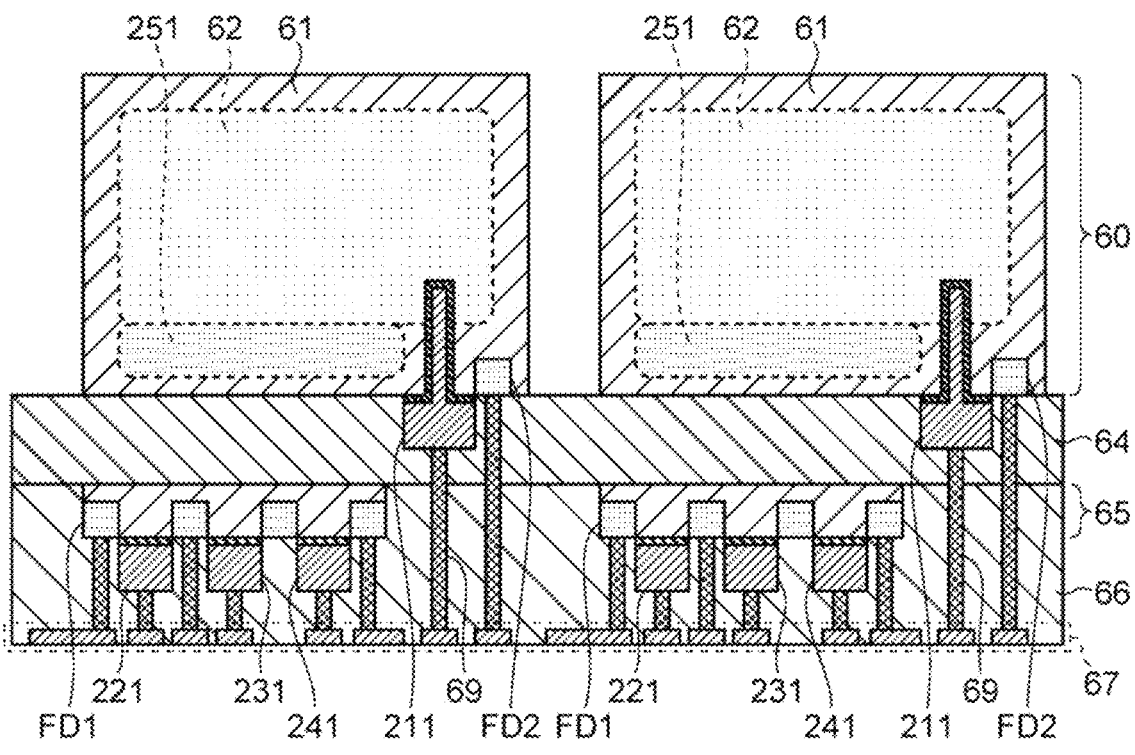
FIG. 26 is a process sectional view illustrating an example of a manufacturing method according to the second embodiment of the present disclosure (part 6).

Next, as illustrated in FIG. 26, after the semiconductor substrate 60 is turned upside down, the semiconductor substrate 60 is carved from the back surface side by using, for example, a lithography technique, thereby forming a trench that functions as a pixel isolation portion that isolates adjacent pixels from each other. Note that the p-type semiconductor region 61 is defined in this step.

Figure 27:
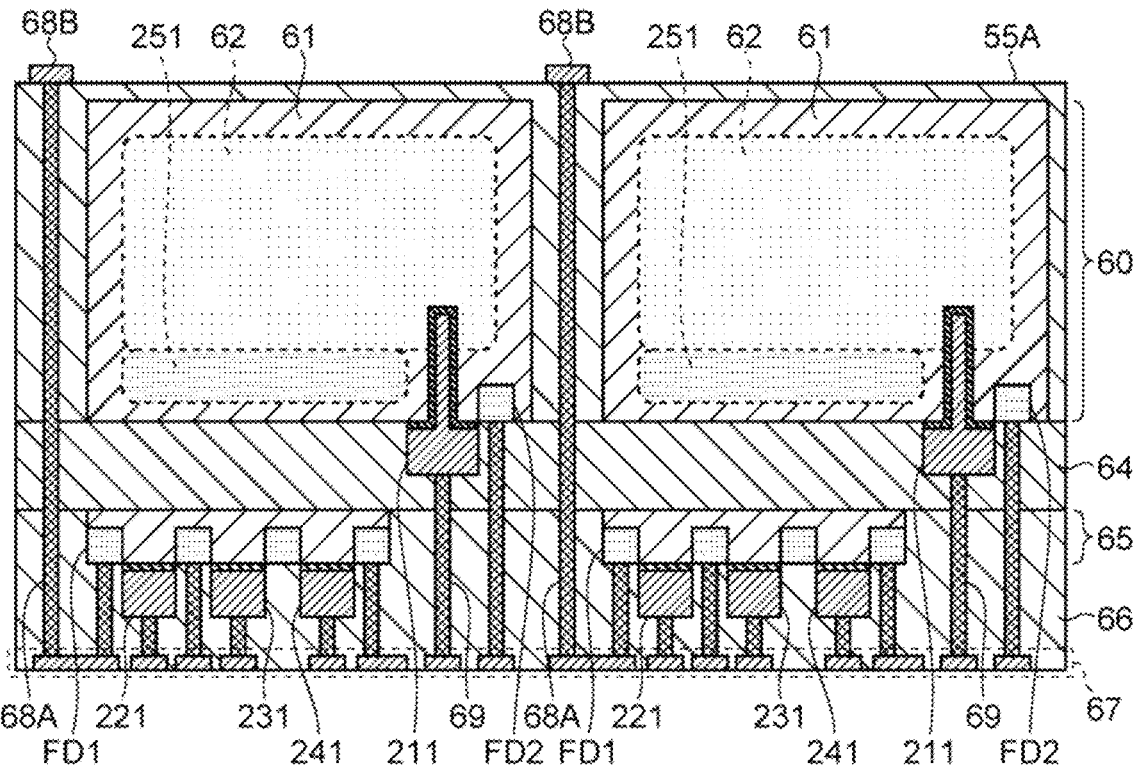
FIG. 27 is a process sectional view illustrating an example of a manufacturing method according to the second embodiment of the present disclosure (part 7).

Next, as illustrated in FIG. 27, an insulating layer 55A that fills the inside of the trench and covers the back surface of the semiconductor substrate 60 is formed by using a film forming technique such as a CVD method or sputtering. Subsequently, a through-hole reaching the wiring layer 67 in the interlayer insulating film 66 from the upper surface of the insulating layer 55A is formed by using, for example, a lithography technique. Subsequently, a through-electrode 68A is formed in the formed through-hole by using a film forming technique such as a CVD method or sputtering. The through-electrode 68A may be a part of the through-electrode 68. Thereafter, an electrode pad 68B connected to the through-electrode 68A is formed on the insulating layer 55A by using, for example, a lift-off method.

Figure 28:
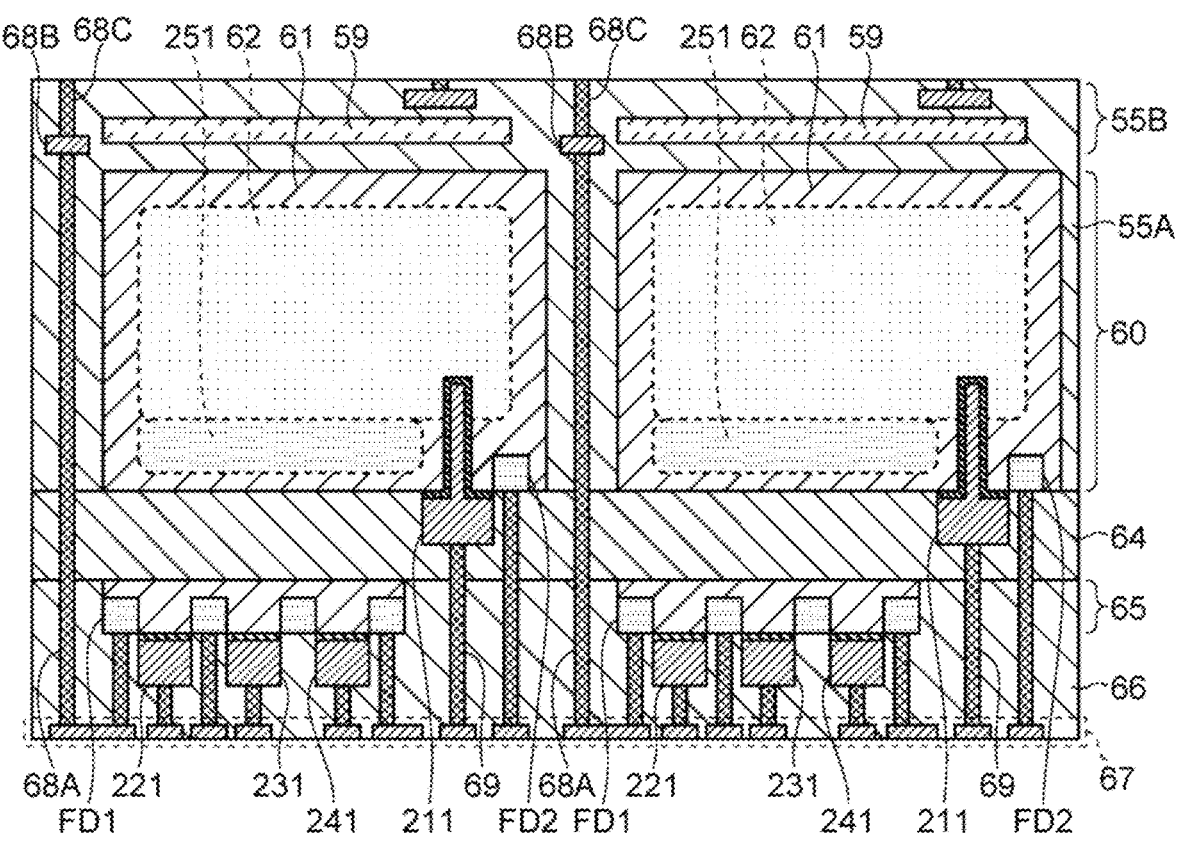
FIG. 28 is a process sectional view illustrating an example of a manufacturing method according to the second embodiment of the present disclosure (part 8).

Next, as illustrated in FIG. 28, an insulating layer 55B including a wiring connected to the color filter 59, the storage electrode 112, and the shield electrode 113 is formed therein by using, for example, a lithography technique and a film forming technique such as a CVD method or sputtering.

Figure 29:
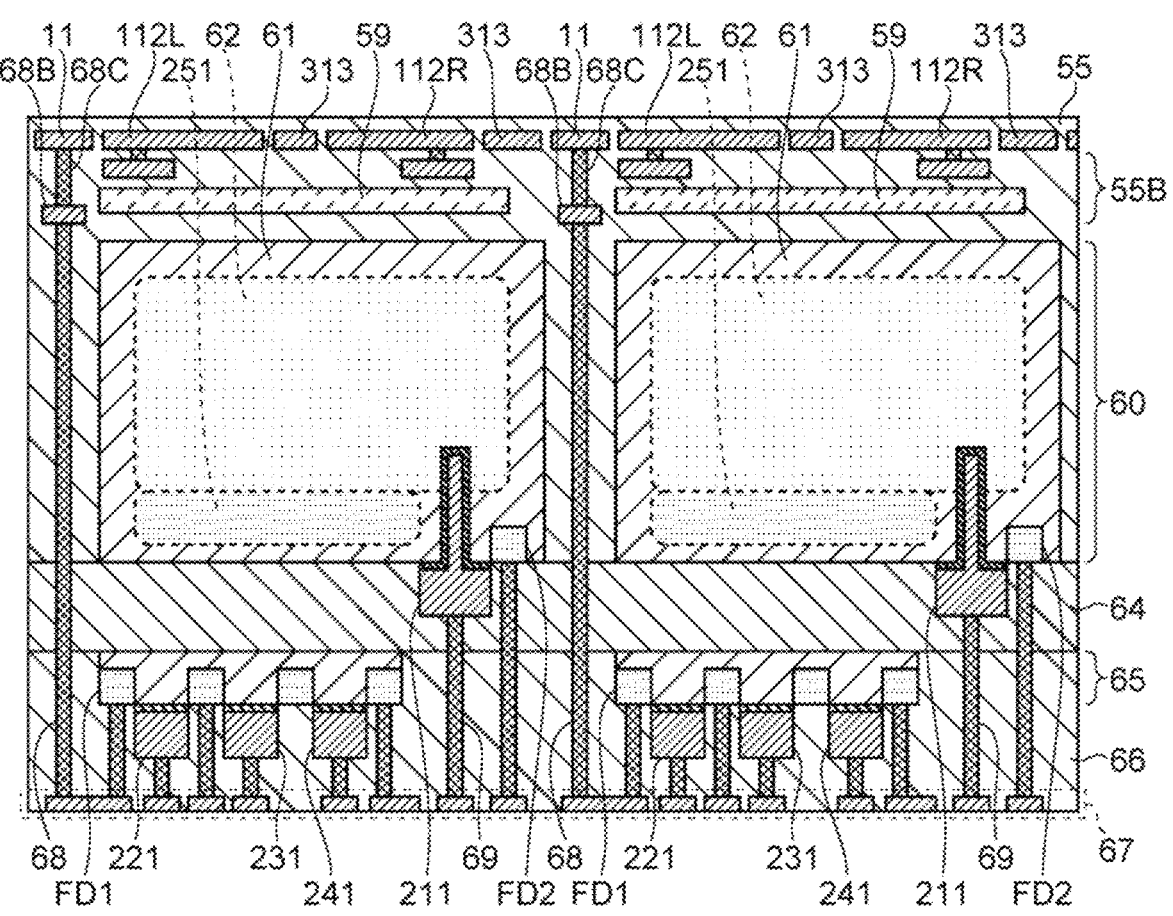
FIG. 29 is a process sectional view illustrating an example of a manufacturing method according to the second embodiment of the present disclosure (part 9).
Figure 30:
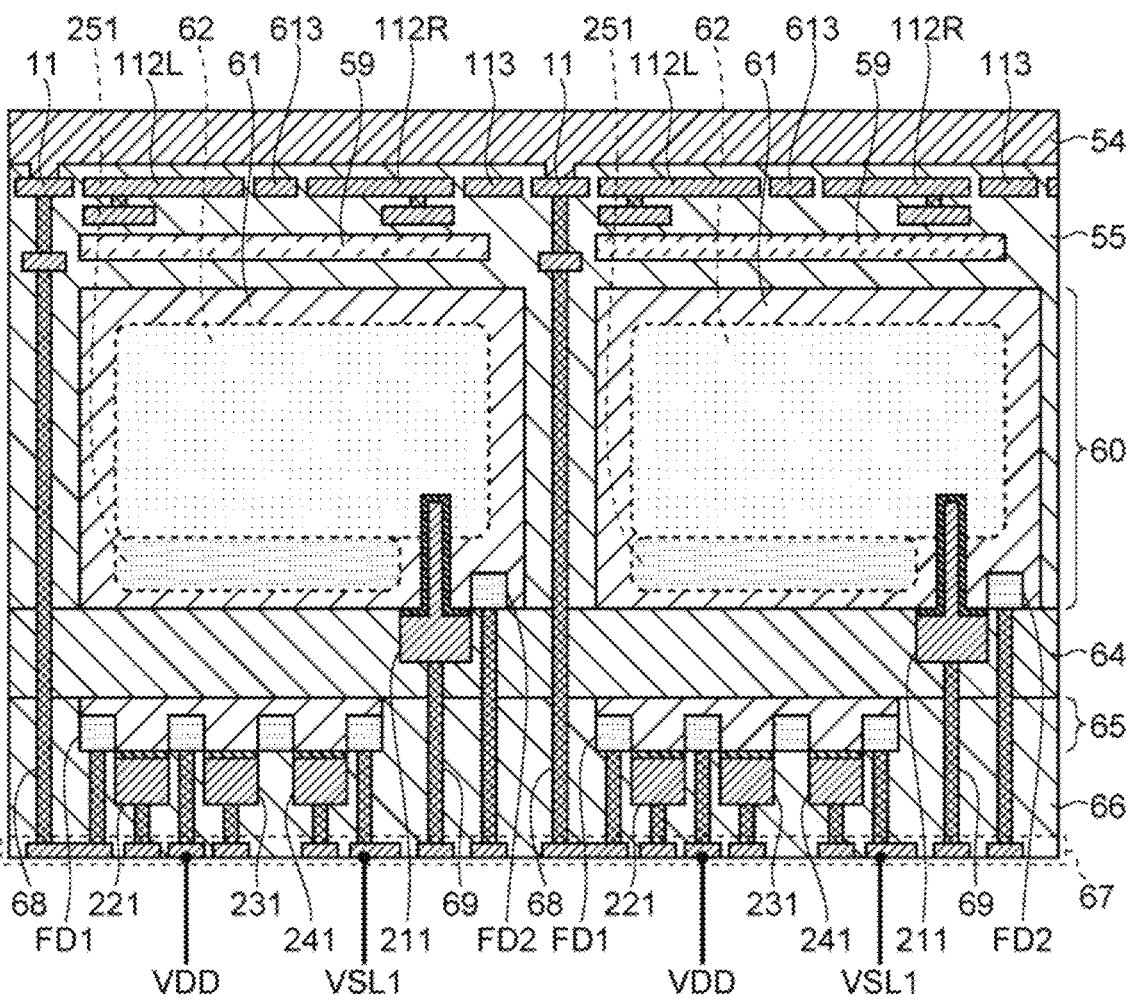
FIG. 30 is a process sectional view illustrating an example of a manufacturing method according to the second embodiment of the present disclosure (part 10).

Next, as illustrated in FIG. 29, for example, a through-electrode 68C reaching the electrode pad 68B is formed in the insulating layer 55B by using, for example, a lithography technique and a film forming technique such as a CVD method or sputtering, and then the insulating layer 55B including a wiring connected to the color filter 59, the storage electrode 112, and the shield electrode 113 is formed therein. Subsequently, the read electrode 11, the storage electrodes 112L and 112R, and the shield electrode 313 are formed on the insulating layer 55B by using, for example, a lift-off method. Subsequently, the insulating layer 55 is formed by depositing an insulating material on the insulating layer 55B by using a film forming technique such as a CVD method or sputtering.

Next, a trench for exposing a part of the read electrode 11 is formed in the insulating layer 55 by using, for example, a lithography technique, and thereafter, the photoelectric conversion layer 54 connected to the read electrode 11 is formed on the insulating layer 55 by using a film forming technique such as a CVD method or sputtering.

Thereafter, the transparent electrode 53, the sealing film 52, and the on-chip lens 51 are sequentially formed on the photoelectric conversion layer 54, thereby forming the pixel 101 having the sectional structure illustrated in FIG. 10.

3. Third Embodiment

Figure 31:
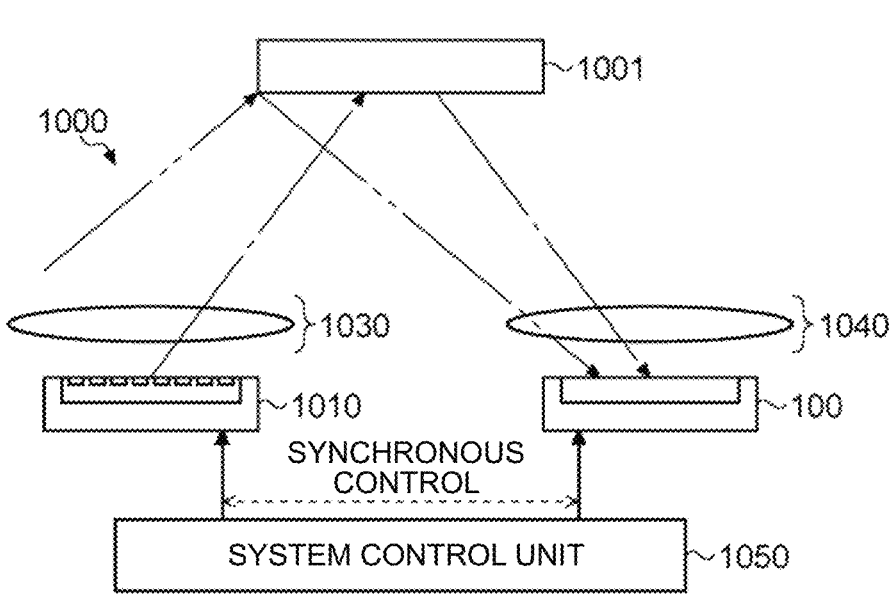
FIG. 31 is a schematic diagram illustrating an example of an overall configuration of a photodetection system according to a third embodiment of the present disclosure.
Figure 32:
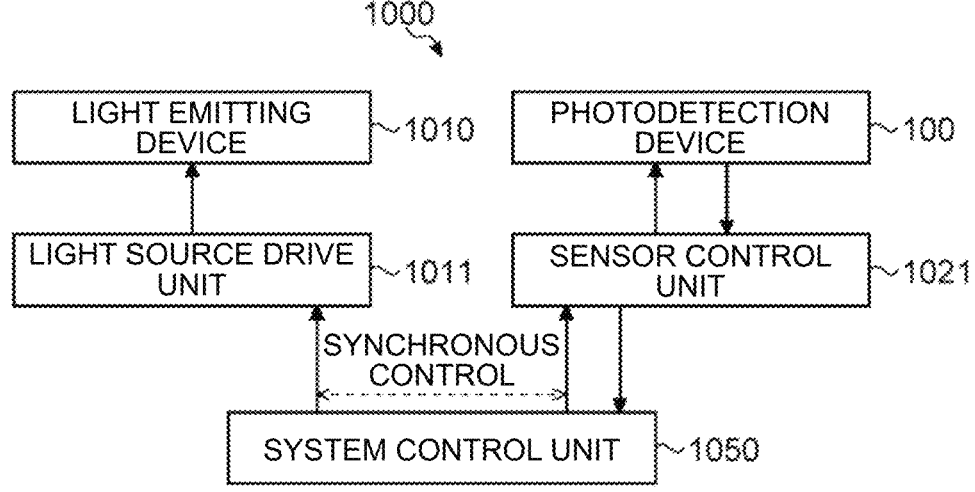
FIG. 32 is a block diagram illustrating an example of a functional configuration of the photodetection system according to the third embodiment of the present disclosure.

In a third embodiment, an example of a photodetection system using the photodetection device 100 according to the above-described embodiment or modification examples thereof will be described. FIG. 31 is a schematic diagram illustrating an example of an overall configuration of the photodetection system according to the present embodiment. FIG. 32 is a block diagram illustrating an example of a functional configuration of the photodetection system according to the present embodiment.

As illustrated in FIGS. 31 and 32, a photodetection system 1000 includes a light emitting device 1010 as a light source unit that emits infrared light L2 and a photodetection device 100 as a light receiving unit having a photoelectric conversion element. The photodetection device 100 may be the photodetection device 100 according to the above-described embodiment or modification examples thereof. The photodetection system 1000 may further include a system control unit 1050, a light source drive unit 1011, a sensor control unit 1021, a light source side optical system 1030, and a sensor side optical system 1040.

The photodetection device 100 can detect light L1 and light L2. The light L1 is light obtained by reflecting ambient light from the outside on a subject (measurement target) 1001 (FIG. 31). Light L2 is light emitted from the light emitting device 1010 and then reflected by the subject 1001. The light L1 is, for example, visible light, and the light L2 is, for example, infrared light. The light L1 can be detected by the organic photoelectric conversion portion in the photodetection device 100, and the light L2 can be detected by the photoelectric conversion portion in the photodetection device 100. Image information of the subject 1001 may be obtained from the light L1, and distance information between the subject 1001 and the photodetection system 1000 may be obtained from the light L2.

The photodetection system 1000 may be mounted on, for example, an electronic apparatus such as a smartphone or a mobile object such as a car. The light emitting device 1010 may include, for example, a semiconductor laser, a surface emitting semiconductor laser, or a vertical cavity surface emitting laser (VCSEL).

As a method in which the photodetection device 100 detects the light L2 emitted from the light emitting device 1010, for example, an iTOF method may be employed, but the present invention is not limited thereto. In the iTOF method, the photoelectric conversion portion can measure a distance to the subject 1001 according to, for example, time-of-flight (TOF).

As a method in which the photodetection device 100 detects the light L2 emitted from the light emitting device 1010, for example, a structured light method or a stereo vision method may also be employed. For example, in the structured light method, light of a predetermined pattern is projected onto the subject 1001, and the degree of distortion of the pattern is analyzed, whereby a distance between the photodetection system 1000 and the subject 1001 can be measured. In the stereo vision system, for example, two or more cameras are used to acquire two or more images of the subject 1001 viewed from two or more different viewpoints, whereby a distance between the photodetection system 1000 and the object can be measured. Note that the light emitting device 1010 and the photodetection device 100 can be synchronously controlled by the system control unit 1050.

4. Fourth Embodiment

Figure 33:
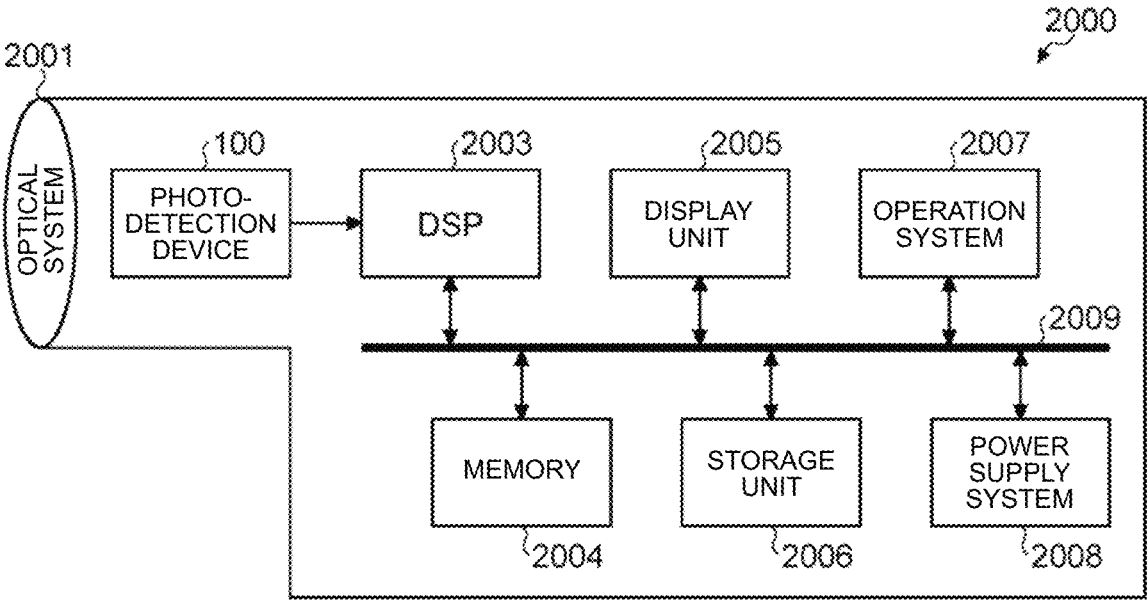
FIG. 33 is a schematic diagram illustrating an example of an electronic apparatus according to a fourth embodiment of the present disclosure.

Therefore, in a fourth embodiment, an example of an electronic apparatus using the photodetection device 100 according to the above-described embodiment or modification examples thereof will be described. FIG. 33 is a schematic diagram illustrating an example of an electronic apparatus according to the present embodiment.

As illustrated in FIG. 33, an electronic apparatus 2000 includes an optical system 2001, a photodetection device 100, and a digital signal processor (DSP) 2003, has a configuration in which the DSP 2003, a display unit 2005, an operation system 2007, a memory 2004, a storage unit 2006, and a power supply system 2008 are connected via a bus 2009, and can capture a still image and a moving image.

The optical system 2001 includes one or a plurality of lenses, guides image light (incident light) from a subject to the photodetection device 100, and forms an image on a light receiving surface (sensor unit) of the photodetection device 100.

The photodetection device 100 may be the photodetection device 100 according to the above-described embodiment or modification examples thereof. In the photodetection device 100, electrons are stored for a certain period according to an image formed on the light receiving surface via the optical system 2001. A signal corresponding to the electrons stored in the photodetection device 100 is supplied to the DSP 2003.

The DSP 2003 performs various types of signal processing on the signal from the photodetection device 100 to acquire an image, and temporarily stores data of the image in the memory 2004. The data of the image stored in the memory 2004 is stored in the storage unit 2006 or is supplied to the display unit 2005 such that the image is displayed. The operation system 2007 receives various operations performed by a user and supplies an operation signal to each block of the electronic apparatus 2000, and the power supply system 2008 supplies power necessary for driving each block of the electronic apparatus 2000.

5. Application Example to Mobile Object

The technology according to the present disclosure (present technology) can be applied to various products. For example, the technology according to the present disclosure may be realized as a device mounted on any type of mobile object such as an automobile, an electric vehicle, a hybrid electric vehicle, a motorcycle, a bicycle, a personal mobility, an airplane, a drone, a ship, and a robot.

FIG. 34 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 34, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 34, an audio speaker 12061, a display section 12062, and an instrument panel 12063 are illustrated as the output device. The display section 12062 may, for example, include at least one of an on-board display and a head-up display.

Figure 35:
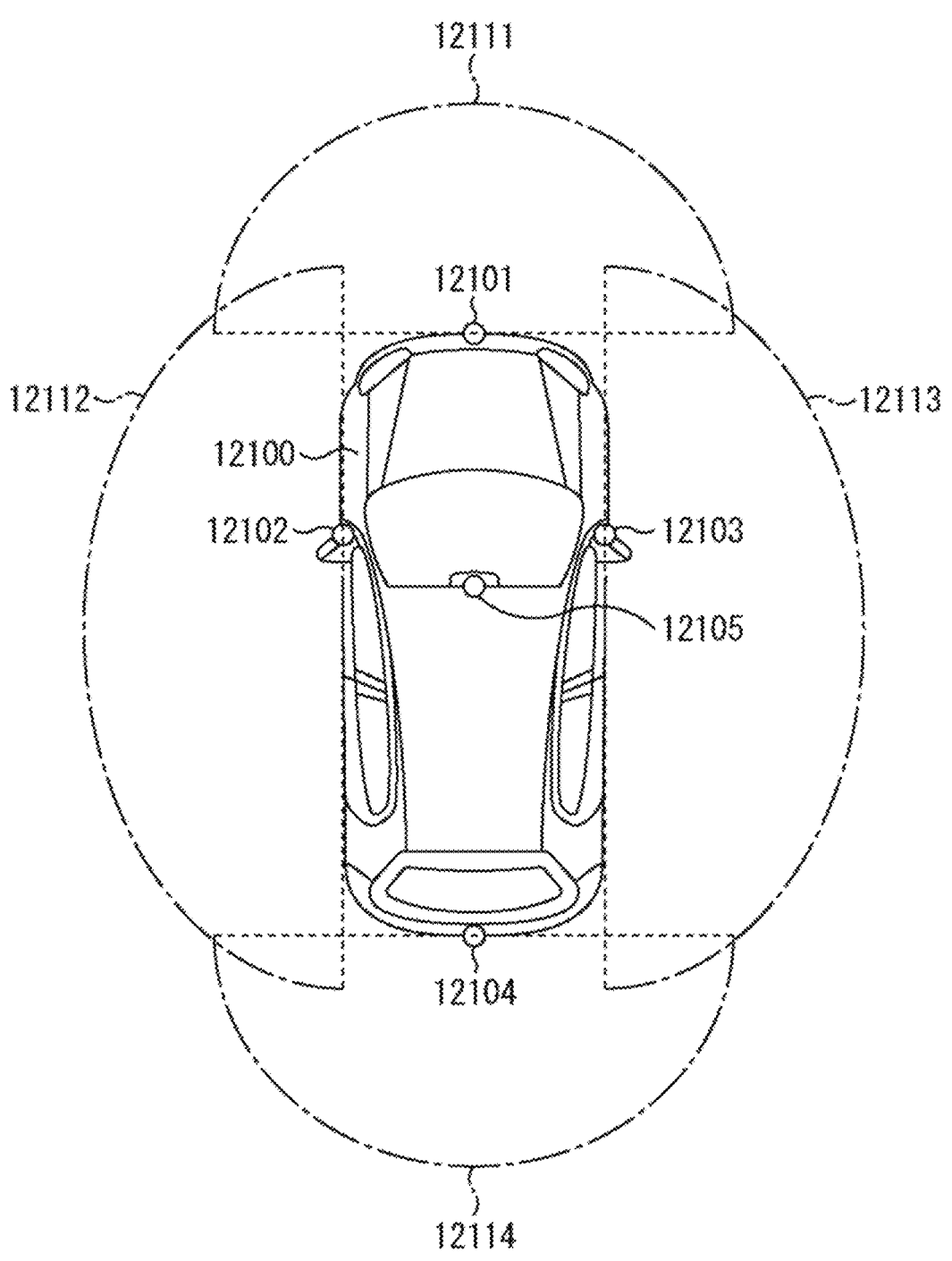
FIG. 35 is a diagram of assistance in explaining an example of installation positions of an outside-vehicle information detecting section and an imaging section.

FIG. 35 is a diagram depicting an example of the installation position of the imaging section 12031.

In FIG. 35, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of a vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 35 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to the imaging section 12031 and the like among the configurations described above. The imaging sections 12101, 12102, 12103, 12104, and 12105, and the like illustrated in FIG. 35 may be mounted on the vehicle 12100. By applying the technology according to the present disclosure to the imaging sections 12101, 12102, 12103, 12104, and 12105, and the like, the sensitivity of the imaging section 12031 can be improved. Therefore, not only a clearer image can be displayed to a driver or the like, but also the accuracy of various types of processing using the image acquired by the imaging section 12031 can be improved.

6. Application Example to Endoscopic Surgery System

The technology according to the present disclosure (present technology) can be applied to various products. For example, the technology according to the present disclosure may be applied to an endoscopic surgery system.

Figure 36:
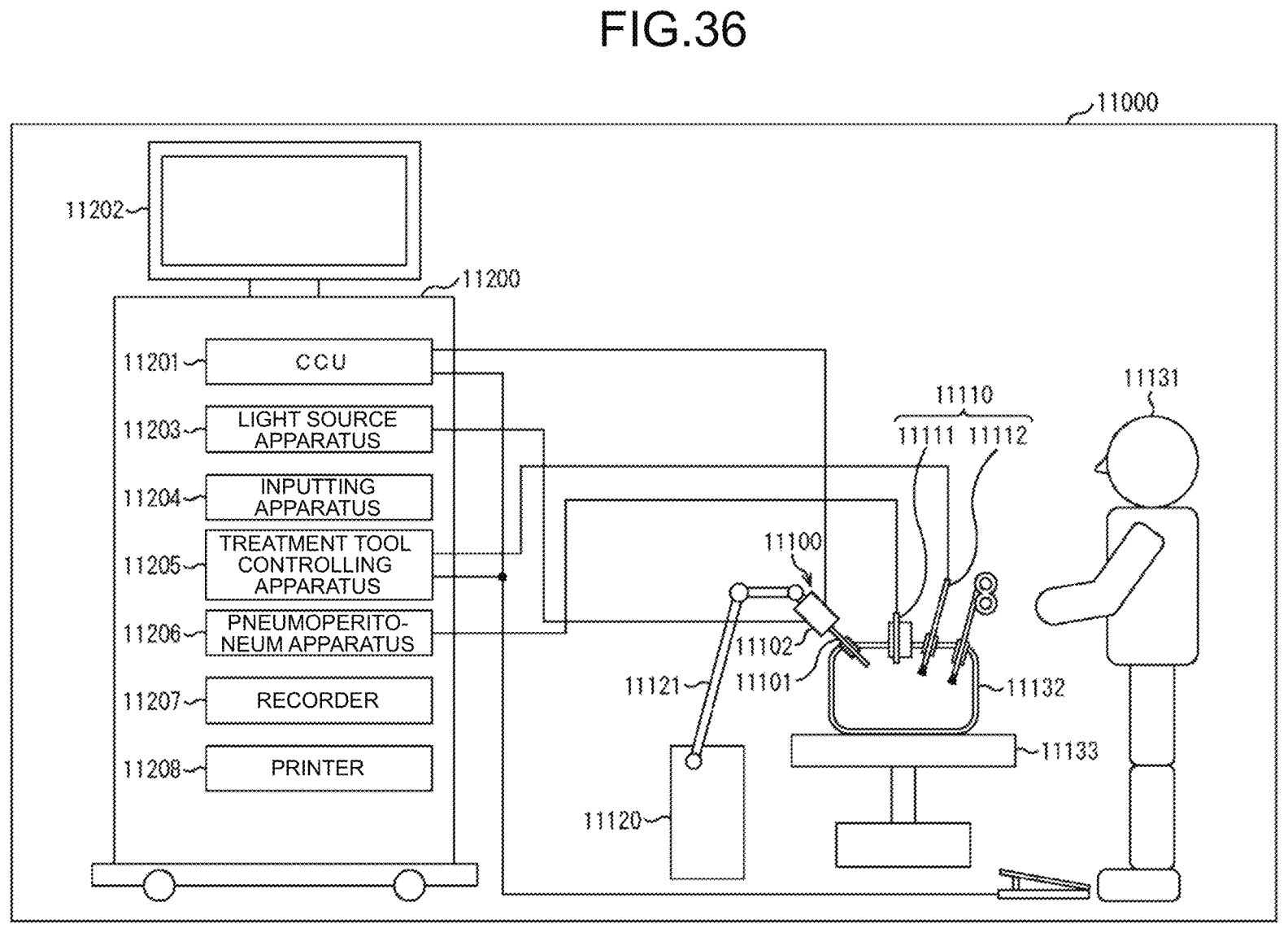

FIG. 36 is a view depicting an example of a schematic configuration of an endoscopic surgery system to which the technology according to an embodiment of the present disclosure (present technology) can be applied.

In FIG. 36, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope

11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 37:
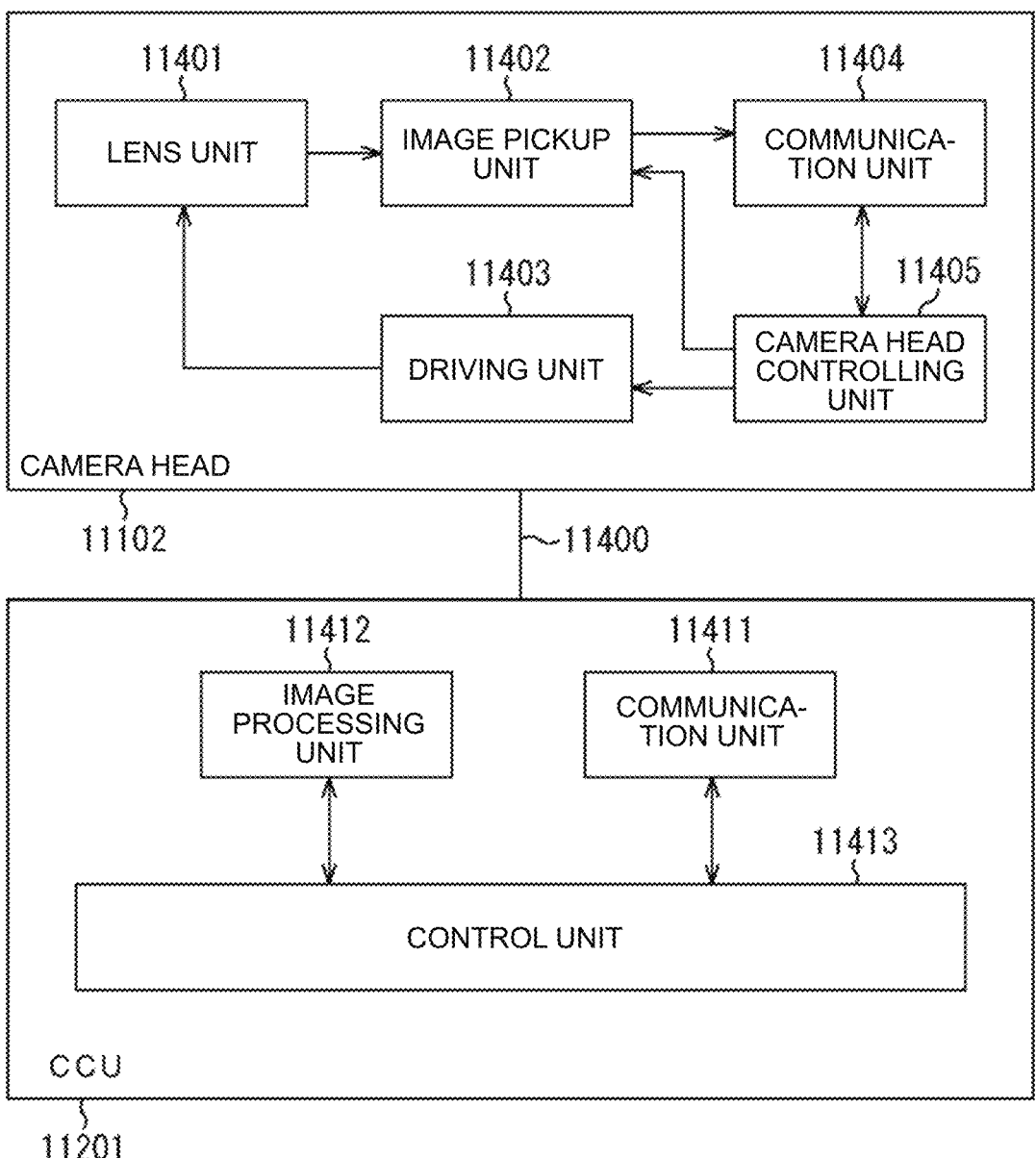
FIG. 37 is a block diagram depicting an example of a functional configuration of a camera head and a camera control unit (CCU).

FIG. 37 is a block diagram depicting an example of a functional configuration of the camera head 11102 and the CCU 11201 depicted in FIG. 36.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described above. The technology according to the present disclosure can be applied to, for example, the endoscope 11100, (the image pickup unit 11402 of) the camera head 11102, and (the image processing unit 11412 of) the CCU 11201, and the like) among the configurations described above. By applying the technology according to the present disclosure to these configurations, it is possible to achieve an effect that a clearer image can be displayed to a surgeon.

Note that, here, the endoscopic surgery system has been described as an example, but the technology according to the present disclosure may be applied to, for example, a microscopic surgery system.

Although the embodiments of the present disclosure have been described above, the technical scope of the present disclosure is not limited to the above-described embodiments as it is, and various modifications can be made without departing from the concept of the present disclosure. Constituents of different embodiments and modification examples may be appropriately combined.

The effects of each embodiment described in the present specification are merely examples and are not limited, and other effects may be provided.

Note that the present technology can also have the following configurations.

(1) A photodetection device comprising:
  a plurality of pixels arranged in a matrix, wherein each of the pixels includes
    a semiconductor substrate having a first surface and a second surface opposed to each other, a first photoelectric conversion portion disposed on the second surface side of the semiconductor substrate,
an insulating layer covering the first surface of the semiconductor substrate, and
at least one pixel transistor located on the first surface side of the semiconductor substrate with the insulating layer interposed therebetween.

(2) The photodetection device according to (1), wherein the at least one pixel transistor is at least one of a first reset transistor that releases electric charge stored in a first floating diffusion region that stores the electric charge flowing out from the first photoelectric conversion portion, a first amplification transistor that generates a voltage signal according to the electric charge stored in the first floating diffusion region, and a first selection transistor that controls output of the voltage signal generated by the first amplification transistor.

(3) The photodetection device according to (2), wherein each of the pixels further includes a first transfer transistor that transfers the electric charge generated in the first photoelectric conversion portion to the first (4) The photodetection device according to (2) or (3), wherein
  each of the pixels further includes a read electrode that causes the electric charge generated in the first photoelectric conversion portion to flow out to the first floating diffusion region.

(5) The photodetection device according to (4), in which the read electrode includes a first read electrode in contact with the first photoelectric conversion portion and a second read electrode in contact with the first photoelectric conversion portion at a position different from the position of the first read electrode.

(6) The photodetection device according to any one of (1) to (5), wherein
  each of the pixels further includes a storage electrode that controls outflow of the electric charge generated in the first photoelectric conversion portion from the first photoelectric conversion portion.

(7) The photodetection device according to (6), wherein each of the pixels further includes a shield electrode disposed in at least a part of a periphery of the storage electrode.

(8) The photodetection device according to (6) or (7), wherein
  the storage electrode includes a first storage electrode disposed at a position facing a first region of the first photoelectric conversion portion and a second storage electrode disposed at a position facing a second region different from the first region.

(9) The photodetection device according to any one of (1) to (8), wherein
  each of the pixels further includes a through-electrode penetrating through at least the semiconductor substrate, and
  the first photoelectric conversion portion is electrically connected to the at least one pixel transistor via the through-electrode.

(10) The photodetection device according to (9), wherein each of the pixels further includes an electrode pad disposed in the insulating layer, and
  the through-electrode is electrically connected to the electrode pad in the insulating layer.

(11) The photodetection device according to (10), in which
the electrode pad is made of a semiconductor material doped with impurities.

(12) The photodetection device according to any one of (9) to (11), further comprising a pixel isolation portion that isolates the pixels from each other, wherein
at least a part of the through-electrode extends in the pixel isolation portion.

(13) The photodetection device according to any one of (1) to (12), wherein
each of the pixels further includes a semiconductor layer located on the first surface side of the semiconductor substrate with the insulating layer interposed therebetween, and
the at least one pixel transistor is disposed in the semiconductor layer.

(14) The photodetection device according to any one of (1) to (13), wherein
the first photoelectric conversion portion includes a photoelectric conversion layer disposed on the second surface side of the semiconductor substrate, and
the photoelectric conversion layer includes a layer made of an organic semiconductor material.

(15) The photodetection device according to any one of (1) to (14), in which
a film thickness of the insulating layer is 4 μm (micrometers) or less.

(16) The photodetection device according to any one of (1) to (15), wherein
each of the pixels further includes a second photoelectric conversion portion disposed in the semiconductor substrate.

(17) The photodetection device according to (16), wherein
the first photoelectric conversion portion and the second photoelectric conversion portion overlap each other in a substrate thickness direction of the semiconductor substrate.

(18) The photodetection device according to (16) or (17), wherein
each of the pixels further includes a charge storage region that is disposed in the semiconductor substrate and stores electric charge generated in the second photoelectric conversion portion.

(19) The photodetection device according to (18), wherein
the at least one pixel transistor is at least one of a first reset transistor that releases electric charge stored in a first floating diffusion region that stores the electric charge flowing out from the first photoelectric conversion portion, a first amplification transistor that generates a voltage signal according to the electric charge stored in the first floating diffusion region, a first selection transistor that controls output of the voltage signal generated by the first amplification transistor, a transfer transistor that transfers the electric charge generated by the second photoelectric conversion portion and stored in the charge storage region to a second floating diffusion region, a second reset transistor that releases electric charge stored in the second floating diffusion region, a second amplification transistor that generates a voltage signal according to the electric charge stored in the second floating diffusion region, and a second selection transistor that controls output of the voltage signal generated by the second amplification transistor.

(20) The photodetection device according to (19), wherein
the second floating diffusion region is shared by two or more pixels adjacent to each other.

(21) The photodetection device according to any one of (16) to (20), wherein
each of the pixels further includes a filter that is disposed on a light incident surface side of the second photoelectric conversion portion and through which at least one of infrared light and near-infrared light is transmitted.

(22) The photodetection device according to (21), in which
each of the pixels further includes an uneven structure provided on a light incident surface of the second photoelectric conversion portion.

(23) An electronic apparatus comprising:
the photodetection device according to (1);
a lens that forms an image of incident light on the photodetection device; and
a processing circuit that executes predetermined processing on a signal output from the photodetection device.

(24) A photodetection system comprising:
the photodetection device according to (1);
a light emitting device that outputs light having a predetermined wavelength; and
a control unit that synchronously controls the photodetection device and the light emitting device.

REFERENCE SIGNS LIST

10 FIRST PIXEL
11, 411 READ ELECTRODE
12, 22 RESET TRANSISTOR
13, 23 AMPLIFICATION TRANSISTOR
14, 24 SELECTION TRANSISTOR
20 SECOND PIXEL
21 TRANSFER TRANSISTOR
41 LIGHT RECEIVING CHIP
42 CIRCUIT CHIP
51 ON-CHIP LENS
52 SEALING FILM
53 TRANSPARENT ELECTRODE
54 PHOTOELECTRIC CONVERSION LAYER
55, 64 INSULATING LAYER
59, 59b, 59r COLOR FILTER
60 SEMICONDUCTOR SUBSTRATE
61 p-TYPE SEMICONDUCTOR REGION
62 n-TYPE SEMICONDUCTOR REGION
65 SEMICONDUCTOR LAYER
66 INTERLAYER INSULATING FILM
67 WIRING LAYER
68, 68-1 to 68-6, 68a, 68b, 69 THROUGH-ELECTRODE
68c ELECTRODE PAD
70 PLANARIZED FILM
80 PIXEL ISOLATION PORTION
81 WIRING
100 PHOTODETECTION DEVICE (IMAGE SENSOR)
101 PIXEL
102 PIXEL ARRAY PORTION
103 VERTICAL DRIVE CIRCUIT
104 COLUMN SIGNAL PROCESSING CIRCUIT
104a AD CONVERSION CIRCUIT
105 HORIZONTAL DRIVE CIRCUIT
106 OUTPUT CIRCUIT
107 DRIVE CONTROL CIRCUIT

108 SIGNAL LINE
109 HORIZONTAL SIGNAL LINE
110, 210 DIFFUSION REGION (SOURCE/DRAIN)
112, 112L, 112R STORAGE ELECTRODE
113, 313 SHIELD ELECTRODE
121, 131, 141, 211, 221, 231, 241, 511 GATE ELEC-
TRODE
211-1 to 211-3 GATE ELECTRODE OF ADJACENT
PIXELS
161, 261 WELL TAP
251 CHARGE STORAGE REGION
759 IR FILTER
761 UNEVEN STRUCTURE
1000 PHOTODETECTION SYSTEM
1010 LIGHT EMITTING DEVICE
1011 LIGHT SOURCE DRIVE UNIT
1021 SENSOR CONTROL UNIT
1030 LIGHT SOURCE SIDE OPTICAL SYSTEM
1040 SENSOR SIDE OPTICAL SYSTEM
1050 SYSTEM CONTROL UNIT
2000 ELECTRONIC APPARATUS
2001 OPTICAL SYSTEM
2003 DSP
2004 MEMORY
2005 DISPLAY UNIT
2006 STORAGE UNIT
2007 OPERATION SYSTEM
2008 POWER SUPPLY SYSTEM
2009 BUS
FD1, FD2 FLOATING DIFFUSION REGION
PD1, PD2 PHOTOELECTRIC CONVERSION POR-
TION
VSL1, VSL2 VERTICAL SIGNAL LINE

The invention claimed is:

1. A photodetection device comprising:
a plurality of pixels arranged in a matrix, wherein
each of the pixels includes
a semiconductor substrate having a first surface and a
second surface opposed to each other,
a first photoelectric conversion portion disposed on the
second surface side of the semiconductor substrate,
an insulating layer covering the first surface of the
semiconductor substrate, and at least one pixel tran-
sistor located on the first surface side of the semi-
conductor
substrate with the insulating layer interposed therebe-
tween, and a semiconductor layer located on the first
surface side of the semiconductor
substrate with the insulating layer interposed therebe-
tween, and
the at least one pixel transistor is disposed in the semi-
conductor layer.

2. The photodetection device according to claim 1,
wherein
the at least one pixel transistor is at least one of a first reset
transistor that releases electric charge stored in a first
floating diffusion region that stores the electric charge
flowing out from the first photoelectric conversion
portion, a first amplification transistor that generates a
voltage signal according to the electric charge stored in
the first floating diffusion region, and a first selection
transistor that controls output of the voltage signal
generated by the first amplification transistor.

3. The photodetection device according to claim 2,
wherein
each of the pixels further includes a first transfer transistor
that transfers the electric charge generated in the first
photoelectric conversion portion to the first floating
diffusion region.

4. The photodetection device according to claim 2,
wherein
each of the pixels further includes a read electrode that
causes the electric charge generated in the first photo-
electric conversion portion to flow out to the first
floating diffusion region.

5. The photodetection device according to claim 1,
wherein
each of the pixels further includes a storage electrode that
controls outflow of the electric charge generated in the
first photoelectric conversion portion from the first
photoelectric conversion portion.

6. The photodetection device according to claim 1,
wherein
the first photoelectric conversion portion includes a pho-
toelectric conversion layer disposed on the second
surface side of the semiconductor substrate, and
the photoelectric conversion layer includes a layer made
of an organic semiconductor material.

7. The photodetection device according to claim 1,
wherein
each of the pixels further includes a second photoelectric
conversion portion disposed in the semiconductor sub-
strate.

8. The photodetection device according to claim 7,
wherein
each of the pixels further includes a charge storage region
that is disposed in the semiconductor substrate and
stores electric charge generated in the second photo-
electric conversion portion.

9. The photodetection device according to claim 8,
wherein
the at least one pixel transistor is at least one of a first reset
transistor that releases electric charge stored in a first
floating diffusion region that stores the electric charge
flowing out from the first photoelectric conversion
portion, a first amplification transistor that generates a
voltage signal according to the electric charge stored in
the first floating diffusion region, a first selection tran-
sistor that controls output of the voltage signal gener-
ated by the first amplification transistor, a transfer
transistor that transfers the electric charge generated by
the second photoelectric conversion portion and stored
in the charge storage region to a second floating diffu-
sion region, a second reset transistor that releases
electric charge stored in the second floating diffusion
region, a second amplification transistor that generates
a voltage signal according to the electric charge stored
in the second floating diffusion region, and a second
selection transistor that controls output of the voltage
signal generated by the second amplification transistor.

10. The photodetection device according to claim 9,
wherein
the second floating diffusion region is shared by two or
more pixels adjacent to each other.

11. An electronic apparatus comprising:
the photodetection device according to claim 1;
a lens that forms an image of incident light on the
photodetection device; and
a processing circuit that executes predetermined process-
ing on a signal output from the photodetection device.

12. A photodetection device comprising:

a plurality of pixels arranged in a matrix, wherein each of the pixels includes a semiconductor substrate having a first surface and a second surface opposed to each other, a first photoelectric conversion portion disposed on the second surface side of the semiconductor substrate, an insulating layer covering the first surface of the semiconductor substrate, at least one pixel transistor located on the first surface side of the semiconductor substrate with the insulating layer interposed therebetween, a storage electrode that controls outflow of the electric charge generated in the first photoelectric conversion portion from the first photoelectric conversion portion, and a shield electrode disposed in at least a part of a periphery of the storage electrode.

13. A photodetection device comprising:

a plurality of pixels arranged in a matrix, wherein each of the pixels includes a semiconductor substrate having a first surface and a second surface opposed to each other, a first photoelectric conversion portion disposed on the second surface side of the semiconductor substrate, an insulating layer covering the first surface of the semiconductor substrate, at least one pixel transistor located on the first surface side of the semiconductor substrate with the insulating layer interposed therebetween, and a storage electrode that controls outflow of the electric charge generated in the first photoelectric conversion portion from the first photoelectric conversion portion, and the storage electrode includes a first storage electrode disposed at a position facing a first region of the first photoelectric conversion portion and a second storage electrode disposed at a position facing a second region different from the first region.

14. A photodetection device comprising:

a plurality of pixels arranged in a matrix, wherein each of the pixels includes a semiconductor substrate having a first surface and a second surface opposed to each other, a first photoelectric conversion portion disposed on the second surface side of the semiconductor substrate, an insulating layer covering the first surface of the semiconductor substrate, at least one pixel transistor located on the first surface side of the semiconductor substrate with the insulating layer interposed therebetween, and a through-electrode penetrating through at least the semiconductor substrate, and the first photoelectric conversion portion is electrically connected to the at least one pixel transistor via the through-electrode.

15. The photodetection device according to claim 14, wherein each of the pixels further includes an electrode pad disposed in the insulating layer, and the through-electrode is electrically connected to the electrode pad in the insulating layer.

16. The photodetection device according to claim 14, further comprising a pixel isolation portion that isolates the pixels from each other, wherein at least a part of the through-electrode extends in the pixel isolation portion.

17. A photodetection device comprising:

a plurality of pixels arranged in a matrix, wherein each of the pixels includes a semiconductor substrate having a first surface and a second surface opposed to each other, a first photoelectric conversion portion disposed on the second surface side of the semiconductor substrate, an insulating layer covering the first surface of the semiconductor substrate, at least one pixel transistor located on the first surface side of the semiconductor substrate with the insulating layer interposed therebetween, and a second photoelectric conversion portion disposed in the semiconductor substrate, and the first photoelectric conversion portion and the second photoelectric conversion portion overlap each other in a substrate thickness direction of the semiconductor substrate.

18. A photodetection device comprising:

a plurality of pixels arranged in a matrix, wherein each of the pixels includes a semiconductor substrate having a first surface and a second surface opposed to each other, a first photoelectric conversion portion disposed on the second surface side of the semiconductor substrate, an insulating layer covering the first surface of the semiconductor substrate, at least one pixel transistor located on the first surface side of the semiconductor substrate with the insulating layer interposed therebetween, a second photoelectric conversion portion disposed in the semiconductor substrate, and a filter that is disposed on a light incident surface side of the second photoelectric conversion portion and through which at least one of infrared light and near-infrared light is transmitted.

19. A photodetection system comprising:

a photodetection device comprising:

a plurality of pixels arranged in a matrix, wherein each of the pixels includes a semiconductor substrate having a first surface and a second surface opposed to each other, a first photoelectric conversion portion disposed on the second surface side of the semiconductor substrate, an insulating layer covering the first surface of the semiconductor substrate, and at least one pixel transistor located on the first surface side of the semiconductor substrate with the insulating layer interposed therebetween;

a light emitting device that outputs light having a predetermined wavelength; and a control unit that synchronously controls the photodetection device and the light emitting device.

* * * * *